(12) United States Patent
Guo et al.

(10) Patent No.: US 7,952,154 B2
(45) Date of Patent: May 31, 2011

(54) HIGH TEMPERATURE RESISTANT SOLID STATE PRESSURE SENSOR

(75) Inventors: Shuwen Guo, Lakeville, MN (US); Odd Harald Steen Eriksen, Brooklyn Park, MN (US); David P. Potasek, Minneapolis, MN (US); Kimiko J. Childress, Farmington, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

(21) Appl. No.: 12/579,123

(22) Filed: Oct. 14, 2009

(65) Prior Publication Data
US 2010/0155866 A1 Jun. 24, 2010

Related U.S. Application Data

(60) Division of application No. 12/426,310, filed on Apr. 20, 2009, now Pat. No. 7,642,115, which is a division of application No. 11/523,214, filed on Sep. 19, 2006, now Pat. No. 7,538,401, which is a continuation-in-part of application No. 11/120,885, filed on May 3, 2005, now Pat. No. 7,400,042.

(51) Int. Cl.
*H01L 29/84* (2006.01)
(52) U.S. Cl. ............... 257/417; 257/419; 257/E29.324; 73/721
(58) Field of Classification Search ........... 257/E29.324, 257/E21.533
See application file for complete search history.

(56) References Cited

U.S. PATENT DOCUMENTS

| | | |
|---|---|---|
| 3,200,490 A | 8/1965 | Clymer |
| 3,396,454 A | 8/1968 | Schroeder et al. |
| 3,619,742 A | 11/1971 | Rud, Jr. |
| 3,877,063 A | 4/1975 | Abraham et al. |

(Continued)

FOREIGN PATENT DOCUMENTS
DE 10060439 6/2002
(Continued)

OTHER PUBLICATIONS

"Inexpensive, high-temperature aluminum nitride film sensor enables vibration and acoustic sensing even within jet engines," web page of yet2.com, Inc., http://www.yet2.com (9 pages) (Jun. 12, 2009).

(Continued)

*Primary Examiner* — Stephen W Smoot
(74) *Attorney, Agent, or Firm* — Thompson Hine LLP

(57) ABSTRACT

A harsh environment transducer including a substrate having a first surface and a second surface, wherein the second surface is in communication with the environment. The transducer includes a device layer sensor means located on the substrate for measuring a parameter associated with the environment. The sensor means including a single crystal semiconductor material having a thickness of less than about 0.5 microns. The transducer further includes an output contact located on the substrate and in electrical communication with the sensor means. The transducer includes a package having an internal package space and a port for communication with the environment. The package receives the substrate in the internal package space such that the first surface of the substrate is substantially isolated from the environment and the second surface of the substrate is substantially exposed to the environment through the port. The transducer further includes a connecting component coupled to the package and a wire electrically connecting the connecting component and the output contact such that an output of the sensor means can be communicated. An external surface of the wire is substantially platinum, and an external surface of at least one of the output contact and the connecting component is substantially platinum.

39 Claims, 44 Drawing Sheets

U.S. PATENT DOCUMENTS

| | | | |
|---|---|---|---|
| 3,879,746 A | 4/1975 | Fournier | |
| 3,901,772 A | 8/1975 | Guillotin et al. | |
| 3,935,986 A | 2/1976 | Lattari et al. | |
| 3,994,430 A | 11/1976 | Cusano et al. | |
| 4,141,456 A | 2/1979 | Hart | |
| 4,215,156 A | 7/1980 | Dalal et al. | |
| 4,233,337 A | 11/1980 | Friedman et al. | |
| 4,330,343 A | 5/1982 | Christou et al. | |
| 4,400,869 A | 8/1983 | Wilner et al. | |
| 4,505,027 A | 3/1985 | Schwabe et al. | |
| 4,545,115 A | 10/1985 | Bauer et al. | |
| 4,637,129 A | 1/1987 | Derkits, Jr. et al. | |
| 4,702,941 A | 10/1987 | Mitchell et al. | |
| 4,722,227 A | 2/1988 | Grob et al. | |
| 4,758,534 A | 7/1988 | Derkits, Jr. et al. | |
| 4,777,826 A | 10/1988 | Rud, Jr. et al. | |
| 4,910,578 A | 3/1990 | Okamoto | |
| 4,912,543 A | 3/1990 | Neppl et al. | |
| 4,939,497 A | 7/1990 | Nishida et al. | |
| 4,960,718 A | 10/1990 | Aina | |
| 5,038,996 A | 8/1991 | Wilcox et al. | |
| 5,095,759 A | 3/1992 | Mizuhara et al. | |
| 5,181,417 A | 1/1993 | Nishida et al. | |
| 5,182,218 A | 1/1993 | Fujihira | |
| 5,200,349 A | 4/1993 | Yokoyama | |
| 5,257,547 A | 11/1993 | Boyer | |
| 5,285,097 A | 2/1994 | Hirai | |
| 5,286,671 A | 2/1994 | Kurtz et al. | |
| 5,346,855 A | 9/1994 | Byrne et al. | |
| 5,369,300 A | 11/1994 | Heideman et al. | |
| 5,374,564 A | 12/1994 | Bruel | |
| 5,436,491 A | 7/1995 | Hase et al. | |
| 5,457,345 A | 10/1995 | Cook et al. | |
| 5,536,967 A | 7/1996 | Yokoyama | |
| 5,559,817 A | 9/1996 | Derkits, Jr. et al. | |
| 5,600,071 A | 2/1997 | Sooriakumar et al. | |
| 5,637,905 A | 6/1997 | Carr et al. | |
| 5,641,994 A | 6/1997 | Bollinger et al. | |
| 5,665,921 A | 9/1997 | Gerst et al. | |
| 5,670,823 A | 9/1997 | Kruger et al. | |
| 5,675,159 A | 10/1997 | Oku et al. | |
| 5,802,091 A | 9/1998 | Chakrabarti et al. | |
| 5,882,532 A | 3/1999 | Field et al. | |
| 5,882,738 A | 3/1999 | Blish, II et al. | |
| 5,935,430 A | 8/1999 | Craig | |
| 5,955,771 A | 9/1999 | Kurtz et al. | |
| 6,027,957 A | 2/2000 | Merritt et al. | |
| 6,050,145 A | 4/2000 | Olson et al. | |
| 6,058,782 A | 5/2000 | Kurtz et al. | |
| 6,122,974 A | 9/2000 | Sato et al. | |
| 6,191,007 B1 | 2/2001 | Matsui et al. | |
| 6,234,378 B1 | 5/2001 | Ford et al. | |
| 6,272,928 B1 | 8/2001 | Kurtz | |
| 6,320,265 B1 | 11/2001 | Chakrabarti et al. | |
| 6,351,996 B1 | 3/2002 | Nasiri et al. | |
| 6,363,792 B1 | 4/2002 | Kurtz et al. | |
| 6,447,923 B1 | 9/2002 | Yamakawa | |
| 6,450,039 B1 | 9/2002 | Masuda | |
| 6,452,427 B1 | 9/2002 | Ko et al. | |
| 6,465,271 B1 | 10/2002 | Ko et al. | |
| 6,530,282 B1 | 3/2003 | Kurtz et al. | |
| 6,550,665 B1 | 4/2003 | Parris et al. | |
| 6,564,644 B1 | 5/2003 | Kurtz | |
| 6,566,158 B2 | 5/2003 | Eriksen et al. | |
| 6,586,330 B1 | 7/2003 | Ludviksson et al. | |
| 6,595,066 B1 | 7/2003 | Kurtz et al. | |
| 6,608,427 B2 | 8/2003 | Akiyama et al. | |
| 6,612,178 B1 | 9/2003 | Kurtz et al. | |
| 6,706,549 B1 | 3/2004 | Okojie | |
| 6,773,951 B2 | 8/2004 | Eriksen et al. | |
| 6,845,664 B1 | 1/2005 | Okojie | |
| 6,928,878 B1 | 8/2005 | Eriksen et al. | |
| 6,932,951 B1 | 8/2005 | Losey et al. | |
| 6,956,268 B2 | 10/2005 | Faris | |
| 7,152,482 B2 | 12/2006 | Ueno et al. | |
| 7,233,094 B2 | 6/2007 | Akiyama et al. | |
| 2003/0108674 A1 | 6/2003 | Chung et al. | |
| 2003/0201530 A1 | 10/2003 | Kurihara et al. | |
| 2004/0079163 A1 | 4/2004 | Clerc et al. | |
| 2005/0042865 A1 | 2/2005 | Cabral et al. | |
| 2005/0224966 A1 | 10/2005 | Fogel et al. | |
| 2005/0235753 A1 | 10/2005 | Kurtz | |
| 2005/0236710 A1 | 10/2005 | Akiyama et al. | |
| 2006/0032582 A1 | 2/2006 | Chen et al. | |
| 2006/0144154 A1 | 7/2006 | Ueno et al. | |

FOREIGN PATENT DOCUMENTS

| | | |
|---|---|---|
| EP | 0119691 | 9/1984 |
| EP | 0552466 | 11/1992 |
| EP | 0585084 | 3/1994 |
| EP | 1069419 | 1/2001 |
| GB | 2221570 | 2/1990 |
| JP | 53-098096 | 8/1978 |
| JP | 07-072029 | 3/1995 |
| WO | 03/103066 | 12/2003 |
| WO | 2004/031711 | 4/2004 |
| WO | 2005/012206 | 2/2005 |

OTHER PUBLICATIONS

Sinha, A.K. et al., "Effect of alloying behavior on the electrical characteristics of n-GaAs Schottky diodes metallized with W, Au, and Pt," *Appl. Phys. Lett.*, vol. 23, No. 12, pp. 666-668 (1973).

Guivarc'h, A. et al., "Growth of RhGa on GaAs (001) in a molecular beam epitaxy system," *Appl. Phys. Lett.*, 52 (12), pp. 948-950 (Mar. 21, 1998).

Sinha, A.K. et al., "n-GaAS Schottky Diodes Metallized with Ti and Pt/Ti," *SSE*, vol. 19, No. 6-E, pp. 489-492 (1976).

Kumar, J. et al., "Reaction of Sputtered Pt Films on GaAS," *Phys. Chem. Solids*, vol. 36, pp. 535-541 (1975).

Fukuda, M., *Reliability and Degradation of Semiconductor Lasers and LEDs*, Chapter 6, Artech House, pp. 185-205 (1991).

Zheng, X.Y. et al., "Solid State Phase Equilibria in the Pt-Ga-As System," *Journal of Less-Common Metals*, 146, pp. 223-239 (1989).

Lince, J.R. et al., "The growth of $AuGa_2$ thin films on GaAs (001) to form chemically unreactive interfaces," *J. Mater. Res*, 1 (4), pp. 537-542 (Jul./Aug. 1986).

Okojie et al., "Stable $Ti/TaSi_2$/Pt Ohmic Contacts on N-Type 6H-SiC Epilayer at 600° C in Air," Materials Research Society Symposium Proceedings, vol. 622 (2000).

Lee, "Thermodynamic considerations of thermal oxidation of metal silicides," Thin Solid Films, 216, pp. 230-234 (1992).

Liu et al., "Annealing effects of tantalum films on Si and $Sio_2$/Si substrates in various vacuums," Journal of Applied Physics, vol. 90, No. 1, pp. 416-420 (Jul. 1, 2001).

Doppalapudi et al., "SiC-Microhotplate Conductometric Sensor Array for NOx, CO, and Hydrocarbon Monitoring of Hot Engine Emissions," U.S. Environmental Protection Agency, National Center for Environment Research (2002/2003).

Berstein et al., "Applications of Solid-Liquid Interdiffusion (SLID) Bonding in Integrated-Circuit Fabrication," Transactions of the Metallurgical Society of AIME, vol. 236, pp. 405-412 (Mar. 1996).

Newport Newsletter entitled "Solutions for Dispense, Assembly, and Soldering, The Newsletter of MRSI Group," vol. III, No. 1 (Jan. 2000).

Klumpp et al., "Vertical System Integration by Using Inter-Chip Vias and Solid-Liquid Interdiffusion Bonding," Japanese Journal of Applied Physics, vol. 43, No. 7A, pp. L829-L830 (Jun. 11, 2004).

IZM Institut paper entitled "The SLID-ICV technique introduced by FHG: Face-to-Face SOLID Technology," (date unknown) Applicants admit the status of this publication as prior art for the limited purpose of examination of this application, but otherwise reserve the right to challenge the status of this publication as prior art.

Garrou, "Future ICs Go Vertical," Reed Electronics, (Feb. 1, 2005).

IZM Institut article entitled "Selected Results from Si-Technologie and Vertikale System Intefraction: Vertical System Integration," (Mar. 14, 2005).

Neppl, F. et al., "A $TaSi_x$ Barrier for Low Resistivity and High Reliability of Contacts to Shallow Diffusion Regions in Silicon," *Thin Solid Films*, 120, pp. 257-266 (1984).

DeBlasi, J.M. et al., Characteristics of TaSi$_2$/Poly-Si Films Oxidized in Steam for VLSI Applications, *J. Electrochem. Soc.: Solid-State Science and Technology*, pp. 2478-2482 (Dec. 1983).

Das, S.R., et al., "Thickness dependence of the properties and thermal stability of PtSi films," *Thin Solid Films*, 253, pp. 467-472 (1994).

Holloway, K. et al., "Tantalum as a diffusion barrier between copper and silicon: Failure mechanism and effect of nitrogen addition," *J. Appl. Phys.*, 71 (11), pp. 5433-5444 (Jun. 1992).

Crider, C.A. et al., "Platinum silicide formation under ultrahigh vacuum and controlled impurity ambients," *J. Appl. Phys.* 52 (4), pp. 2860-2868 (Apr. 1981).

Saraswat, K.C. et al., Thermal oxidation of tantalum silicide in O$_2$ and H$_2$O, *Appl. Phys. Lett.*, 41 (12), pp. 1127-1129 (Dec. 1982).

Lee, H.G., "Thermodynamic considerations of thermal oxidation of metal silicides," *Thin Solid Films*, 216, pp. 230-234 (1992).

Takeyama, M. et al., "Properties of TaN$_x$ films as diffusion barriers in the thermally stable Cu/Si contact systems," J. Vac. Sci. Techol. B 14(2), pp. 674-678 (Mar./Apr. 1996).

Reid, J.S. et al., "Amorphous (Mo, Ta, or W)-Si-N diffusion barriers for Al metallizations," J. Appl. Phys. 79 (2), pp. 1109-1115 (Jan. 1996).

Kaloyeros, A.E. et al., "Ultrathin Diffusion Barriers/Liners for Gigascale Copper Metallization," Annu. Rev. Mater. Sci 30, pp. 363-385 (2000).

Chason, E. et al., "Applied Physics Reviews—Ion beams in silicon processing and characterization," J. Appl. Phys. 81 (10), pp. 6513-6561 (May 1997).

McCluskey, P. et al., "Pushing the Limit: The Rise of High Temperature Electronics," Advanced Packaging, vol. 4, No. 1 (Jan./Feb. 1997).

Mantese, J.V. et al., "Platinum Wire Wedge Bonding: A New IC and Microsensor Interconnect," Journal of Electronic Materials, vol. 17, No. 4, pp. 285-289 (1988).

Guo, S. et al., "A monolithically integrated surface micromachined touch mode capacitive pressure sensor," Sensors and Actuators 80, pp. 224-232 (2000).

Kurtz, A.D. et al., "Ultra High Temperature, Miniature, SOI Sensors for Extreme Environments," by Kulite Semiconductor Products, Inc., Presented at the IMAPS International HiTEC 2004 Conference (May 2004).

Kühnel, W. et al., "Silicon Subminiature Microphones for Airborne Sound," Acustica, vol. 73, pp. 90-99 (1991).

Sheplak, M. et al., "A MEMS Microphone for Aeroacoustics Measurement" (1999).

"Advanced Laser and Waterjet Machining Services for Industry," internet web page of LAI International, Inc. (date of first publication unknown). Applicants admit the status of this publication as prior art for the limited purpose of examination of this application, but otherwise reserve the right to challenge the status of this publication as prior art.

PCT, International Preliminary Report on Patentability, PCT/US2007/078837 (Apr. 2, 2009).

PCT, International Search Report and Written Opinion, PCT/US2007/078831 (Mar. 6, 2009).

PCT, International Search Report and Written Opinion, PCT/US2007/078837 (Feb. 19, 2009).

PCT, Partial International Search Report, PCT/US2007/078831 (Sep. 12, 2008).

PCT, Partial International Search Report, PCT/US2007/078837 (Oct. 3, 2008).

Welch III et al., "Transient liquid phase (TLP) bonding for microsystem packaging applications," Digest of Technical Papers—International Conference on Solid State Sensors and Actuators and Microsystems, Transducers '05, 13th Internatonal Conference on Solid-State Sensors and Actuators and Microsytems, *Digest of Technic.*, vol. 2, pp. 1350-1353 (2005).

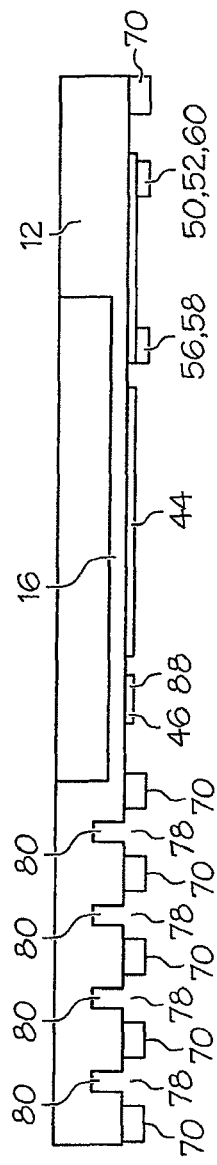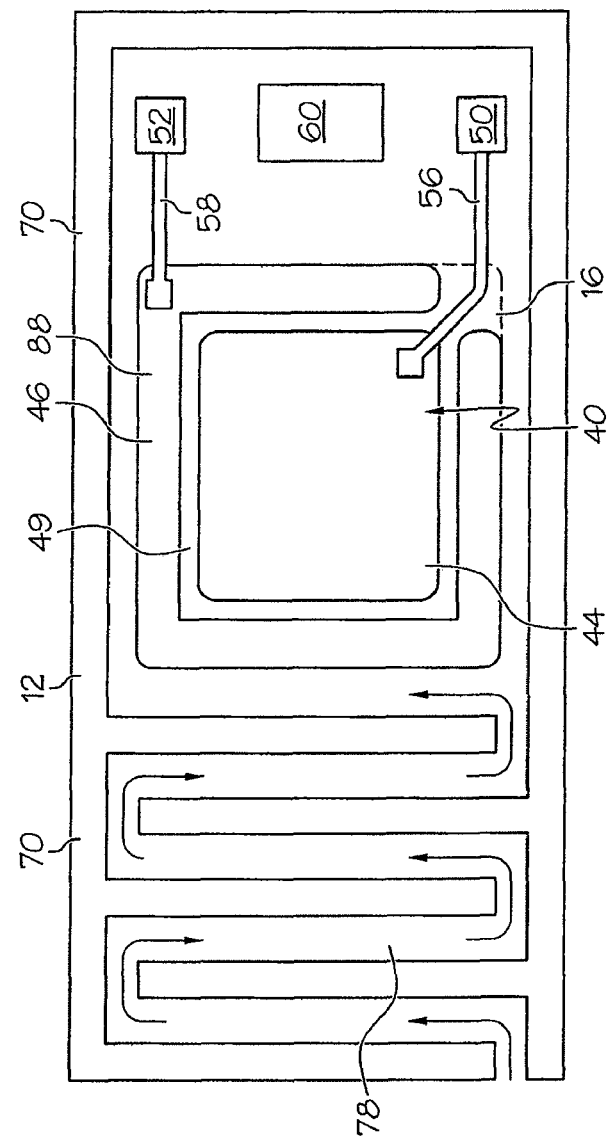

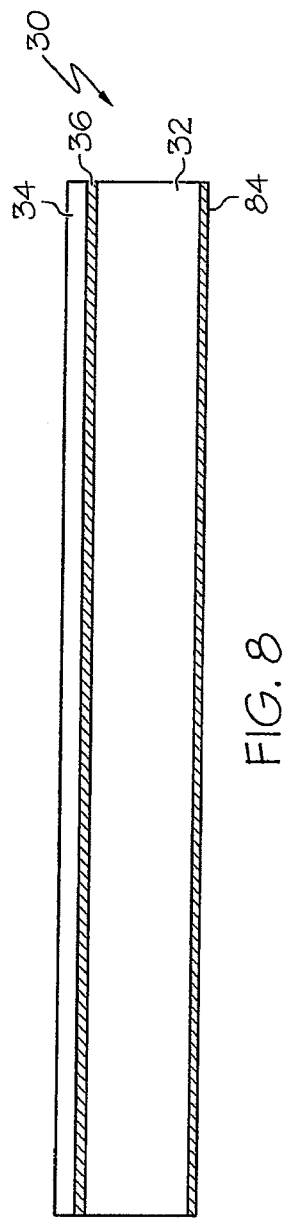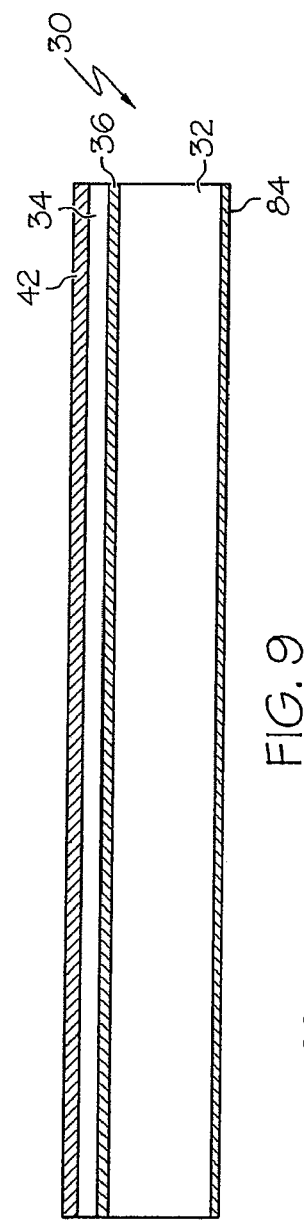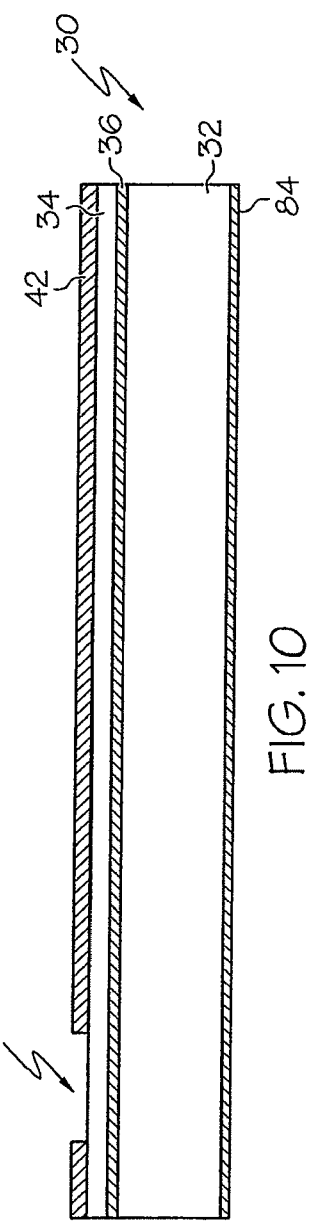

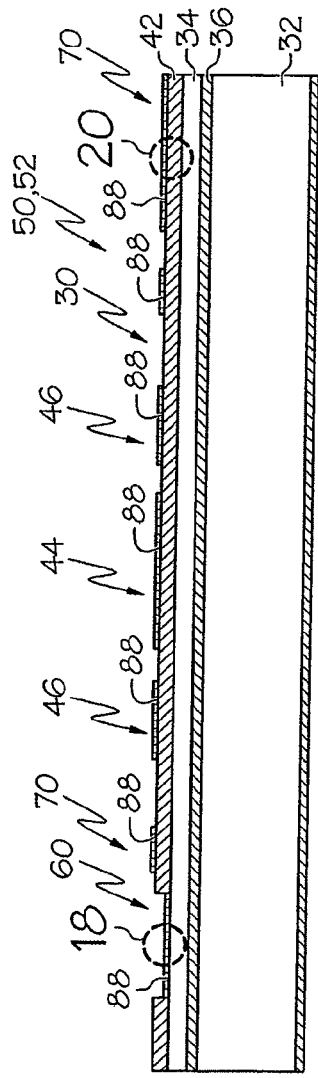
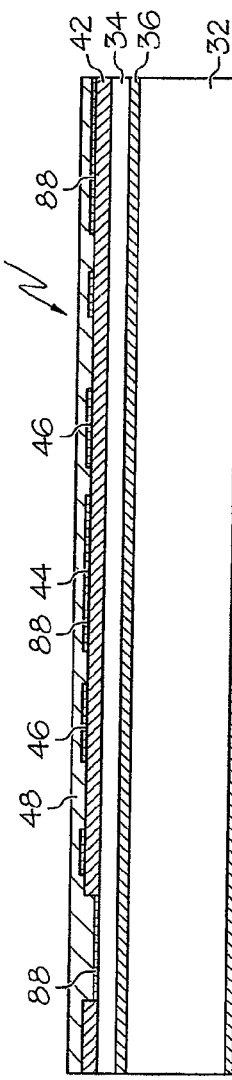
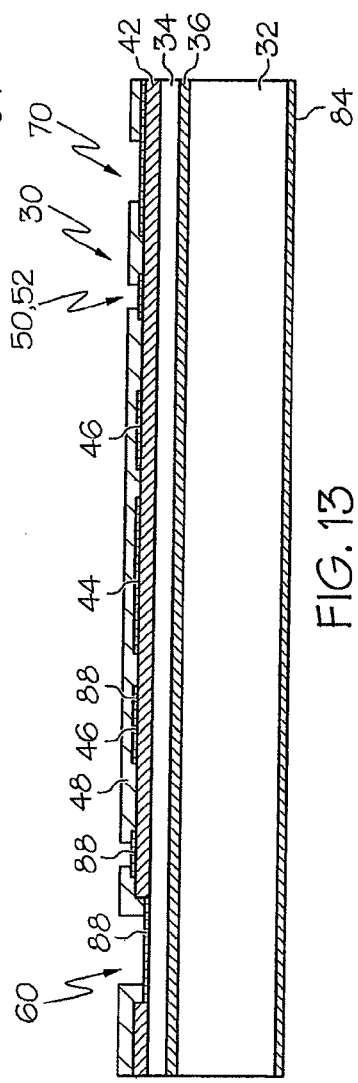

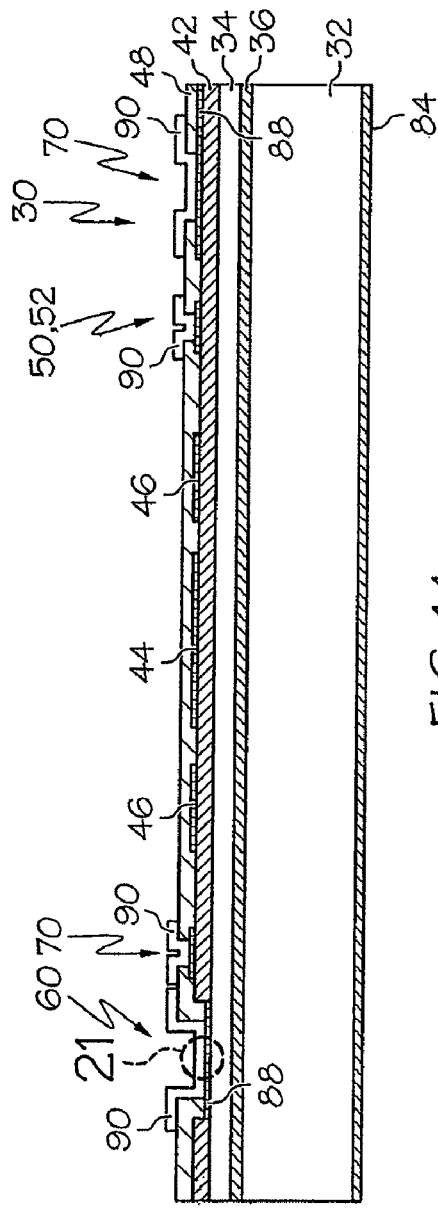
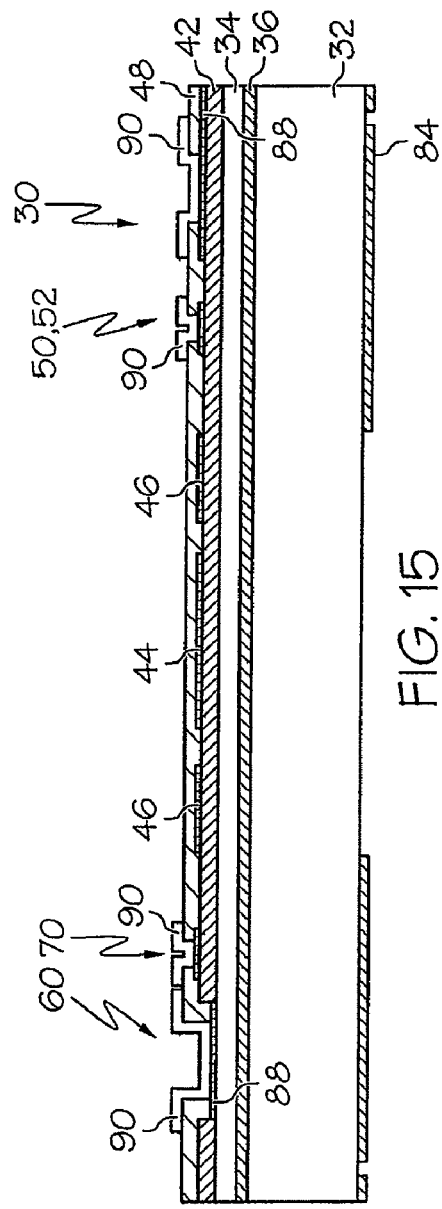

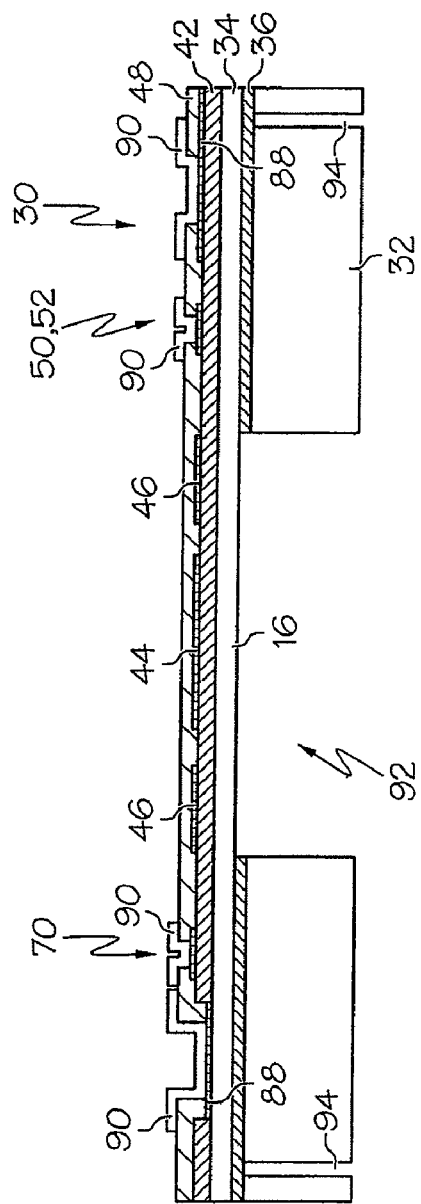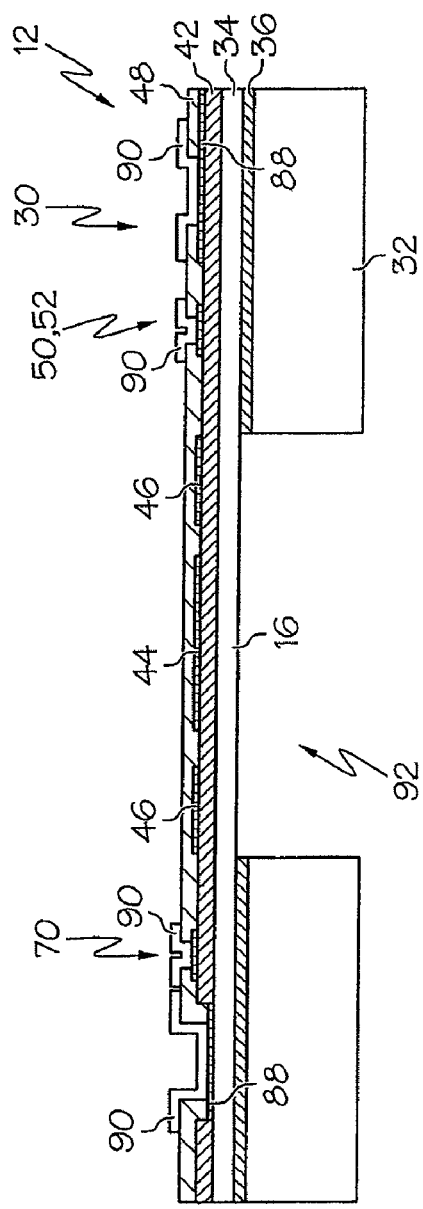

HIGH TEMPERATURE RESISTANT SOLID STATE PRESSURE SENSOR

This application is a divisional application of U.S. application Ser. No. 12/426,310, entitled METHOD FOR MAKING A TRANSDUCER, filed on Apr. 20, 2009, now U.S. Pat. No. 7,642,115, which is turn a divisional application of U.S. application Ser. No. 11/523,214 entitled TRANSDUCER FOR USE IN HARSH ENVIRONMENTS, filed on Sep. 19, 2006, now U.S. Pat. No. 7,538,401, which is, in turn, a continuation-in-part of U.S. application Ser. No. 11/120,885 entitled SUBSTRATE WITH BONDING METALLIZATION and filed on May 3, 2005, now U.S. Pat. No. 7,400,042. The entire contents of these applications and patents are incorporated by reference herein.

The present invention is directed to a pressure sensor, and more particularly, to a solid state pressure sensor that can withstand and operate at high temperatures and harsh environments.

BACKGROUND

Transducers, such as sensor or actuators, are often used in harsh environments, such as high temperature and corrosive environments. For example, it may be desired to place a microphone or dynamic pressure sensor in or adjacent to the combustion zone of a turbine, aircraft engine or internal combustion engine to detect dynamic pressure changes inside the turbine or engine. The dynamic pressure data can then be analyzed to track the efficiency and performance of the turbine or engine. The dynamic pressure sensor may also be utilized to track the acoustic characteristics of the turbine or engine (i.e., noise output).

However, such a transducer must be able to withstand high operating temperatures and pressures, wide ranges of temperature and pressure, and the presence of combustion byproducts. When the transducer is a MEMS (microelectromechanical system) device, the MEMS transducer may be susceptible to damage due to its inherent materials of manufacture, thereby requiring additional protection.

The transducer is typically electrically connected to an external device, controller or the like. The associated connections must also therefore be protected from the harsh environment to ensure proper operation of the transducer. Accordingly, there is a need for an improved transducer which can withstand such harsh environments.

SUMMARY

In one embodiment the invention is a harsh environment transducer including a substrate having a first surface and a second surface, wherein the second surface is in communication with the environment. The transducer includes a device layer sensor means located on the substrate for measuring a parameter associated with the environment. The sensor means including a single crystal semiconductor material having a thickness of less than about 0.5 microns. The transducer further includes an output contact located on the substrate and in electrical communication with the sensor means. The transducer includes a package having an internal package space and a port for communication with the environment. The package receives the substrate in the internal package space such that the first surface of the substrate is substantially isolated from the environment and the second surface of the substrate is substantially exposed to the environment through the port. The transducer further includes a connecting component coupled to the package and a wire electrically connecting the connecting component and the output contact such that an output of the sensor means can be communicated. An external surface of the wire is substantially platinum, and an external surface of at least one of the output contact and the connecting component is substantially platinum.

In another embodiment the invention is a pressure sensor for use in a harsh environment including a substrate including a generally flexible diaphragm configured to flex when exposed to a differential pressure thereacross. The pressure sensor includes a sensing element at least partially located on the diaphragm whereby flexure of the diaphragm induces a change in an electrical property of the sensing element. The pressure sensor further includes a package defining an internal space and receiving the substrate in the internal space such that pressure fluctuations in the environment manifest as the differential pressure. A bond is positioned between the package and the substrate and formed by melting a high temperature braze material, wherein the bond has a liquidus temperature of between about 650° C. and about 750° C., and has stable mechanical properties at about 400° C.

In another embodiment said invention is a pressure sensor for use in a harsh environment including a substrate including a generally flexible diaphragm configured to flex when exposed to a differential pressure thereacross. The pressure sensor includes a sensing element at least partially located on the diaphragm whereby flexure of the diaphragm induces a change in an electrical property of the sensing element. The pressure sensor further includes a package defining an internal space and receiving the substrate in the internal space such that pressure fluctuations in the environment manifest as the differential pressure. A bond is positioned between the package and the substrate formed by melting a high temperature braze material or a glass frit material, wherein the bond is formed by a high temperature brazing preform material comprised of indium-copper-gold containing about 15% indium by weight, or gold-germanium, or glass frit.

In another embodiment the invention is a pressure sensor for use in a harsh environment including a generally flexible non-metallic diaphragm configured to flex when exposed to a sufficient differential pressure thereacross, and a semiconductive single crystal piezoelectric or piezoresistive sensing element. The sensing element is at least partially located on the diaphragm and provides an electrical signal upon flexure of the diaphragm. The sensor further includes an oxide layer positioned between the diaphragm and the sensing element. The sensor can withstand, and continue functioning when exposed to, a pressure of 600 psig and a temperature of 450° C.

In yet another embodiment the invention is a method for forming a transducer including the step of providing a semiconductor-on-insulator wafer including first and second semiconductor layers separated by an electrically insulating layer, wherein the first layer wafer is formed or provided by hydrogen ion delamination of a starting wafer. The method further includes doping the first layer to form a piezoresistive film and etching the piezoresistive film to form at least one piezoresistor. The method also includes depositing or growing a metallization layer on the semiconductor-on-insulator wafer, wherein the metallization layer includes an electrical connection portion that is located on or is electrically coupled to the piezoresistor. The method further includes removing at least part of the second semiconductor layer to form a diaphragm, with the at least part of the piezoresistor being located on the diaphragm, and joining the wafer to a package by melting a high temperature braze material or glass frit material.

In another embodiment the invention is a pressure sensor for use in a harsh environment including a substrate in communication with the environment, the substrate including a generally flexible diaphragm configured to flex when exposed to a sufficient differential pressure thereacross. The sensor further includes a sensing element at least partially located on the diaphragm such that the sensing element provides an electrical signal upon flexure of the diaphragm. The sensor has an electrically insulating layer positioned between the diaphragm and the sensing element and a cap configured to generally sealingly mate with the substrate and substantially cover the sensing element. The sensor further includes a bond formed between the cap and the substrate by aligning the cap with the substrate and heating the cap and the substrate to a first temperature, whereby the bond that is formed after heating the cap and the substrate to the first temperature is stable at a second temperature, where the second temperature is greater than the first temperature.

BRIEF DESCRIPTION OF THE DRAWINGS

FIG. 7A is a bottom view of another sensor die;

FIG. 7B is a side view of the sensor die of FIG. 7A;

FIGS. 8-17 are a series of side cross sections illustrating a process for forming a sensor die;

DETAILED DESCRIPTION

Overview

Piezoelectric Sensor

Figure 1:
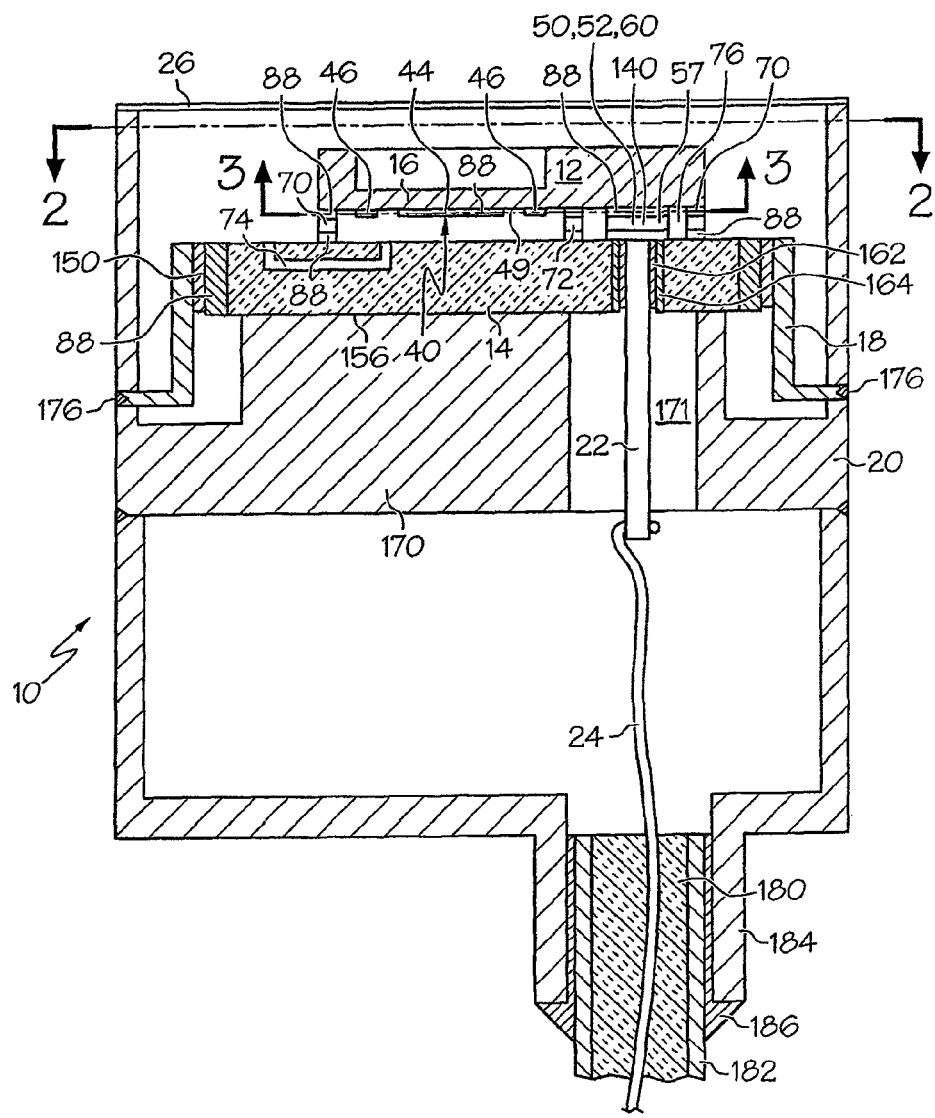
FIG. 1 is a side cross section of one embodiment of the pressure sensor of the present invention.
Figure 2:
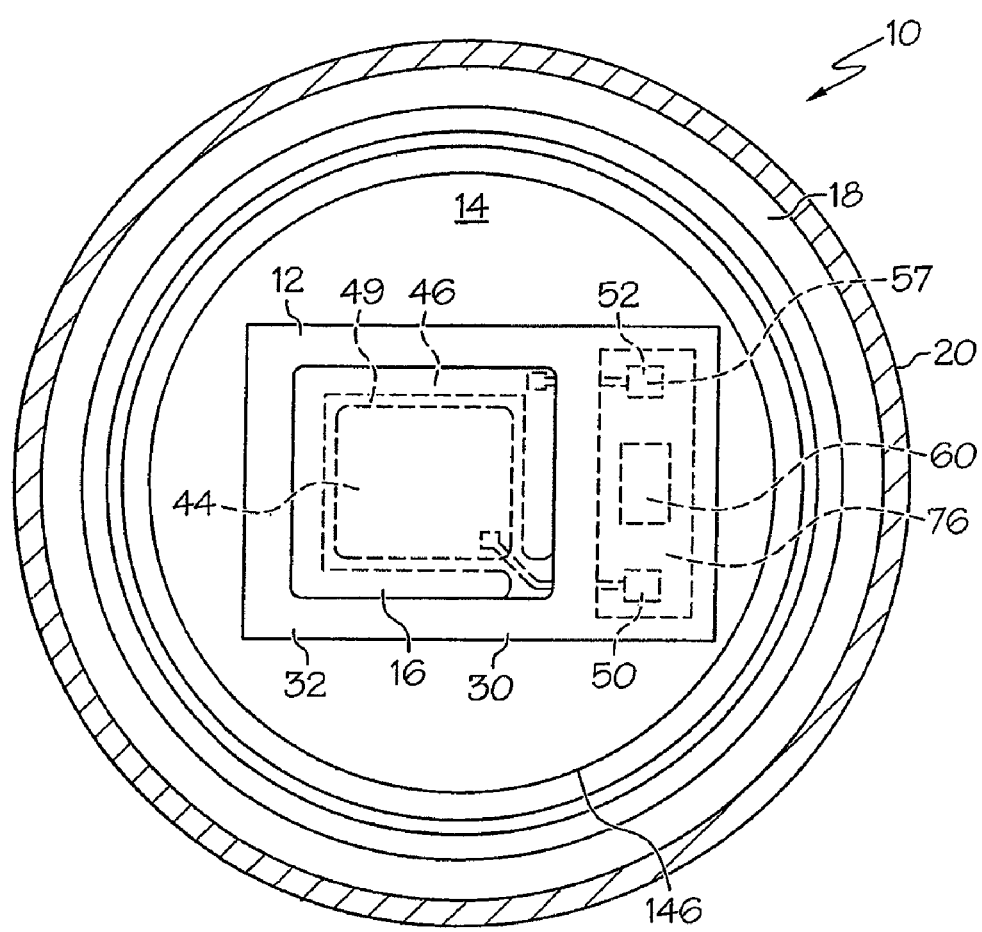
FIG. 2 is a top view taken along line 2-2 of FIG. 1.

As shown in FIG. 1, one embodiment of the transducer takes the form of a pressure sensor 10, such as a dynamic pressure sensor or microphone which can be used to sense rapid pressure fluctuations in the surrounding fluid. The pressure sensor 10 may be configured to be mounted in or adjacent to the combustion cavity of an engine, such as a turbine, aircraft engine or internal combustion engine. In this case, the pressure sensor 10 may be configured to withstand relatively high operating temperatures, wide temperature ranges, high operating pressure, and the presence of combustion byproducts (such as water, CO, $CO_2$, $NO_x$, and various nitrous and sulfurous compounds).

The illustrated sensor 10 includes a transducer die or sensor die 12 electrically and mechanically coupled to an underlying substrate 14. The sensor die 12 includes a diaphragm/membrane 16 and is configured to measure dynamic differential pressure across the diaphragm 16. The materials of the sensor die 12 and substrate 14 will be discussed in detail below, but in one embodiment the sensor die 12 includes or is made of a semiconductor-on-insulator wafer or a silicon-on-insulator ("SOI") wafer. The substrate 14 may be a generally disk-shaped ceramic material that is compression mounted inside a thin walled metal ring 18. The ring 18 is, in turn, mounted to a header, header plate, base or pedestal 20 which provides support to the ring 18 and structure and protection to the sensor 10 as a whole. The diaphragm 16 can be made of a variety of materials, such as semiconductor materials, but in one case is made of nearly any non-metallic material.

A pin 22, also termed a connecting component, is electrically coupled to the sensor die 12 at one end of the pin 22, and is electrically coupled to a wire 24 at the other end thereof. The wire 24 can then be connected to an external controller, processor, amplifier, charge converter or the like to thereby communicate the output of the sensor die 12. A screen 26 may be provided across the upper opening of the base 20 to provide some mechanical protection to the sensor die 12, and also to provide protection from fluidic and thermal spikes.

Piezoelectric Sensor Die Structure

Figure 4:
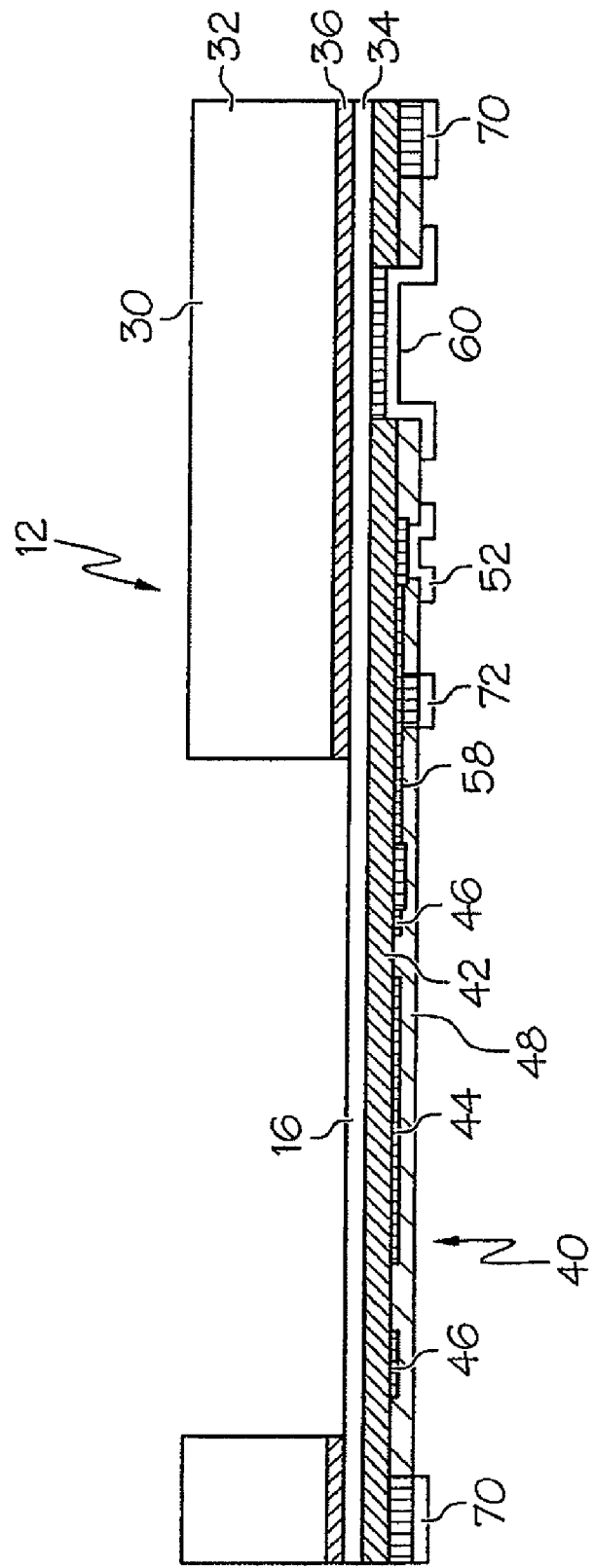
FIG. 4 is a side cross section of the sensor die of FIG. 3, taken along line 4-4.

The operation and configuration of the sensor die 12 will now be discussed in greater detail. As can be seen in FIG. 4, the sensor die 12 may be made of or include a SOI wafer 30. The wafer 30 includes a base or handle layer of silicon 32, an upper or device layer of silicon 34, and an oxide or electrically insulating layer 36 positioned between the device layer 34 and base layer 32. The device layer 34 may be an electrically conductive material such as doped silicon. However, as will be described in greater detail below, the SOI wafer 30/device layer 34 may be made of various other materials besides silicon. Portions of the base layer 32 and the oxide layer 36 are removed to expose portions of the device layer 34 to thereby form the diaphragm 16 which can flex in response to differential pressure thereacross.

The sensor 10 includes a piezoelectric sensing element, generally designated 40, which includes a piezoelectric film 42 located over the device layer 34/diaphragm 16. A set of electrodes 44, 46 are positioned on the piezoelectric film 42. If desired, a dielectric or passivation layer 48 may be located over the electrodes 44, 46 and piezoelectric film 42 to protect those components.

Figure 3:
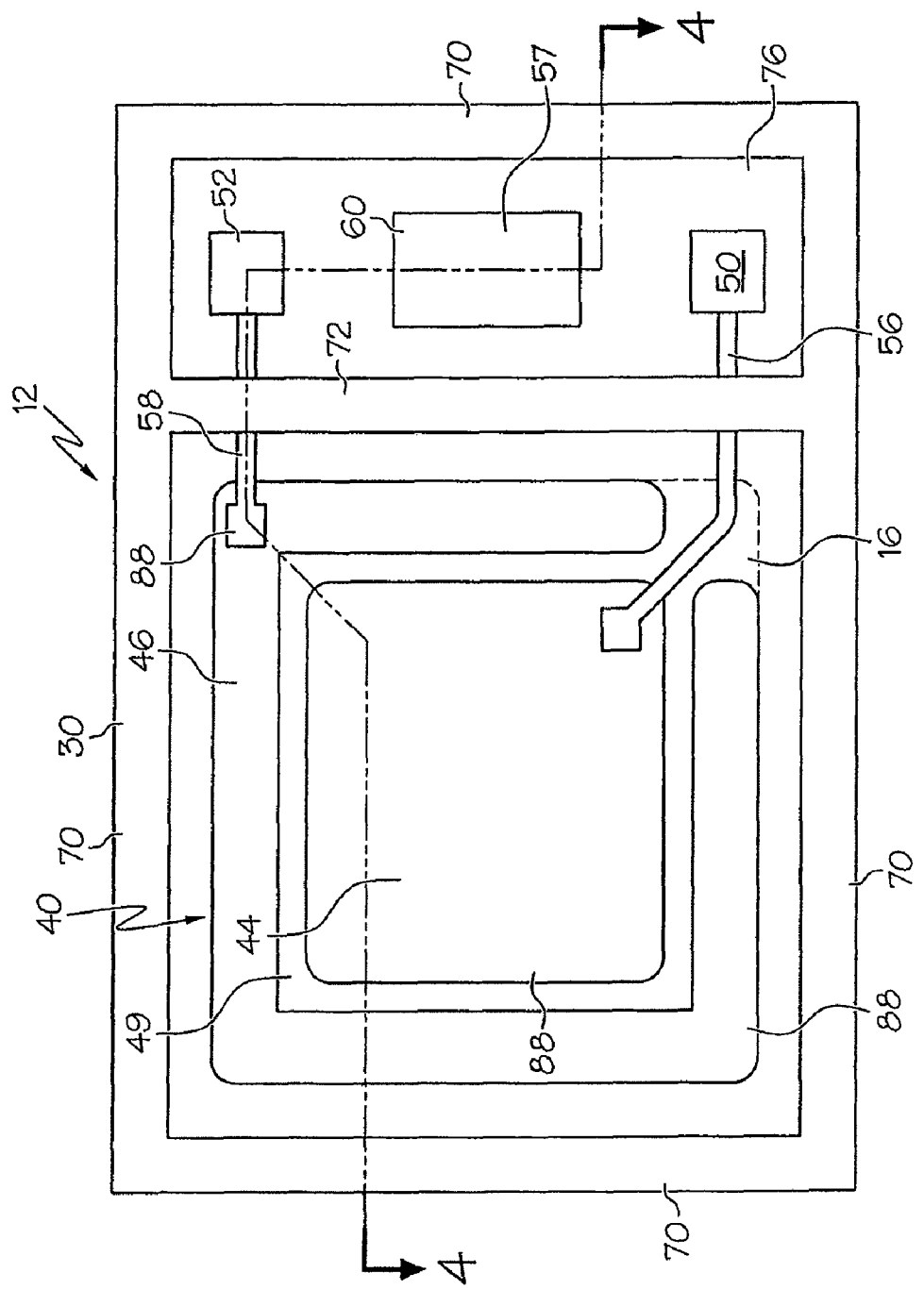
FIG. 3 is a bottom view of the sensor die of FIG. 1, taken along line 3-3 of FIG. 1.

FIG. 3 illustrates one configuration for the electrodes wherein the sensor die 12 includes a center electrode 44 and an outer electrode 46 located generally about the center electrode 44, with a gap 49 positioned between the electrodes 44, 46. The center electrode 44 is configured to be located over areas of tensile surface strain of the diaphragm 16 when the diaphragm 16 is deflected (i.e., due to differential pressure), and the outer electrode 46 is positioned to be located over areas of compressive surface strain of the diaphragm 46 when the diaphragm 46 is deflected. The gap 49 between the center 44 and outer 46 electrodes is located on a region of minimal or no strain when the diaphragm 16 is flexed.

The sensor die 12 of FIG. 3 includes a pair of output contacts 50, 52, with each output contact 50, 52 being directly electrically coupled to one of the electrodes 44, 46. For example, lead 56 extends from the center electrode 44 to the output contact 50 to electrically connect those components, and lead 58 extends from the outer electrode 46 to the output contact 52 to electrically connect those components. Both leads 56, 58 may be "buried" leads that are located between the dielectric layer 48 and the piezoelectric film 42 (i.e., see lead 58 of FIG. 4). If the piezoelectric film 42 does not entirely coat the sensor die 12, an insulating layer (not shown) may be deposited on the sensor 12 and positioned between the leads 56, 58 and the device layer 34 to electrically isolate the leads 56, 58 from the device layer 34.

The sensor die 12 may also include a reference contact 60 which extends through the piezoelectric film 42 to directly contact the device layer 34 (see FIG. 4). In this manner, the reference contact 60 provides a reference or "ground" voltage which can be compared to voltages measured at the contacts 50, 52. However, if desired the reference contact 60 may be omitted in which case the induced piezoelectric charge relative to the electrodes 44, 46 is measured using a charge converter or charge amplifier.

Figure 6:
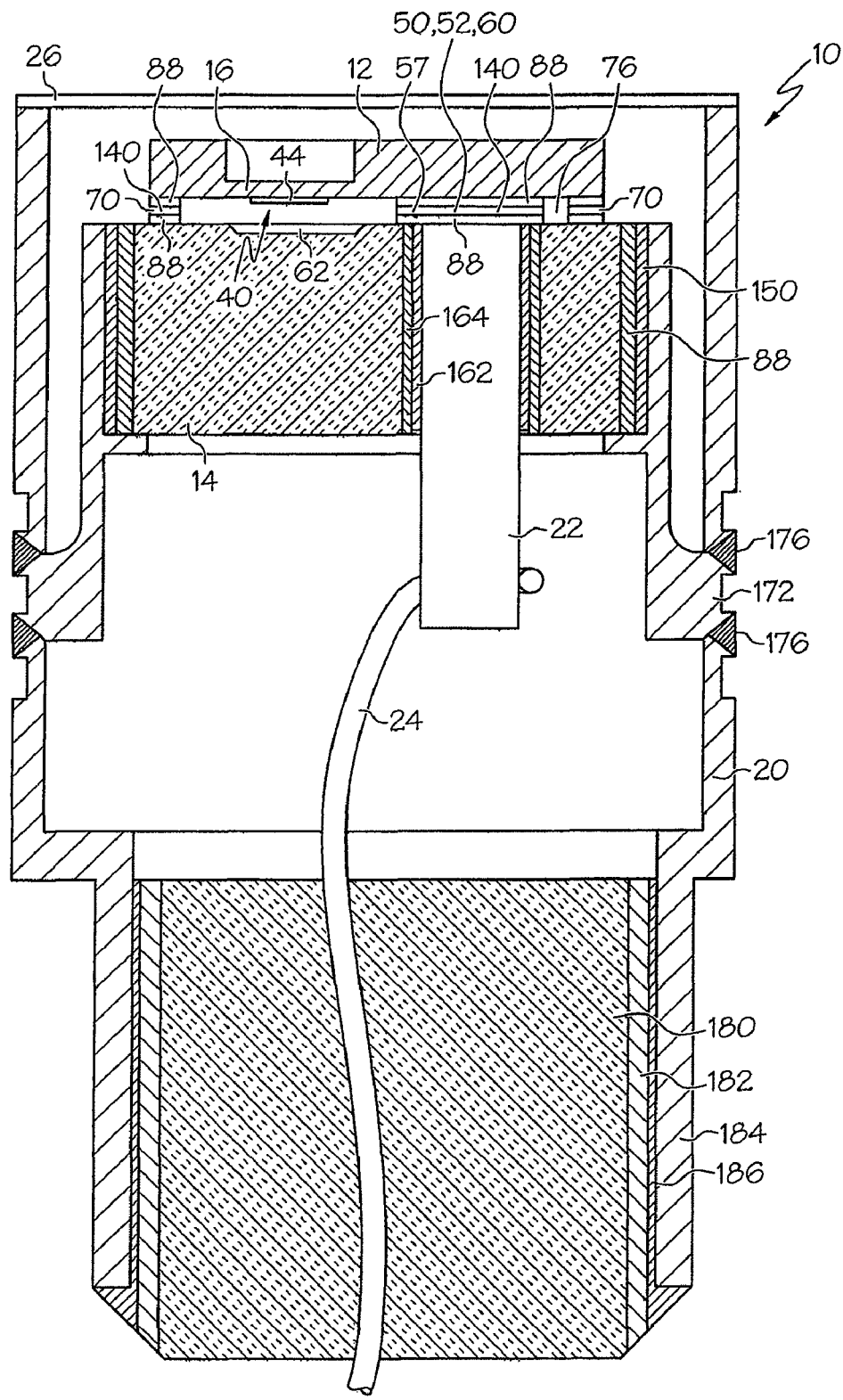
FIG. 6 is a side cross section of an alternate embodiment of the pressure sensor of the present invention.

In operation, when the sensor die 12 is exposed to differing pressures across the diaphragm 16, the diaphragm 16 is bowed either upwardly or downwardly from the position shown in FIG. 4. For example, downward deflection of the diaphragm 16 occurs when a relatively higher pressure is located on the top side of the diaphragm 16, thereby causing tensile strain to be induced in portions of the piezoelectric film 42 located adjacent to the center electrode 44. Simultaneously, a compressive strain is induced in the portions of the piezoelectric film 42 located adjacent to the outer electrode 46. The induced stresses cause change in the electric characteristics (i.e. potential or charge) of the piezoelectric film 42 that is communicated to the center 44 and outer 46 electrodes, and to the associated electrical contacts 50, 52. In one embodiment, as shown in FIG. 6, if desired the substrate 14 may include a depression 62 formed on an upper surface thereof to accommodate downward deflection of the diaphragm 16. However, the depression 62 is optional and may be omitted if desired.

The electrical differential between the contacts 50, 52, as sensed with respect to the reference contact 60, provides an output indicative of the pressure differential across the diaphragm 16. In other words, the electrodes 44, 46 and leads 56, 58 accumulate and transmit the induced piezoelectric charge to the contacts 50, 52. From there the contacts 50, 52 allow the charge to be transmitted (via pins 22 and wires 24) to a charge converter or charge amplifier, and ultimately a controller, processor or the like which can process the output to determine the sensed pressure/pressure change. The piezoelectric film 42 provides a very fast response time and therefore is useful in measuring vibration and other high frequency phenomenon. The piezoelectric film 42 is typically used in sensing dynamic or A/C or high-frequency pressure changes. The utility of piezoelectric film to sense static or D/C or low-frequency pressure changes is typically limited due to leak-back effects related to dielectric leakage through the piezoelectric film.

Figure 43:
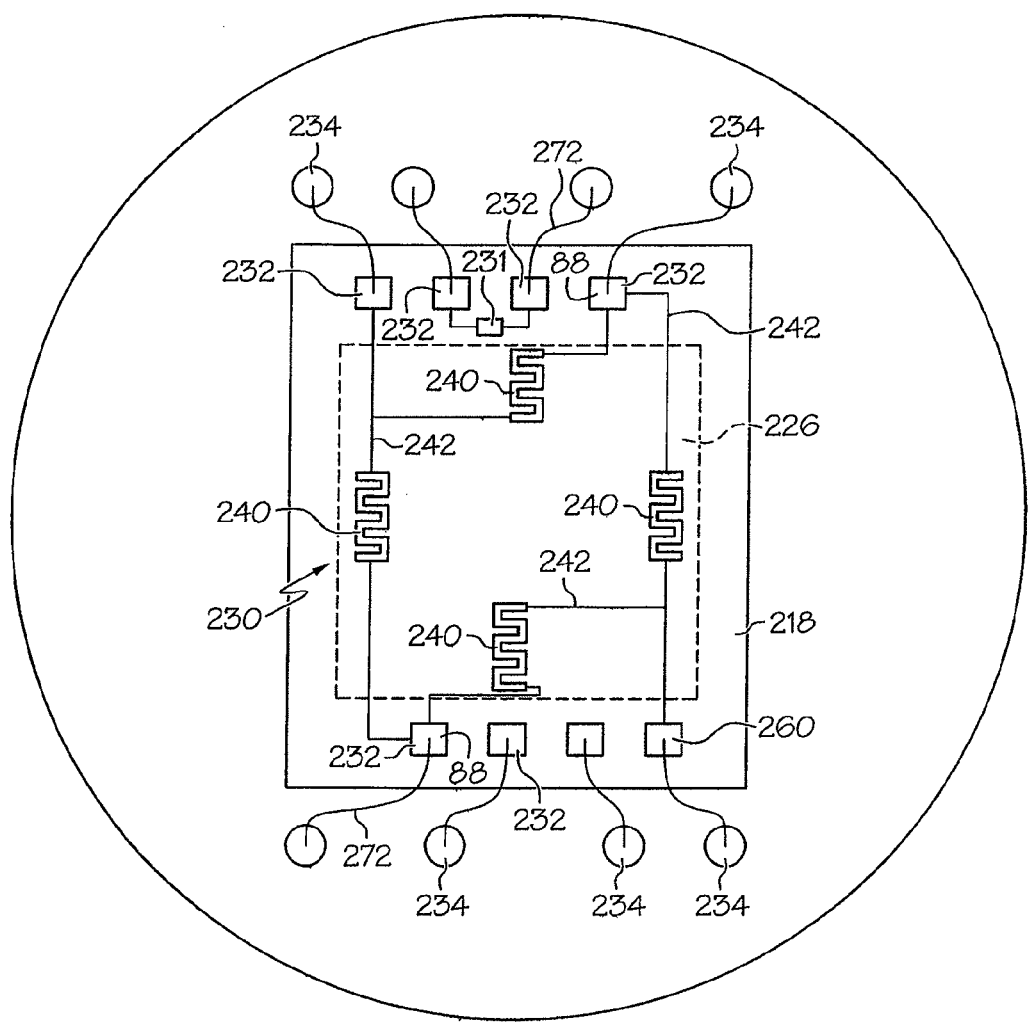
FIG. 43 is a top view of the sensor of FIG. 42, with the capping wafer removed.

However, rather than using a piezoelectric film 42, the sensing element 40 may use a piezoresistive film. The piezoresistive film can accurately sense static or D/C or low-frequency pressure changes. In this case the piezoresistive film is patterned in a serpentine shape as shown in FIG. 43 in the well known manner on the diaphragm 16 and electrically coupled to the contacts 50, 52 in a well known manner. The serpentine pattern may form a Wheatstone bridge configuration whereby two legs of the Wheatstone bridge are located over the diaphragm 16. The deflection of the diaphragm 16 is then measured through a change in resistance of the piezoresistive film in a well known manner.

Figure 5:
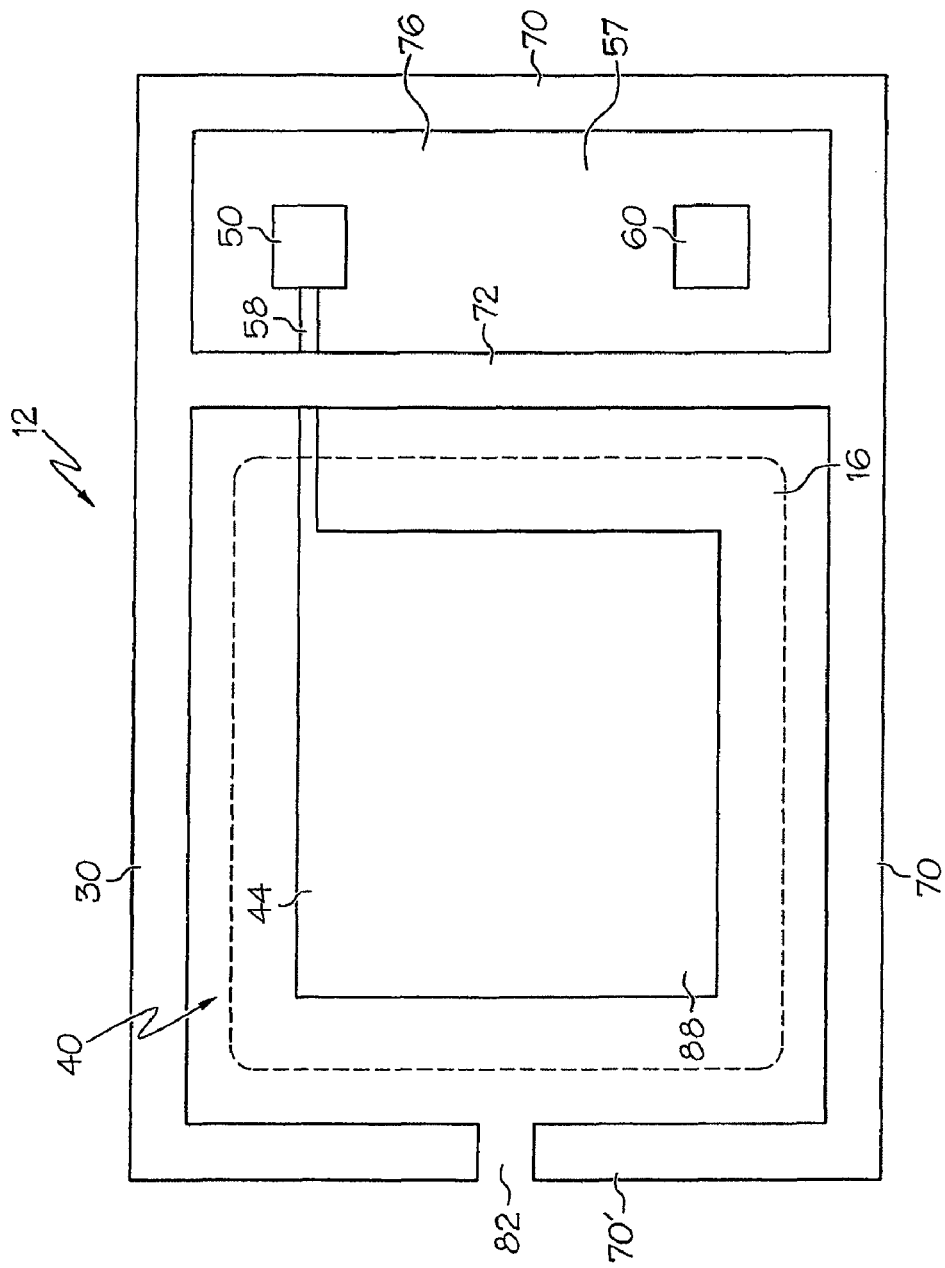
FIG. 5 is a bottom view of an alternate embodiment of the sensor die.

It should be understood that the piezoelectric sensing element 40 may have a variety of shapes and configurations different from that specifically shown herein. For example, if desired, the diaphragm 16, center electrode 44 and outer electrode 46 may each have a circular shape or other shapes in top view, rather than a square or rectangular shape. In addition, as shown in FIGS. 5 and 6, if desired only a single sensing electrode 44 may be utilized. In this case, the single electrode 44 may be located over only the inner (or outer, if desired) portion of the diaphragm 16. In this embodiment the sensitivity of the sensor 10 may be somewhat reduced since a differential electrical measurement is not provided. However, this embodiment provides for a much smaller sensor die 12 (and sensor 10) and simplified electrical connections.

As can be seen from the bottom view of the sensor die 12 provided in FIG. 3, a bond frame 70 is located on the sensor die 12 and forms an enclosure around the underside of the diaphragm 16. The bond frame 70 extends around the perimeter of the sensor die 12, and also includes a bulkhead 72 extending laterally across the sensor die 12. The bulkhead 72 provides environmental isolation of the contacts 50, 52, 60. When the sensor 10 is used in an engine combustion chamber or the like, the chamber may operate at 600 psig or higher and the pressure fluctuations of interest can be as low as 0.1 psig at frequencies as low as 50 Hz (and as high as 1000 Hz). Accordingly, it may be desired to provide some pressure relief across the bond frame 70 to provide hydrostatic balance across the diaphragm 16 and allow a thinner diaphragm 16, thereby increasing the sensitivity of the sensor 10.

As shown in FIG. 1, in one embodiment a small opening 74 is formed in the substrate 14 and below the bond frame 70 to allow pressure equalization across the diaphragm 16 to provide hydrostatic balance. The opening 74 is relatively small (i.e., having a cross sectional area of a few tenths of a millimeter or less) such that any pressure fluctuations on the upper side of the diaphragm 16 are damped or attenuated as they travel through the opening 74. In other words, A/C fluctuations are not transmitted to the lower side of the diaphragm 16, and only lower frequency, static or large scale pressure fluctuations pass through the opening 74. In this manner, the opening 74 forms a low pass frequency filter. As will be described in greater detail below, other methods for providing hydrostatic balance may be provided.

The bulkhead 72 provides a sealed cavity 76 (FIG. 3) around the contacts 50, 52, 60. The sealed cavity 76 is formed by the bond frame 70 and bulkhead 72 around the perimeter thereof, the sensor die 12 on the top side and the substrate on the bottom side 14 (see FIG. 1). The sealed cavity 76 isolates the electrical portion of the device (i.e., the contacts 50, 52, 60) from the pressure portion (i.e., the diaphragm 16) to ensure that the pressure medium does not invade and contaminate/corrode the electrical elements or components, and also protects the electrical elements and components from high pressures.

Thus, each lead 56, 58 electrically connects to a contact 50, 52, and/or each contact 50, 52 is electrically connected to a pin 22, at a connection location 57, and the connection location(s) are located in the sealed cavity 76 to provide protection. Each lead 56, 58 may pass under, over or through the bulkhead 72 using well known surface micromachining methods to enter the sealed cavity 76 without compromising the isolation of the sealed cavity 76. Each contact 50, 52 and each pin 22 may be electrically isolated from the bond frame 70.

At the point where each lead 56, 58 passes under or through the bulkhead 72, each lead 56, 58 is positioned directly between the frame 70, bulkhead 72 and the body of the sensor die 12. At this point an electrically insulating material may be positioned between each lead 56, 58 and the metal layers of the bulkhead 72 to electrically isolate those component and to prevent the leads 56, 58 from shorting to the frame 70 or bulkhead 72. In an alternate embodiment the bulkhead 72 (and indeed the entire frame 70) is positioned on top of the dielectric layer 42, and in this case the dielectric layer 42 electrically isolates the leads 56, 58 from the bulkhead 72.

However the bulkhead 72 may not necessarily be included if the sensor is to be used in a relatively benign environment. For example, FIG. 7A illustrates an embodiment of the sensor die 12 that does not include the bulkhead 72. In addition, any of the embodiments described and shown herein may include or not include the bulkhead 72, as desired. In the embodiment shown in FIGS. 7A and 7B, the bond frame 70 forms a generally serpentine path 78 to allow pressure equalization across the diaphragm 16 as shown by the arrows of FIG. 7A. The body of the sensor die 12 may also have a matching serpentine cavity 80 formed therein. In this case, the opening 74 (i.e., of FIG. 1) is not required, and hydrostatic balance is instead provided by the serpentine cavity 78. The serpentine cavity 78 may provide greater attenuation of the pressure fluctuations on the underside of the membrane 16, depending upon the frequency of the fluctuations. In addition, if desired the embodiment shown in FIG. 7A may utilize a bulkhead 72 to form a sealed cavity 76 around the contacts 50, 52, 60.

Further alternately, as shown in FIG. 5, rather than forming an opening 74 in the substrate 14 or providing the serpentine channel 78, a relatively small opening 82 may be formed in the bond frame 70 (i.e. along end wall 70') to allow pressure equalization. As will be described in greater detail below the bond frame 70 is reflowed during the manufacturing/assembly process. Accordingly, certain channels or other flow control measures (such as placing a void in the dielectric layer 48) may be utilized to ensure that the opening 82 remains open and is not sealed by reflowed material.

It should be understood that the sensor die 12 need not necessarily include any channels or paths to provide pressure equalization, and in this case the two sides of the diaphragm 16 may be fluidly isolated from each other. It should be further understood that any of the various structures for providing pressure balance (i.e. the opening 74 formed in the substrate 14; the opening 82 formed in the bond frame 70; or the serpentine channel 78) can be used in any of the embodiments disclosed herein, or, alternately, no pressure balance structure may be provided.

Piezoelectric Sensor Die Manufacturing

One process for forming the sensor die(s) 12 of FIGS. 1-7 is shown in FIGS. 8-17 and described below, although it should be understood that different steps may be used in the process, or an entirely different process may be used without departing from the scope of the invention. Thus, the manufacturing steps illustrated here are only one manner in which the sensor die 12 may be manufactured, and the order and details of each step described herein may vary, or other steps may be used or substituted with other steps that are well known in the art. A number of sensor dies 12 may be simultaneously formed on a single wafer, or on a number of wafers, in a batch manufacturing process. However, for clarity of illustration, FIGS. 8-17 illustrate only a single sensor die 12 being formed.

It should be understood that when a layer or component is referred to as being located "on" or "above" another layer, component or substrate, this layer or component may not necessarily be located directly on the other layer, component or substrate, and intervening layers, components, or materials could be present. Furthermore, when a layer or component is referred to as being located "on" or "above" another layer, component or substrate, that layer or component may either fully or partially cover the other layer, component or substrate.

It should also be noted that although, in general, the shading of the various layers of the drawings is maintained in a generally consistent manner throughout the drawings of FIGS. 8-17 and elsewhere, due to the large number of components and materials the shading for a material or layer may differ between the various figures. In addition, FIGS. 8-17 represent a schematic cross-section of the wafer during manufacturing, and the location of certain components may not necessarily correspond to a true cross section.

As shown in FIG. 8, the process begins with the SOI wafer 30, such as a double sided, polished 3 inch or 4 inch (or larger) diameter wafer. In one embodiment, the device layer 34 of the wafer 30 is silicon and is about 30 microns thick (8 microns thick in another embodiment), although the device layer 34 may have a variety of thicknesses from about 1 micron to about 60 microns, or from about 3 microns to about 60 microns, or from about 3 microns to about 300 hundred microns, about or less than about 60 microns, or less than about 300 microns, or less than about 200 microns or greater than about 1 micron, or greater than about 3 microns, or have other thicknesses as desired (it should be understood that the thickness of the various layers shown in the drawings are not necessarily to scale).

The device layer 34 may be doped (either n-doped or p-doped) silicon and may have a (111) crystal orientation to aid in subsequent deposition of the piezoelectric film 42. If desired, the device layer 34 can be made of other materials besides silicon, such as sapphire, gallium nitride, silicon nitride, silicon carbide, or high temperature-resistant materials or ceramics. Although the device layer 34 may be made of silicon carbide, in one embodiment of the present invention the device layer 34 is made of non-silicon carbide semiconductor materials.

The responsiveness of the sensor die 12 to a range of pressure fluctuations is directly related to the thickness of the diaphragm 16. In most cases the thickness of the device layer 34 will ultimately determine the thickness of the diaphragm 16, and thus the thickness of the device layer 34 should be carefully selected. However, if desired the thickness of the device layer 34 could be reduced during later processing steps to tailor the responsiveness of the diaphragm 16 to pressure ranges and fluctuations of interest.

The base layer 32 may also be made of silicon or other materials listed above, and can have a variety of thicknesses, such as between about 100 microns and about 1,000 microns, or greater than 1000 microns, and more particularly, about 500 microns. The base layer 32 should be of sufficient thickness to provide structural support to the sensor die 12. In one embodiment, the base layer 32 is single crystal silicon having a (100) crystal orientation to allow easy etching thereof.

The insulating layer 36 can be of any variety of materials, and is typically silicon dioxide. The insulating layer 36 acts as an etch stop, and also provides electrical isolation to the wafer 30. The insulating layer 36 may have a variety of thicknesses, such as between about 0.5 microns and about 4 microns, and is typically about 1 or 2 microns thick. In addition, a lower insulating layer 84 (such as a 0.3 micron thick layer of silicon dioxide) may be deposited or grown on the wafer 30. The lower insulating layer 84 may have the same properties as the insulating layer 36. Alternately, the lower insulating layer 84 may be deposited or grown after the piezoelectric film 42 is deposited, as described below and shown in FIG. 9.

As shown in FIG. 9, after the wafer 30 is provided, the piezoelectric film 42 is deposited on top of the device layer 34. The piezoelectric film 42 may coat all of the device layer 34. Alternately, the piezoelectric film 42 may cover only part of the device layer 34 (i.e. only the diaphragm 16, or only where the electrodes 44, 46 will be located). The material of the piezoelectric film 42 is selected based on its operating temperature range, electrical resistivity, piezoelectric coefficient, and coupling coefficient. Aluminum nitride remains piezoactive up to 1,100° C., and thus may be useful for the piezoelectric film. However, various other materials, including but not limited to gallium nitride, gallium orthophosphate (GaPO4), lanthanum titanate (which can take the form of $La_2Ti_2O_7$) or langasite (which can take the form of several compositions, typically including lanthanum and gallium, such as $La_3Ga_5SiO_{14}$, $La_3Ga_{5.5}Ta_{0.5}O_{14}$, or $La_3Ga_{5.5}Nb_{0.5}O_{14}$) may be used. In addition, any other piezoelectric material may be utilized as the film 42, depending upon the operating temperature.

When the device layer 34 of the wafer 30 is (111) silicon, aluminum nitride can be epitaxially grown on the device layer 34 due to the hexagonal structure of aluminum nitride and the closely corresponding structure of (111) silicon. Further alternately, the piezoelectric film 42 can be deposited using metal organic chemical vapor deposition ("MOCVD"), molecular beam epitaxy ("MBE"), vapor phase epitaxy ("VPE") or any other deposition process which can provide epitaxial growth of the piezoelectric film 42. Further alternately, the piezoelectric film 42 can be sputter deposited in either nanocrystalline or amorphous form. In this case the device layer 34 need not necessarily be of (111) silicon, and instead a thin film of metal, such as platinum, may be deposited on the device layer 34 prior to deposition of the piezoelectric film 42 to act as an electrode during the piezoelectric film sputtering process. If the metal electrode is utilized during the sputtering process, the device layer 34 need not necessarily be doped, as the metal film could instead provide the desired electrical conductivity to the device layer 34. The piezoelectric film 42 can have a variety of thicknesses, such as between about 0.2 and about 2 microns.

As shown in FIG. 10, part of the piezoelectric film 42 is then patterned and removed at 86 to expose part of the device layer 34 therebelow. The piezoelectric film 42 can be etched/patterned by any acceptable method, such as a high density plasma etching (i.e. inductively coupled plasma ("ICP") etching).

As shown in FIG. 11, a metallization layer 88 is then selectively deposited, such as by sputtering and photo patterning, to form or contribute materials to the center electrode 44, outer electrode 46, leads 56, 58 (not shown in FIG. 11), reference contact 60, output contacts 50, 52 and bond frame 70. The metallization layer 88 provides good ohmic contact to the active layer 34 and also operates as a diffusion barrier, as will be described in greater detail below. The materials and process for depositing the metallization layer 88 will be described in greater detail below, but in one embodiment the metallization layer 88 includes a layer of tantalum located on the wafer 30, with a layer of tantalum silicide located on the tantalum layer, and a layer of platinum located on the tantalum silicide layer.

The center electrode 44, outer electrode 46, reference contact 60, output contacts 50, 52 and leads 56, 58 can have a variety of shapes and sizes. In one embodiment (with reference to FIG. 3) the center electrode 44 has dimensions of about 3900×3900 microns; the outer electrode 46 has outer dimensions of about 6000×6000 microns; the reference contact 60 has dimensions of about 2000×1000 microns; each output contact 50, 52 has dimensions of about 600×600 microns; and each lead 56, 58 has a width of between about 50 and about 150 microns.

As shown in FIG. 12, the passivation layer 48, if utilized, is then deposited on the wafer 30 and over the metallization layers 88 and piezoelectric film 42. In one embodiment the passivation layer 48 is $SiO_xN_y$ and is deposited by plasma enhanced chemical vapor deposition ("PECVD") to a thickness of about 1 micron (0.3 microns in another embodiment). However, the passivation layer 48 can be made of any of a wide variety of protective/insulating materials. As noted above the passivation layer 48 may be omitted if the additional protection/insulation is not needed. However, for the remainder of this process flow it is assumed the passivation layer 48 is utilized.

As shown in FIG. 13, portions of the passivation layer 48 are then removed to expose the metallization portion 88 of the reference contact 60, output contacts 50, 52 and bond frame 70. The metallization layer 88 forming the electrodes 44, 46 and leads 56, 58 remains buried. Next, as shown in FIG. 14, a bonding material 90 is deposited on the exposed metallization layers 88 to add further structure to the contacts 50, 52, 60 and bond frame 70. The materials for, and deposition of, the bonding materials 90 will be described in greater detail below, but in one embodiment includes gold and germanium.

As shown in FIG. 15, the lower insulating layer 84 is then patterned to expose portions of the base layer 32 for etching. Next, as shown in FIG. 16, the exposed portions of the base layer 32 are removed to define a cavity 92, above which is located the diaphragm 16, and to define a pair of dicing lanes 94. The portions of the oxide layer 36 located under the diaphragm 16 may also be removed to reduce thermal stresses on the diaphragm 16. The diaphragm 16 can have a variety of sizes, and in one embodiment has a surface area of between about 0.25 mm$^2$ and about 4 mm$^2$. This etch step of FIG. 16 can be carried out by deep reactive ion etching ("DRIE"), a wet etch such as a KOH etch, or any of a variety of other etching methods. The sensor die 12 is then singulated along the dicing lanes 94, resulting in the final structure shown in FIG. 17.

Metallization Layer

Figure 18:
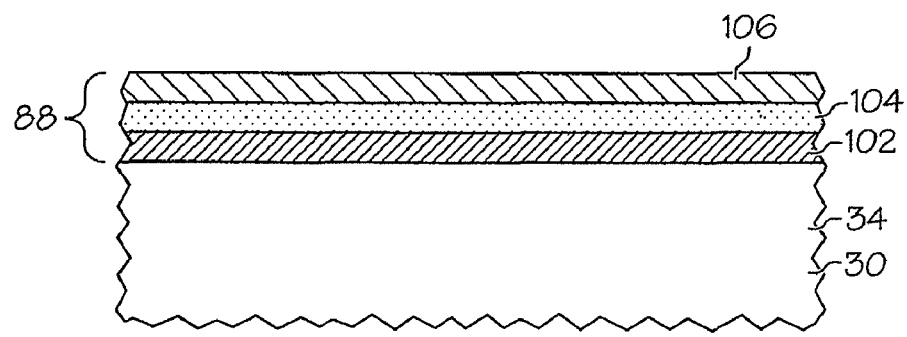
FIG. 18 is a detail view of the area indicated in FIG. 11.
Figure 19:
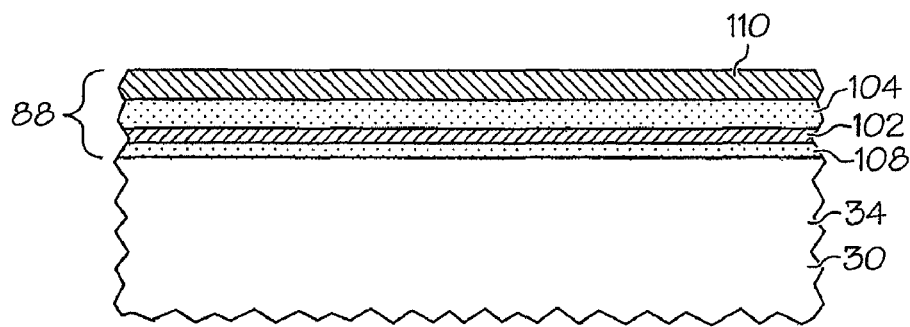
FIG. 19 illustrates the structure of FIG. 18 after annealing.

The structure of, and method for depositing, the metallization layer 88 (referenced in FIG. 11 and the accompanying description) are now described in greater detail. FIGS. 18 and 19 illustrate the deposition of the metallization layer 88 directly on the device layer 34 (i.e. when forming the reference contact 60). In the embodiment shown in FIG. 18, the metallization layer includes a first layer or adhesion layer 102, a second layer or outward diffusion blocking layer 104, and a third layer or inward diffusion blocking layer 106. The adhesion layer 102 can be made of any of a variety of materials which adhere well to the wafer 30 (i.e. silicon). Thus, the material of the adhesion layer 102 can vary depending upon the material of the wafer 30, although the adhesion layer 102 is primarily selected based on its ability to bond strongly to the wafer 30.

Tantalum is one example of the adhesion layer 102 because tantalum adheres well to a variety of materials. However, besides tantalum, various other materials such as chromium, zirconium, hafnium, or any element which reacts favorably with the wafer 30 and forms compounds which bond strongly to the wafer 30 may be utilized as the adhesion layer 102.

The adhesion layer 102 can have a variety of thicknesses, and can be deposited in a variety of manners. However, the adhesion layer 102 should have sufficient thickness to ensure proper adhesion to the wafer 30, but should not be so thick so as to add significant bulk to the metallization layer 88. The adhesion layer 102 may be initially deposited to a thickness of between about 100 Angstroms and about 10,000 Angstroms, and may be deposited by plasma enhanced physical vapor deposition or other suitable deposition techniques known in the art.

When the adhesion layer 102 is tantalum, the presence of oxygen at the interface of the adhesion layer 102 and the wafer 30 can inhibit silicide formation which material is desired for its diffusion blocking properties. The presence of oxygen at the interface can also cause adverse metallurgical transformations in the adhesion layer 102 to thereby create a highly stressed (i.e., weak) adhesion layer 102.

Accordingly, prior to depositing the adhesion layer 102 on the device layer 34, the upper surface of the device layer 34 may be cleaned to remove oxides. This cleaning step may involve the removal of oxides through plasma sputter etching, or a liquid HF (hydrofluoric acid) solution or a dry HF vapor cleaning process or other methods known in the art. The adhesion layer 102 should be deposited on the device layer 34 shortly after the cleaning step to ensure deposition thereon before oxides have the opportunity to redevelop on the device layer 34 (i.e. due to oxidizing chemical reactions with oxygen in the surrounding environment).

Outwardly diffusing materials (i.e. the silicon of the wafer 30) may react with the materials of the metallization layer 88 which can weaken the metallization layer 88. Thus, the second layer 104 is made of a material or materials which blocks the outward diffusion of the material of the wafer 30. Although the second 104 and third 106 layers are designated as inward and outward diffusion blocking layers, respectively, it should be understood that the second 104 and third 106 layers may not, by themselves, necessarily block diffusion in the desired manner. Instead, each of the layers 104, 106 may include or contribute a material which reacts to form a diffusion blocking layer upon sintering, annealing, chemical reactions, etc. of the metallization layer 88, as will be described in greater detail below.

The second layer 104 can be made of any of a wide variety of materials depending upon the materials of the wafer 30 (the outward diffusion of which is desired to be blocked). In one embodiment, the second layer 104 is tantalum silicide although a variety of other materials including but not limited to tantalum carbide and tungsten nitride may be utilized. The second layer 104 should have a thickness sufficient to prevent outward diffusion of the wafer material 30, or to contribute sufficient materials to form a sufficient outward diffusion barrier layer after annealing. The second layer 104 may be initially deposited to a thickness of between about 100 Angstroms and about 10,000 Angstroms by plasma sputtering, or other suitable deposition techniques known in the art.

When the second layer 104 is made of compounds (for example, tantalum silicide) the tantalum silicide may be deposited directly in its form as tantalum silicide. Alternately, layers of tantalum and layers of silicon may be deposited such that the layers subsequently react to form the desired tantalum silicide. In this case alternating, thin (i.e. 5 to 20 Angstroms) discrete layers of the two basic materials (tantalum and silicon) are deposited on the adhesion layer 102 in a co-deposition process. The number of alternating layers is not critical provided that the total thickness of the composite layer is between about 100 and about 10,000 Angstroms as described above. After the alternating layers of tantalum and silicon are deposited, the alternating layers are exposed to elevated temperatures during an annealing step, which is discussed in greater detail below. During the annealing step the alternating layers of tantalum and silicon diffuse or react to form a single layer of tantalum silicide.

When using this method to deposit the tantalum silicide 104, the relative thickness of the deposited layers of tantalum and silicon during the co-deposition process controls the ratio of tantalum and silicon in the resultant tantalum silicide layer 104. Thus, the ability to control the relative thickness of the tantalum and silicon layers allows a silicon-rich or silicon-lean layer of tantalum silicide to be formed. For example, a relatively silicon-rich layer of tantalum silicide (i.e. tantalum silicide having an atomic composition of a few percentage points richer in silicon than stoichiometric tantalum silicide ($TaSi_2$)) may be preferred as the outward diffusion barrier 104 to enhance diffusion resistance.

The third layer 106 of the metallization layer 88 is made of a material or materials that block or limit inward diffusion of undesired elements, compounds or gases. For example, the third layer can be made of materials which block the inward diffusion of gases such as nitrogen, oxygen or carbon dioxide in the surrounding environment, or which block the inward diffusion of solid elements or compounds located on the metallization layer 88. These undesired elements, compounds or gases can adversely react with the other materials of the metallization layer 88 or the materials of wafer 30.

The third layer 106 may be made of a variety of materials, such as platinum, although the materials of the third layer depends upon the materials of the wafer 30 and the materials of the adhesion 102 and second layer 104, as well as the elements, compounds or gases which are desired to be blocked from diffusing inwardly. The third layer 106 can be deposited to an initial thickness of between about 100 Angstroms and about 10,000 Angstroms by plasma sputtering or other suitable deposition methods known to those skilled in the art.

In one embodiment the first layer 102 includes a tantalum layer having a thickness of about 1500 Angstroms, the second layer 104 includes tantalum silicide having a thickness of about 3000 Angstroms, and the third layer 106 is platinum having a thickness of about 10,000 Angstroms. The specific thickness tolerances of the various layer 102, 104, 106 is determined by the need to create an effective adhesion layer and for the processed materials to diffuse and create effective inward and outward diffusion barriers, while leaving enough platinum available on the outer surface of the metallization layer 88 for platinum-platinum wire bonding.

FIG. 18 illustrates the metallization layer 88 after deposition of the first layer 102 (tantalum in the illustrated embodiment), second layer 104 (tantalum silicide in the illustrated embodiment) and third layer 106 (platinum in the illustrated embodiment). After the deposition of the layers 102, 104 and 106, the metallization layer 88 is annealed (also termed sintering) to cause certain reactions and/or reaction byproducts. In particular, in one embodiment the structure shown in FIG. 18 is annealed for about 30 minutes at about 600° C. in a vacuum. The annealing process is carried out such that the layer of tantalum silicide 104 is formed (if tantalum and silicide are deposited as alternating layers) or until the other desired reactions are complete.

Alternately, rather than utilizing a single step anneal process, a two step anneal process may be utilized. The two step anneal process includes ramping to a temperature of about 450° C. by increasing temperature (from room temperature) about 6° C.-10° C. per minute. The first anneal step is then performed by holding the temperature at about 450° C. for about 1 hour. The temperature is slowly increased to about 600° C. over a period of about 15 minutes, and then the temperature is held at about 600° C. for about 1 hour for the second anneal step. The metallization layer 88 is then allowed to slowly cool.

Figure 20:
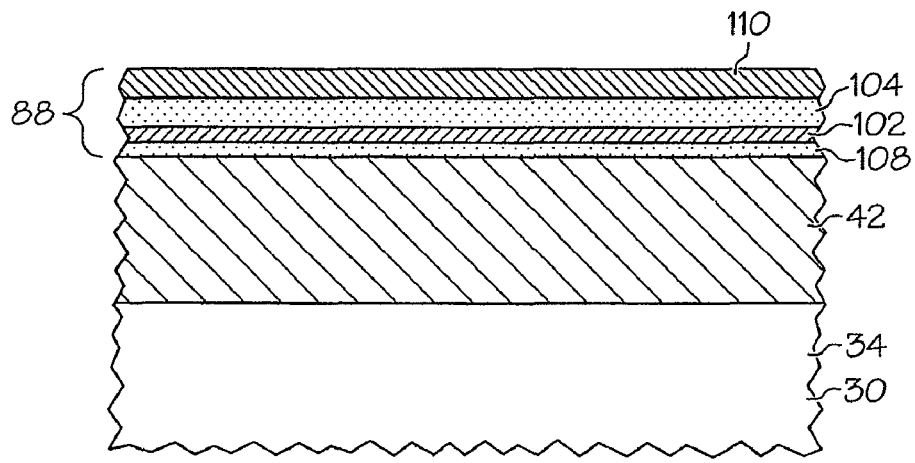
FIG. 20 is a detail view of the area indicated in FIG. 11, shown after annealing.

The two step anneal process improves adhesion of the metallization layer 88 to the wafer 30 and in particular improves adhesion of the adhesion layer 102/108 to the piezoelectric film 42 (FIG. 20). In addition, because a significant portion of the two step anneal process occurs at a relatively low temperature (i.e., below 600° C.), diffusion of platinum or tantalum through the piezoelectric film 42 and into the device layer 34 is reduced, thereby reducing electrical leakage issues.

FIG. 19 illustrates the structure of FIG. 18 after the anneal step. It is noted that for discussion purposes the first, second and third layers may be referred to herein as the "tantalum layer 102," "tantalum silicide layer 104" and "platinum layer 106," respectively. However, this convention is included for ease of discussion purposes only and is not intended to convey that the layers 102, 104, 106 are limited to those particular materials. Further, it is noted that various layers or materials other than those shown in FIG. 19 and discussed below may form in the metallization layer 88 after annealing, and FIG. 19 merely illustrates the presence of the various, major layers which are expected to be present after annealing.

In particular, when the wafer 30 is a SOI wafer and the first 102, second 104 and third 106 layers are tantalum, tantalum silicide and platinum, respectively, after annealing an inner tantalum silicide layer 108 is formed as a reaction product of the adhesion layer 102 and the wafer 30. The inner tantalum silicide layer 108 adheres well to the tantalum adhesion layer 102 and to the wafer 30, and therefore provides a high adhesion strength for the metallization layer 88. In addition, because tantalum silicide generally blocks the outward diffusion of many materials (including silicon), the inner tantalum silicide layer 108 also acts as an outward diffusion-blocking layer for the silicon wafer 30. When the wafer 30 is made of materials other than silicon, and tantalum is used as the adhesion layer 102, various other diffusion-blocking tantalum compounds may be formed depending upon the material of the wafer 30.

As shown in FIG. 19, after annealing the upper platinum layer 106 is converted to a layer of platinum silicide 110 due to reactions between the platinum of layer 106 and the silicon of the wafer 30 and/or the silicon of the tantalum silicide 104. The resultant platinum silicide 110 acts as an inward diffusion-blocking layer, and in particular blocks the inward diffusion of oxygen and nitrogen. The platinum silicide layer 110 may not be entirely platinum silicide, and may instead include a gradient of platinum and platinum silicide such that the upper surface of the metallization layer 88 is at least about 90%, or at least about 99%, or at least about 99.99% platinum. It should also be noted that rather than using tantalum silicide as the second layer 104 of the metallization layer 88, tantalum nitride (i.e., having a thickness of about 500 angstroms or other thickness as desired) may be utilized as the second layer.

When tantalum silicide is used as the second layer 104 of the metallization layer 88, the tantalum silicide effectively prevents oxygen from diffusing therethrough to form an oxide at the silicon/tantalum interface. However, at temperatures above about 700° C., silicon may diffuse upwardly through the metallization layer 88 to form a silicon oxide layer on top of the metallization layer 88, which makes subsequent bonding of wires thereto difficult.

In contrast, when tantalum nitride is utilized as the second layer 104, the tantalum nitride not only prevents oxygen from diffusing inwardly, but also prevents silicon from diffusing outwardly to protect the top surface of the metallization layer 88. It is believed that the diffusion barrier effectiveness of tantalum base liners increases with higher nitrogen content, at least up to an N to Ta stoichiometry of 1:1. Thus, if desired, tantalum nitride can also be used as the second layer 104.

As noted above, FIG. 19 illustrates the post-annealing metallization layer 88 located directly on the device layer 34 to form at least part of the reference contact 60. However, as can be seen in FIG. 11 metallization layers 88 are also positioned on top of the piezoelectric film 42 (i.e. to form the electrodes 44, 46, contacts 50, 52, leads 56, 58 and part of the bond frame 70). In this case the metallization film 88 deposited on the piezoelectric film 42 in FIG. 11 can have the same structure and be deposited in the same manner as the metallization film 88 of FIG. 18 and described above. The post-annealing structure of the metallization film 88 located on the piezoelectric film 42 (shown in FIG. 20) may be the same as the post-annealing metallization film 88 shown in FIG. 19. Thus, the metallization layer 88 provides contacts 50, 52, 60, electrodes 44, 46, and leads 56, 58 and a bond frame 70 that are metallurgically stable at high temperatures and resist diffusion and chemical reactions.

Bonding Materials

Figure 21:
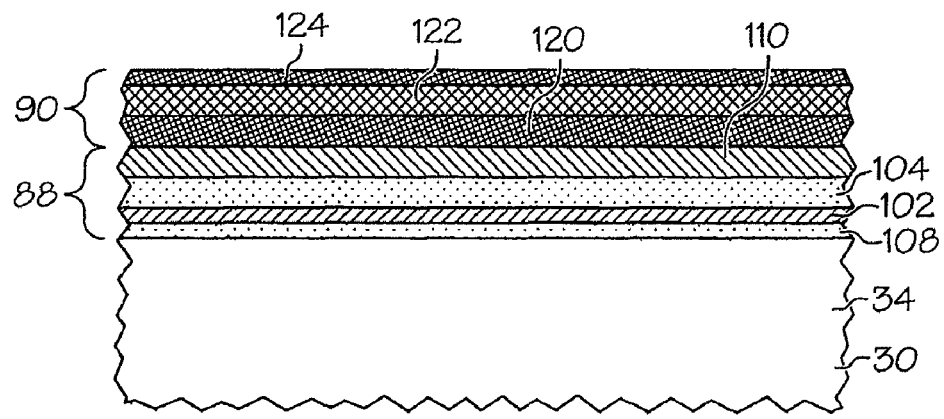
FIG. 21 illustrates the structure of FIG. 19, with bonding materials deposited thereon.

The application of the bonding material or bonding layer 90 (referenced in FIG. 14 and the accompanying description) is now described in greater detail. As shown in FIG. 21, the bonding layer 90 is located on the metallization layer 88. The bonding layer 90 includes first 120 and second 122 bonding materials or layers that can form eutectics with each other. For example, the first bonding material 120 can be gold, or any other element or material that can form a eutectic alloy with the second bonding material 122. The second bonding material 122 may be germanium, tin, or silicon, or any element or material that can form a eutectic alloy with the first bonding material 120. Representative examples of other materials of the bonding layer 90 includes InCuAu, AuNi, TiCuNi, AgCu, AgCuZn, InCuAg, and AgCuSn.

Both the first 120 and second 122 bonding materials may be deposited on the associated metallization layer 88 by plasma sputtering or other suitable deposition techniques known to those skilled in the art. Further, the first 120 and second 122 bonding materials can be deposited in a variety of thicknesses. However, the thickness of the bonding materials 120, 122 should be selected to provide the desired ratio between the first 120 and second 122 bonding materials in the end product bond.

In the illustrated embodiment the bonding layer 90 includes a capping layer 124 located on the second bonding material 122. The capping layer 124 caps and protects the second bonding material 122 to prevent oxidation of the second bonding material 122. The capping layer 124 can be any of a wide variety of materials which resist oxidation, such as gold. In this case, the capping layer 124 can be the same material as the first bonding layer 120 so that the capping layer 124 participates in the eutectic joining process. The capping layer 124 may be quite thin, such as about 1000 Angstroms or less.

Sensor Die Attachment

Figure 22:
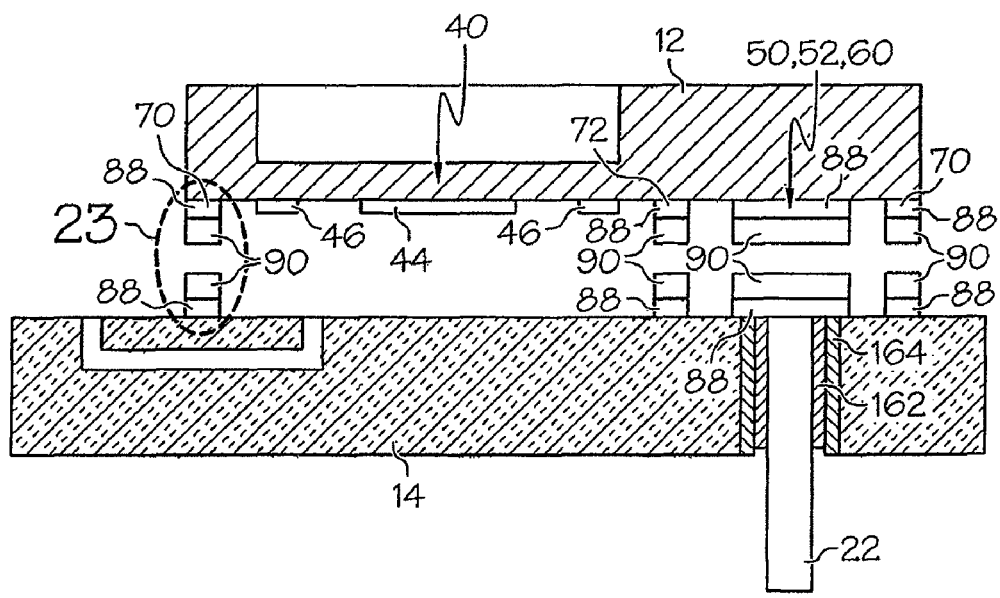
FIG. 22 illustrates the sensor die and substrate of FIG. 1 spaced apart and ready to be coupled together.

Once the sensor die 12 as shown in FIG. 17 is provided, which sensor die 12 includes the metallization layer 88 and bonding layer 90 located thereon, the sensor die 12 is then desired to be coupled to the substrate 14. As shown in FIG. 22, the sensor die 12 is inverted from its position shown in FIG. 17 and aligned with the substrate 14. The substrate 14 has the metallization layer 88 and bonding material 90 deposited thereon in generally the same manner as described above in the context of the sensor die 12.

However, because the substrate 14 may be made of different materials than the sensor die 12, some of the materials of the metallization layer 88 on the substrate 14 may differ from those described above in the context of the sensor die 12. For example, when the substrate 14 is aluminum nitride (as contrasted with the silicon of the sensor die 12), the layer 108 of the metallization layer 88 may be or include materials other than tantalum silicide, such as tantalum nitride, tantalum aluminide or ternary compounds of tantalum, aluminum, and nitrogen. In addition, the material of the adhesion layer 102 of the metallization layer 88 can vary depending upon the materials of the substrate 14.

For the description below, it will be assumed that the second bonding materials 122 of the bonding materials 90 are germanium, and that the first bonding materials 120 and capping materials 124 are gold to allow discussion of the specific properties of the gold/germanium eutectic alloy. However, this discussion is for illustrative purposes and it should be understood that various other materials may be utilized as the first bonding materials 120, second bonding materials 122, and capping materials 124.

Figure 23:
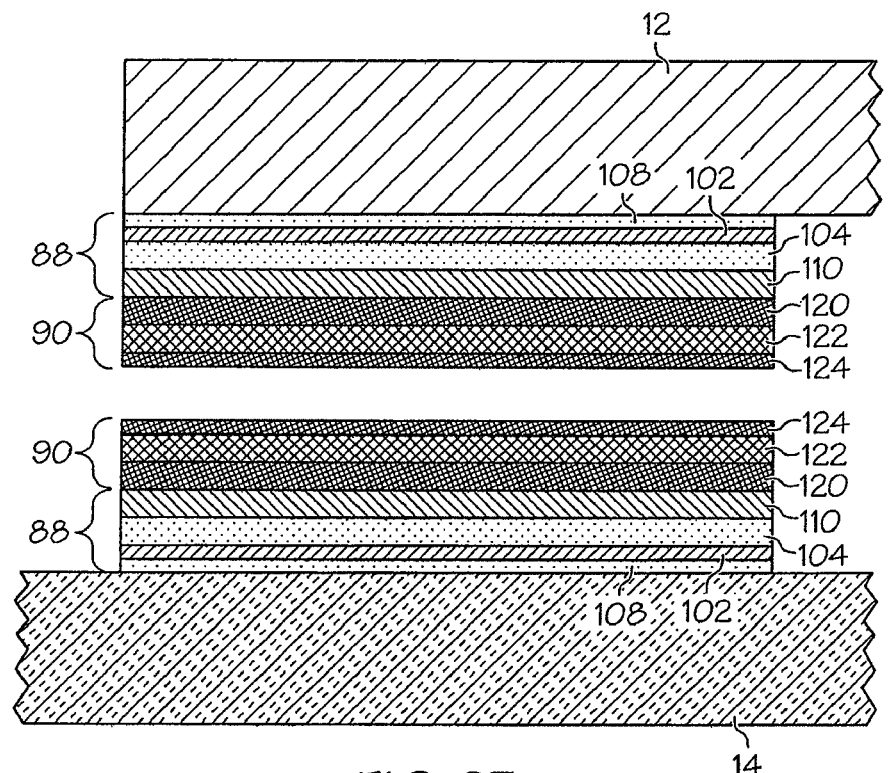
FIG. 23 is a detail view of the area indicated in FIG. 22.
Figure 24:
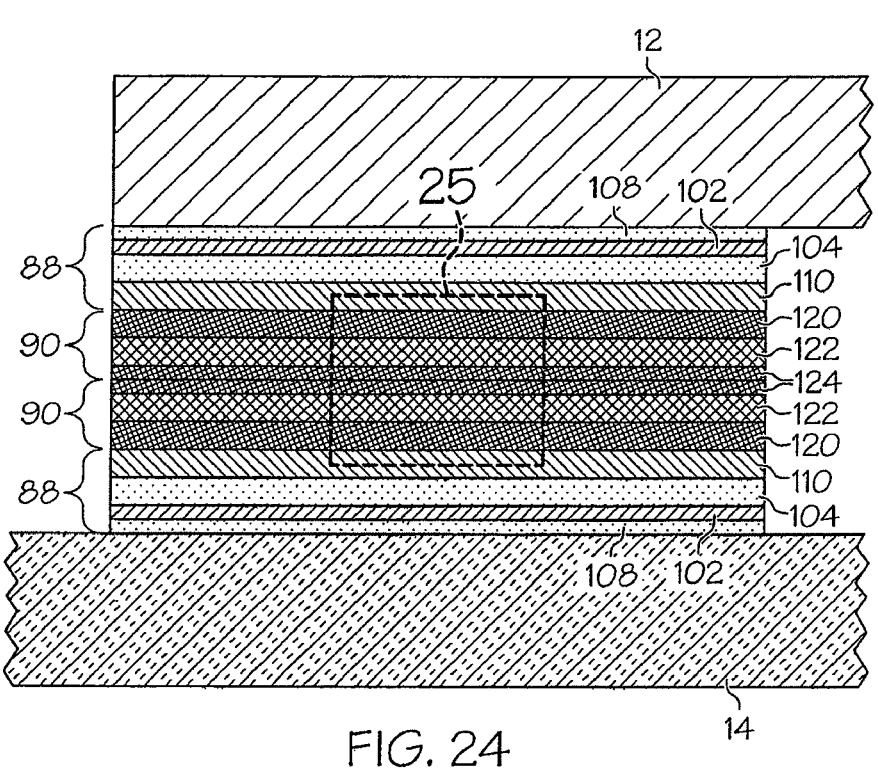
FIG. 24 illustrates the components of FIG. 23 pressed together.

The substrate 14 and sensor die 12 are aligned as shown in FIG. 22 in preparation of bonding, and either or both components may include self alignment features to aid in the alignment process. The metallization layers 88/bonding layers 90 of the substrate 14 have a pattern matching the pattern of the metallization layers 88/bonding layers 90 of the sensor die 12 such that, once joined, those materials match up to form/complete the electrical contacts 50, 52, 60 and the bond frame 70 joining those components together. The sensor die 12 and substrate 14 are pressed together such that their bonding layers 90 contact each other, as shown in FIGS. 23 and 24. The materials of the bonding layers 90 should be sufficiently flat such that during the eutectic bonding process (described below) the liquids formed during the bonding process fully fill any voids or gaps between the bonding layers 90.

Figure 32:
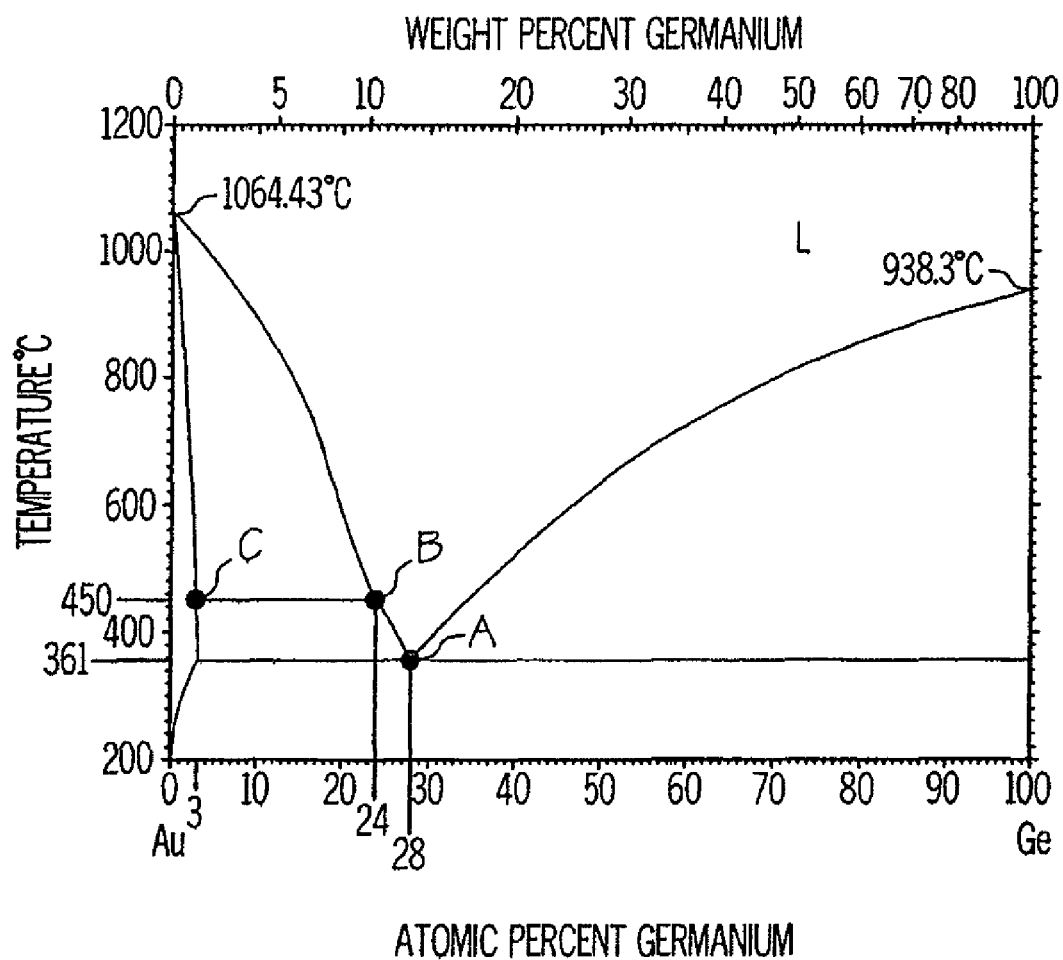
FIG. 32 is a eutectic diagram for germanium/gold alloys.

The sensor die 12 and substrate 14 are next joined or bonded in a transient liquid phase bonding process which is well known in the art, but is outlined briefly below. To commence the transient liquid phase bonding a light pressure (e.g. a few pounds) is applied to press the sensor die 12 and substrate 14, and their bonding layers 90 together (FIG. 24). The bonding layers 90 are then exposed to a temperature at or above the eutectic point or eutectic temperature of the bonding alloy, i.e. a gold/germanium alloy. For example, as can be seen in FIG. 32, the eutectic temperature of a gold/germanium alloy is about 361° C.

In the illustrative example the bonding layers 90 are exposed to a temperature of about 450° C. However, the actual bonding temperatures will depend upon the diffusion rate of the bonding materials 90, the thickness of the bonding materials 90 and the time available to complete the diffusion such that a uniform solid solution of the bonding alloy is achieved.

Figure 25:
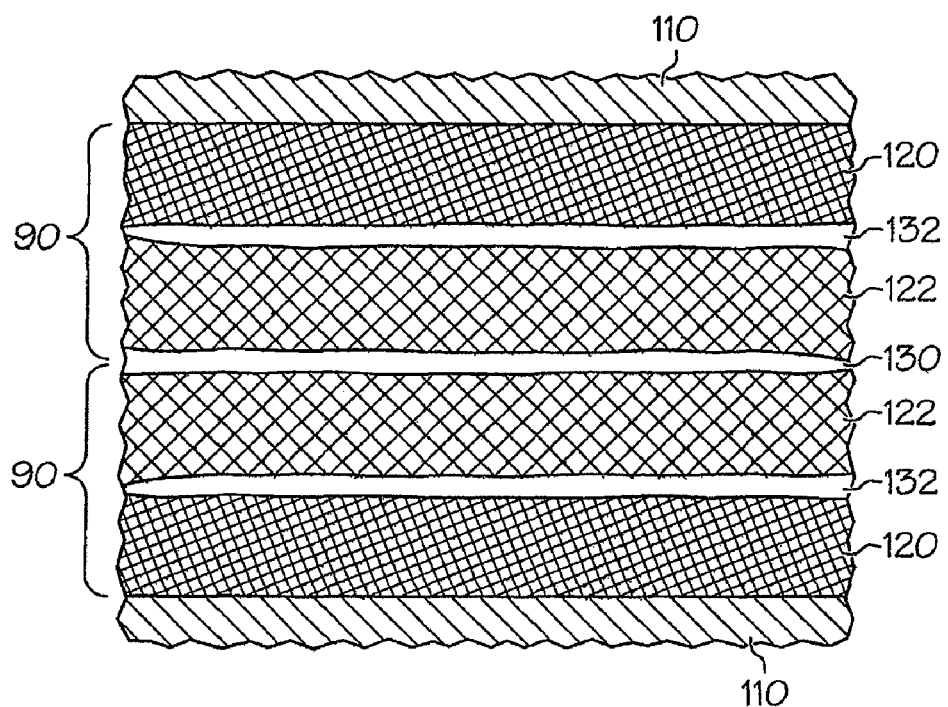
FIG. 25 is a detail view of the area indicated in FIG. 24.

Once the materials at the gold/germanium interfaces reach the eutectic temperature (i.e., 361° C.), zones of melted or liquid materials 132 are formed at each interface (see FIG. 25) due to the melting of materials. In FIG. 25, the entire capping layers 124 have melted (due to the thinness of those layers) to form the central liquid zone 130, and portions of the second bonding layers 122 and first bonding layers 120 have melted to form the top and bottom liquid zones 132. Each zone of liquid material 130, 132 has a composition that is at or near the eutectic composition.

Figure 26:
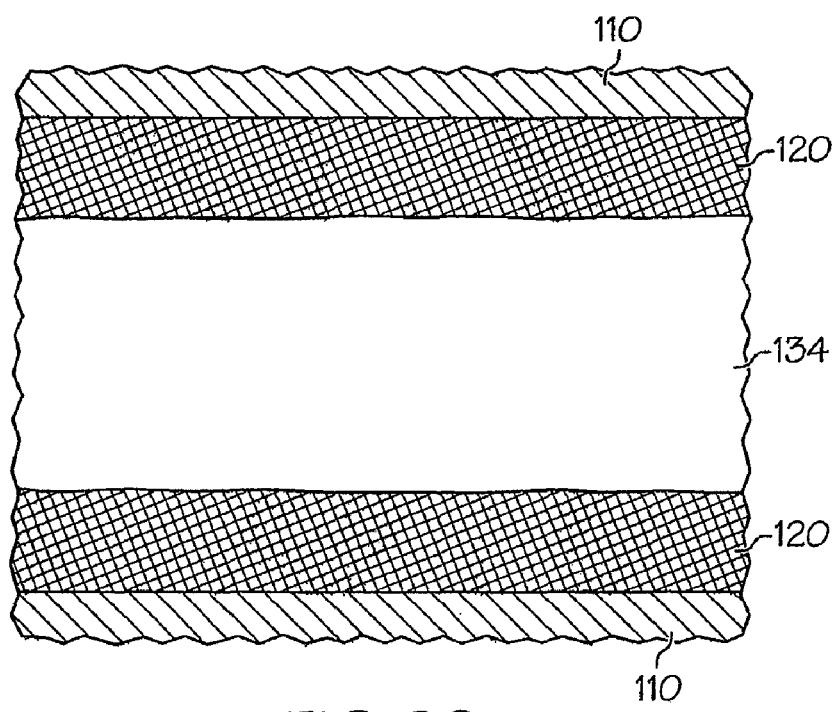
FIGS. 26-30 illustrate various layers formed during the bonding process.

As the bonding layers 90 continue to heat up and approach the ambient temperature (i.e., 450°), the liquid zones 130, 132 continue to grow and expand until all the material of the germanium layers 122 melt and dissolve into the liquid zones 130, 132. Thus, the separate liquid zones of FIG. 25 grow and ultimately combine to form a single larger liquid zone 134 (FIG. 26). At the stage shown in FIG. 26, the last of the material of the germanium layers 122 have been dissolved, and the liquid zone remains at composition A of FIG. 32.

Next, the materials of the gold layers 120 adjacent to the liquid zone 134 continue to liquefy as the surrounding materials approach the ambient temperature. As additional gold is melted and added to the liquid zone 134, the germanium in the liquid zone 134 is diluted and the percentage of germanium in the liquid zone 134 is thereby reduced. Thus, the composition of the liquid zone 134 moves up and to the left of point A along the liquidus line 138 of FIG. 32. As the melted gold continues to dilute the germanium, the liquid composition ultimately reaches the composition at point B of FIG. 32 when the liquid zone 134 reaches the ambient temperature of 450° C.

Figure 27:
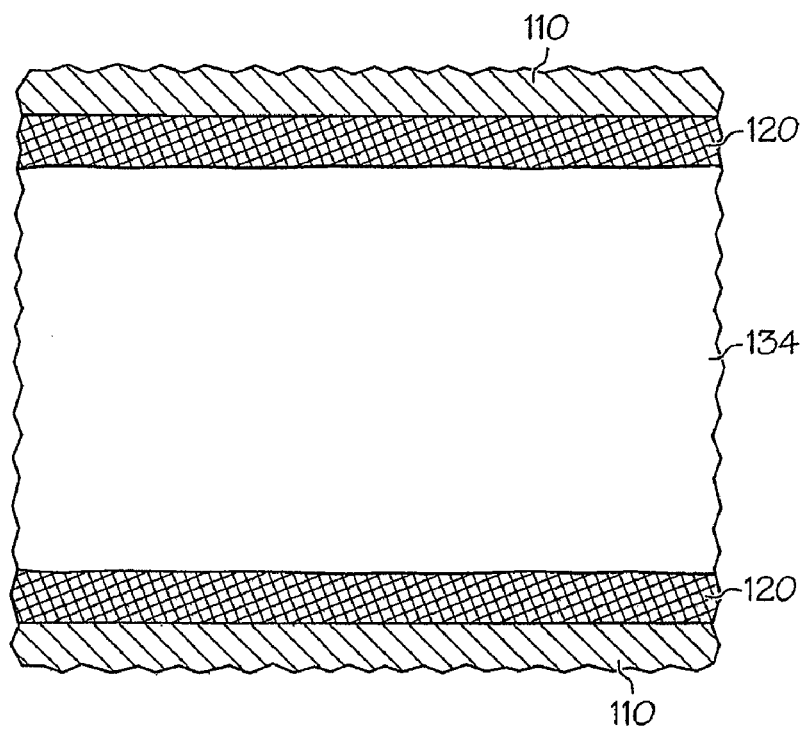

FIG. 27 illustrates the bonding process wherein the liquid zone 134 has grown and added gold such that the liquid zone is at composition B. At this stage the liquid zone 134 has reached the ambient temperature of 450° C., and has a composition of about twenty four atomic percent germanium and seventy six atomic percent gold.

Figure 28:
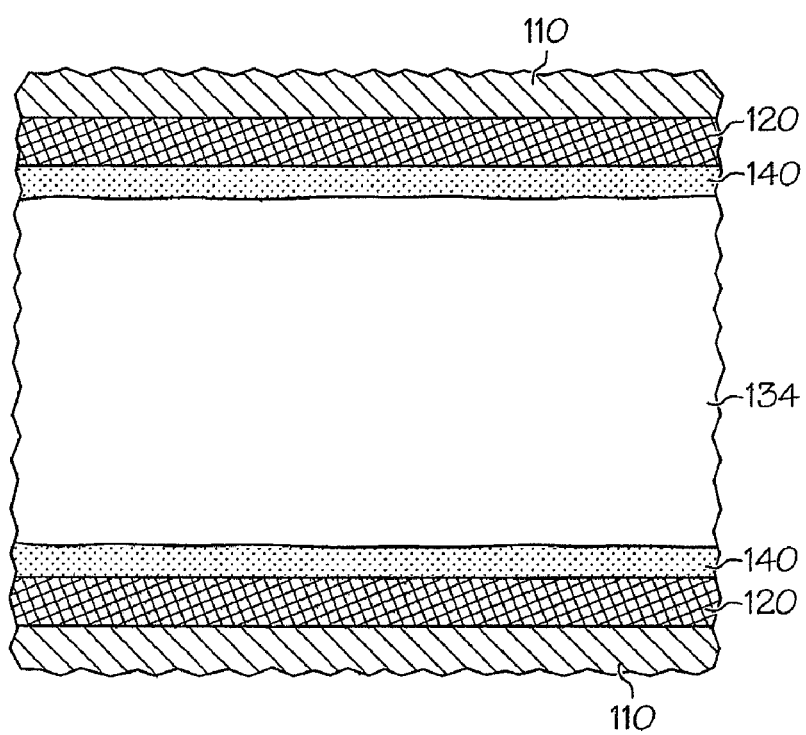

Once the composition of the liquid zone reaches point B, the germanium in the liquid zone 134 begins diffusing into the remaining solid gold layer 120 at the interface of the liquid zone 134 and the gold layers 122. As this occurs, the concentration of germanium in the liquid zone 134 adjacent to the interface drops. Once the percentage of germanium at the interface drops sufficiently low (i.e., about three atomic percent germanium or less), the liquid zone at the interface forms into a solid solution phase 140 (see FIG. 28). The newly-formed solids 140 have a composition indicated at point C on the graph of FIG. 32. As can be seen in FIG. 32, the point C is located on the solidus line 142, which indicates the percentage of germanium at which solids will form for a given temperature. Thus the newly-formed solids have about three atomic percent germanium and about ninety-seven atomic percent gold.

Figure 29:
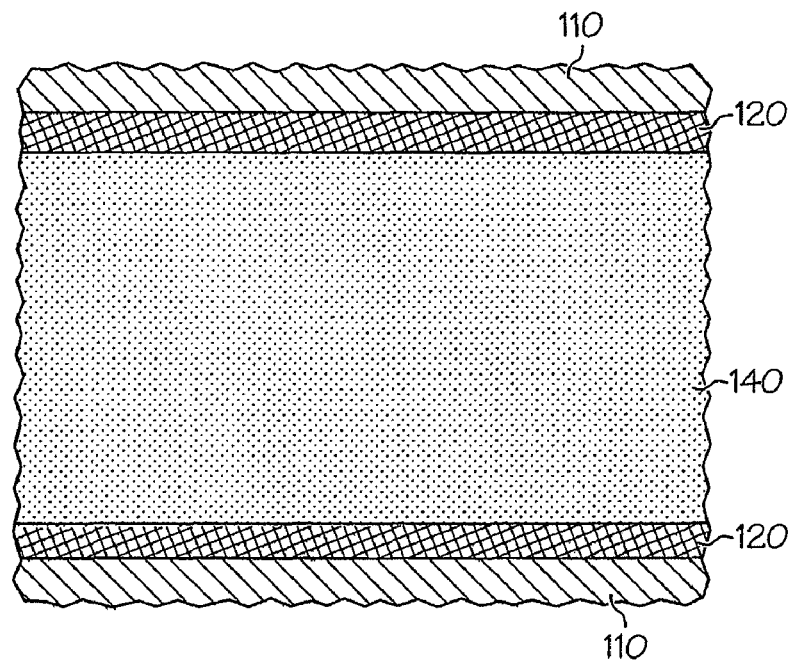
Figure 30:
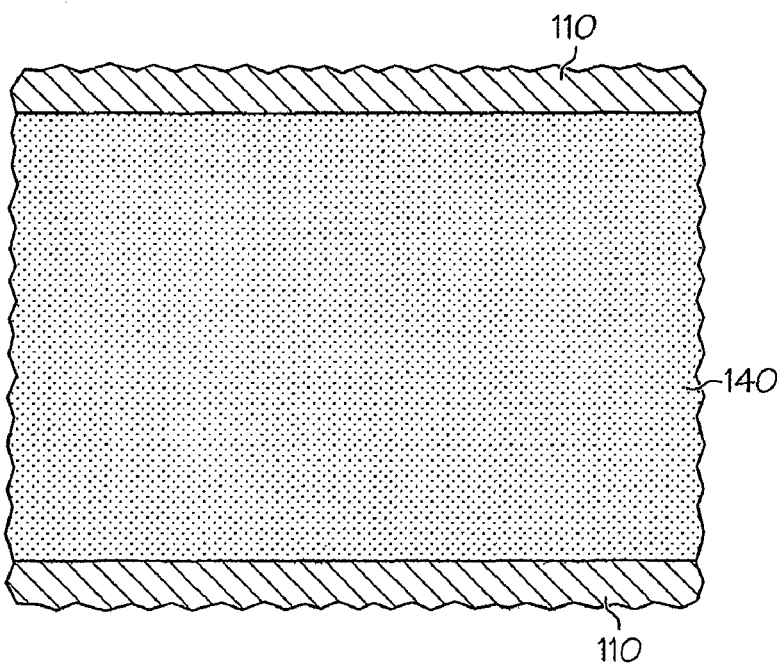

The ambient temperature continues to be held at 450° C. and remaining germanium in the liquid zone 134 continues to diffuse outwardly, through the newly-formed solids 140 and into the predominantly gold layers 120. As the germanium in the liquid zone 134 continues to diffuse outwardly, more germanium-poor liquids at the interface of the liquid zone 134 and the solids 140 are created and ultimately form into solids 140. In this manner the solids 140 grow inwardly until the entire liquid zone 134 is consumed (FIG. 29). At this point the solid 140 may be relatively germanium-rich (i.e., about three atomic percent germanium) and the surrounding gold layers 120 may be relatively germanium-poor (i.e. less than about three atomic percent germanium). In this case the germanium continues to diffuse, through solid-state diffusion, from the solid 140 into the gold layers 120 until equilibrium is reached and both the solid 140 and the gold layers 120 all have the same composition (shown as solid 140 in FIG. 30).

The solid 140 formed after solid state diffusion is a gold/germanium alloy or solid solution alloy having a composition of about three atomic percent germanium. However, the amount of available germanium may be limited by restricting the thickness of the germanium layer 122 to a relatively low percentage relative to the available gold. The amount of available germanium can also be reduced by scavenging (with a germanium scavenging material such as platinum, nickel and chromium) so that the resultant solid 140 has a composition of less than about three atomic percent germanium (e.g., as low as about 0.5 atomic percent germanium or even lower). In either case, when the amount of germanium is restricted/reduced, the composition of the solid 140 is located to the left of point C of FIG. 32. With reference to the phase diagram of FIG. 32, reducing the atomic percentage of germanium to lower than three atomic percent provides a solution located on the solidus line 142 above and to the left of point C. Moving the composition to the left of point C provides a solid solution with a melting point above 450° C., up to a theoretical maximum of 1064° C.

The transient liquid phase bonding method described above allows the joining of the silicon sensor die 12 and the ceramic substrate 14 at a relatively low temperature (but above the eutectic temperature) which avoids damaging any temperature-sensitive components, yet results in a bond having a relatively high melting temperature. The resultant bonding material 140 is a hypoeutectic gold-germanium solid alloy having a relatively high melting temperature. The solid bonding material 140 can also be a hypoeutectic gold-silicon solid alloy or a hypoeutectic gold-tin solid alloy depending upon the starting materials for the bonding layers 90. The bonding process can also be performed using a eutectic die bonder with heated stage and ultrasonic energy for acceleration of the fusion process.

Figure 31:
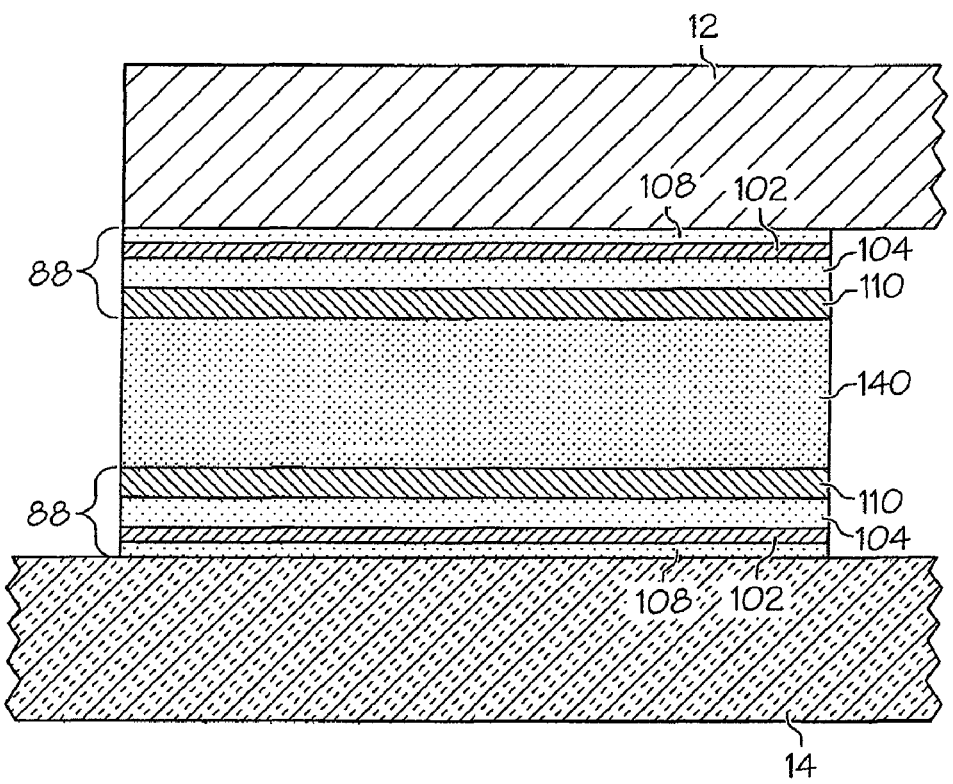
FIG. 31 illustrates the components of FIG. 24 after the bonding process is complete.

FIG. 31 illustrates part of the sensor die 12 and substrate 14 after the bonding layers 90 have been joined to form a single bonded layer 140. Thus, FIG. 31 illustrates the circled area "23" indicated in FIG. 22, after bonding.

As described above the metallization film 88 includes the inward diffusion blocking layer 110 which blocks inward diffusion of materials into or through the metallization film 88 during the bonding process. Similarly, layers 104 and/or 102 and/or 108 block outward diffusion of materials of the sensor die 12 and/or substrate 14 during bonding. Thus, the metallization layer 88 resists diffusion therethrough, adheres well to various substrates, and is thermodynamically stable, even at elevated temperatures for extended periods of time. Working together, the metallization layer 88 and bonding materials 90 allow low temperature bonding with robust high temperature operation.

Substrate Attachment

Figure 33:
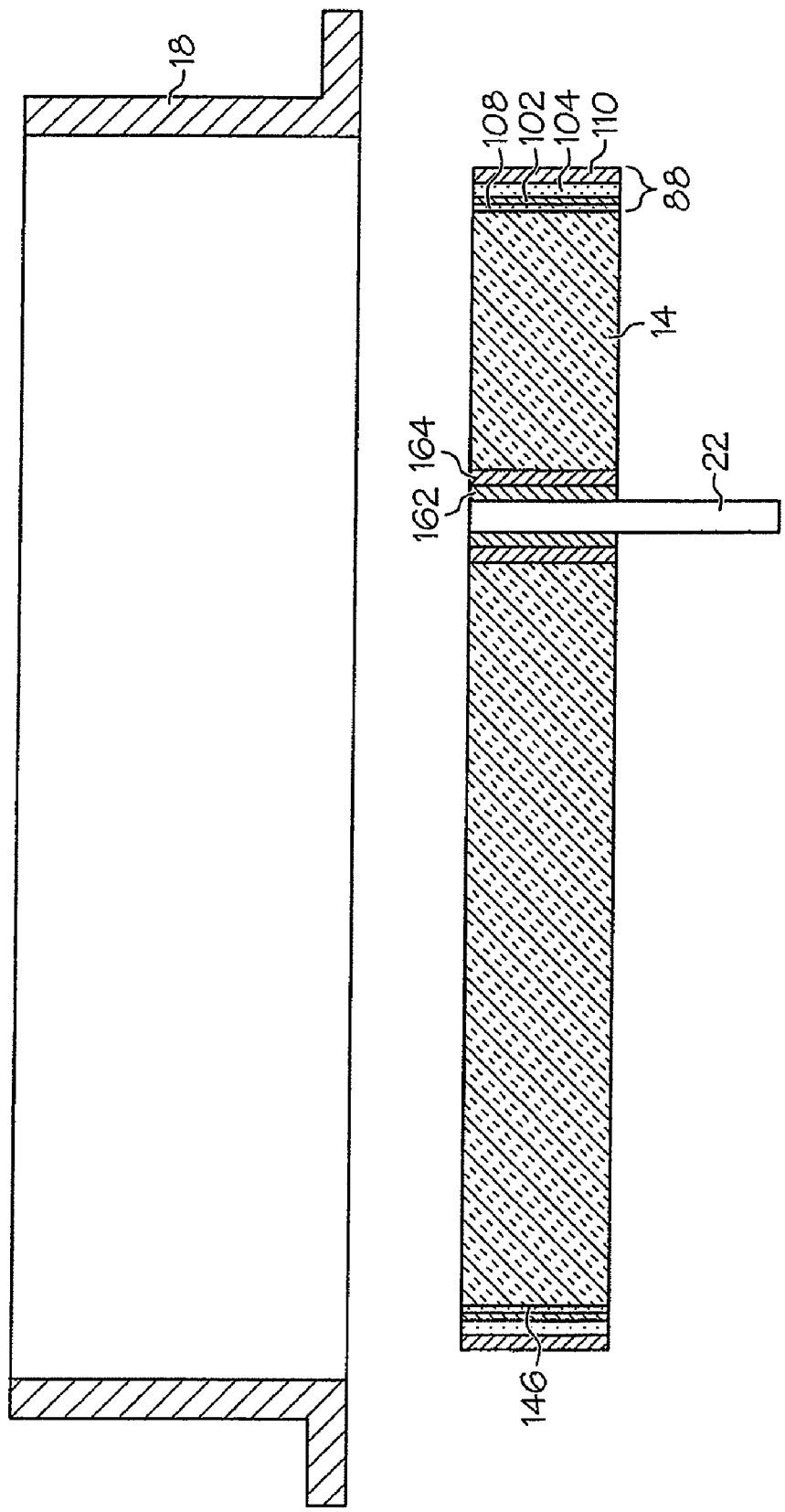
FIG. 33 illustrates the substrate and ring of FIG. 1, exploded away from each other.
Figure 34:
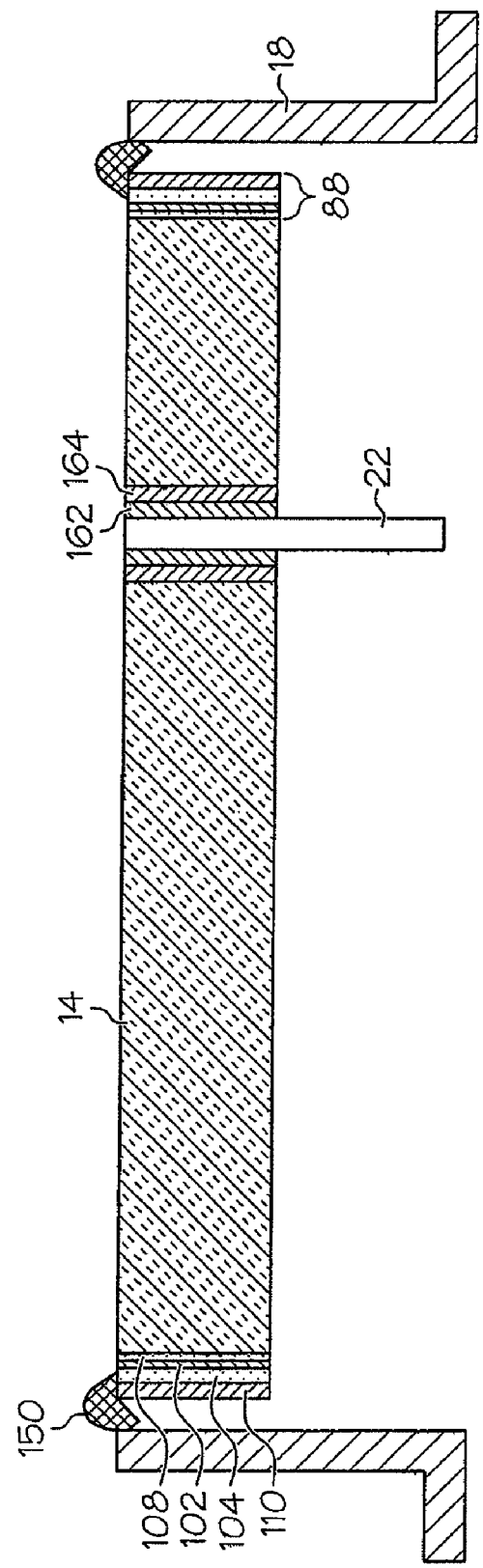
FIG. 34 illustrates the substrate of FIG. 33 positioned in the ring of FIG. 33 with a braze material deposited thereon.
Figure 35:
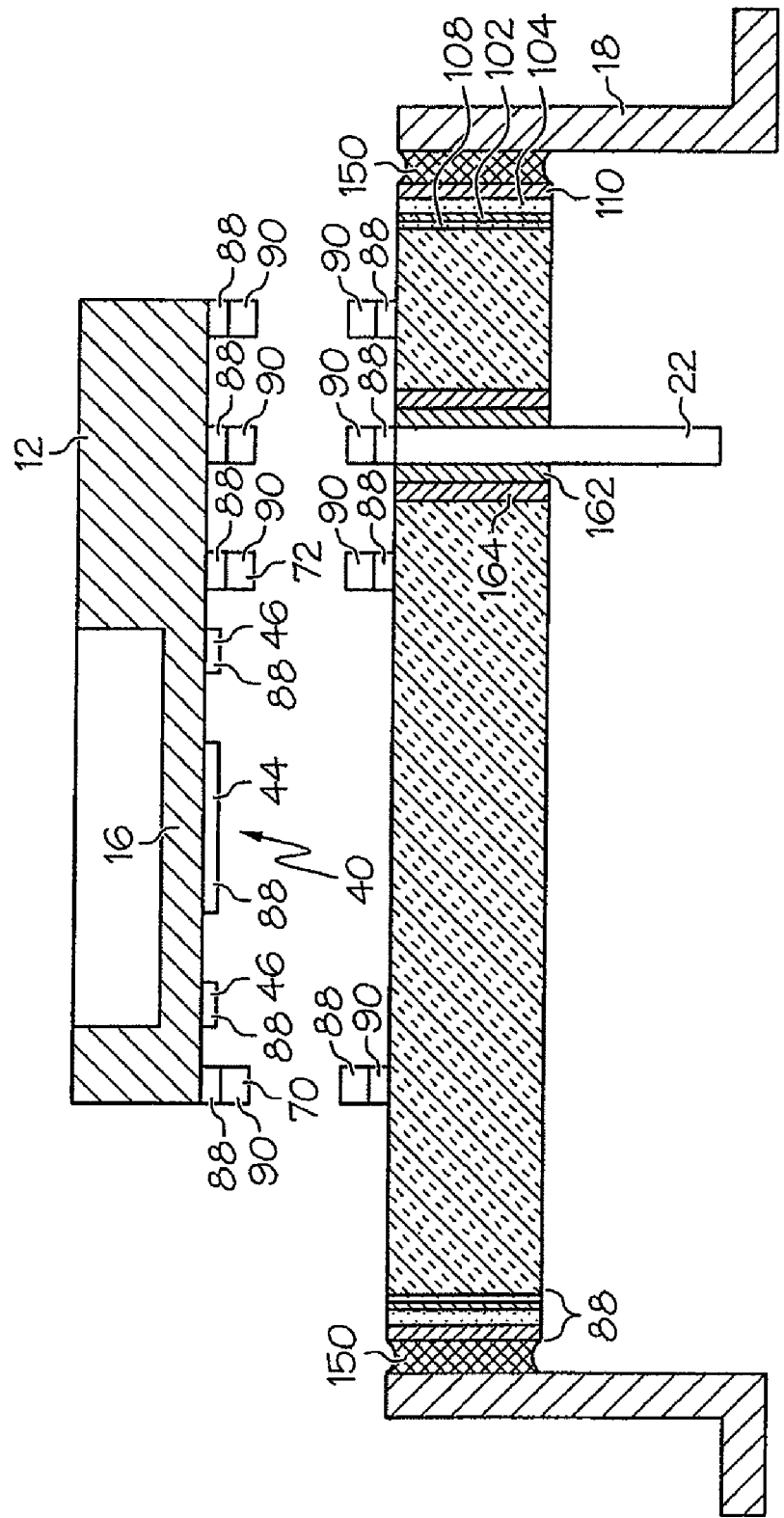
FIG. 35 illustrates the substrate and ring of FIG. 34 coupled together, with metallization and bonding layers deposited thereon and a sensor die positioned thereabove.

As briefly described above, the substrate 14 is positioned inside and coupled to the ring 18, and that attachment process is now described in greater detail and shown in FIGS. 33-35. However, although the attachment of the substrate 14 and ring 18 are now described (after the attachment of the sensor die 12 and substrate 14 was described above), during actual assembly the order of operations may be reversed. More particularly, during assembly the substrate 14 may first be attached to the ring 18, and the sensor die 12 then attached to the substrate 14/ring 18 assembly. This order of operations ensures that the more sensitive electrical components of the sensor die 12 are not exposed to high temperatures when the substrate 14 is brazed to the ring 18.

The substrate 14 may be made of a material which can withstand relatively high temperatures, resists oxidation, and has a thermal coefficient of expansion that matches that of the sensor die 12 relatively well. Thus the substrate 14 can be made of a variety of ceramic materials, such as monolithic silicon nitride, aluminum oxide or aluminum nitride (hot-pressed and sintered (i.e. polycrystalline aluminum nitride)).

The ring 18 may be made of a material which can withstand relatively high temperatures, resists oxidation, and has a thermal coefficient of expansion that matches that of the substrate 14 relatively well. Thus the ring 18 can be made of a variety of metal alloys such as THERMO-SPAN® metal alloy, sold by CRS Holdings, Inc. of Wilmington, Del., or other metals with similar environmental resistance and physical properties.

When joining a ceramic material, such as the substrate 14, to a metallic material, such as the ring 18, the joining technique should be carefully selected, especially when the joint will be exposed to elevated temperatures and a wide temperature range. Brazing may be utilized to join the ceramic substrate 14 to the metal ring 18, in which case the substrate 14 will first need to be treated with a material, such as a thin film metallization, to aid in the brazing process.

The metallization layer 88 described above and shown in FIGS. 18-20 may also be used in brazing the substrate 12 to the ring 18. For example, FIG. 33 illustrates the post-annealing metallization layer 88, including sublayers 102, 104, 108, 110 located on the end surface of the substrate 14. As shown in FIG. 33, the metallization layer 88 of the substrate 14 is located on its circumferential outer surface 146. In this case, only the substrate 14 has the metallization layer 88 deposited thereon, and the ring 18 does not require any metallization due to its inherent metallic structure. However, in order to improve the brazing process and/or improve corrosion resistance, a thin layer of nickel (i.e. 10 microns) may be deposited on the brazing (inner) surface of ring 18.

In order to deposit the metallization 88 (i.e., the first 102, second 104 and third 106 layers of FIG. 18) onto the circumferential outer surface 146, a cylindrical magnetron plasma sputter deposition system may be utilized. In such a sputter system, the substrate 14 is placed on a rotating fixture inside the sputter chamber of the cylindrical magnetron. The cylindrical magnetron progressively deposits the first layer 102, the second layer 104 and the third layer 108 onto the outer surface 146 of the substrate in a direction normal to the outer surface 146. In this manner the cylindrical magnetron provides a sputtering flux that is normal to the curved surface (i.e. the direction of flow of the metal atoms during deposition is normal to the outer surface 146 in a radially inward direction). It should be noted that cylindrical sputtering may be easier and more effective, but special fixtures and tools may be used in a conventional deposition system to obtain the same results and thus systems other than cylindrical sputtering may be used.

The first 102, second 104 and third 106 layers may be made of the materials described above and deposited in the manner described above in the context of FIGS. 18-20. However, in one embodiment the pre-annealing metallization layer 88 on the outer surface 146 includes a tantalum layer 102 having a thickness of about 500 Angstroms; a silicon-rich tantalum silicide layer 104 having a thickness of about 5000 Angstroms; and a platinum layer 106 having a thickness of about 3000 Angstroms. After deposition, the layers 102, 104, 106 are annealed to provide the layers 108, 102, 104, 110 shown in FIGS. 19 and 33. However, if desired the annealing step may be omitted as the subsequent brazing process described below may drive the same reactions.

FIG. 33 illustrates the substrate 14 spaced away from the ring 18, and FIG. 34 illustrates the substrate 14 loosely fit into the ring 18. In order to carry out the braze process, a ductile braze material, braze slurry, braze alloy or braze paste 150 is deposited near or around the outer circumference of the substrate 14 and in intimate contact with the ring 18 and the metallization layer 88. Thus the braze material 150 is applied to the outer diameter of the substrate 14 and/or the inner diameter of the ring 18. The particular type of braze material, braze slurry, braze alloy or braze paste 150 depends upon the type of materials of the substrate 14 and ring 18 but can be any high temperature braze material 150 that can withstand high temperatures and corrosive environments, such as a gold/nickel braze material.

The braze material 150 may be deposited at room temperature and then exposed to an elevated temperature (e.g. about 980° C. for a gold/nickel braze) suitable to melt the braze material 150. The melted braze material 150 is drawn into the gap between the substrate 14 and the ring 18 by capillary action (shown in FIG. 35). If desired, the outer edges of the substrate 14 may be chamfered (not shown) to provide an exposed area of the metallization 88 and to "funnel" the braze material 150 into the gap between the substrate 14 and the ring 18. The temperature is then reduced such that the braze material 150 cools and forms a strong bond in the well-known manner of standard brazing. FIG. 35 illustrates the sensor die 12 positioned above the completed brazed ring 18/substrate 12 assembly for subsequent joining in the process described above and shown in FIGS. 22-31.

The substrate 14 and the ring 18 may be sized to form a mechanically robust joint. In particular, upon heating (i.e. during the brazing process), the ring 18 may expand to relatively loosely receive the substrate 14 therein (shown in FIGS. 33 and 34). Because the ring 18 is metal, the ring 18 has a relatively large coefficient of thermal expansion relative to the substrate 14. Upon cooling, the metal ring 18 contracts around the substrate 14, thereby placing the substrate 14 in a state of radial compression which provides a more robust structure.

Pin Mounting

As described above, the sensor die 12 includes a plurality of contacts (three contacts 50, 52 and 60 in the embodiment shown in FIG. 3). Pins 22 (only one of which is shown in FIG. 1) are electrically coupled to each of the contacts 50, 52 or 60 to provide an output of the sensor die 12 to an external controller, processor, amplifier or the like. The pins 22 can be made of any of a variety of materials, such as an oxidation resistant metal which forms a tenacious oxide film and resists exfoliation due to expansion of the oxide. For example the pins 22 can be made of nickel, stainless steel, HASTELLOY® alloys sold by Haynes International, Inc. of Kokomo, Ind., or KOVAR® alloy sold by CRS Holdings, Inc. of Wilmington, Del., depending upon the desired properties such as electrical conductivity, thermal expansion coefficient, or the like. The pins 22 may also take the form of a tube or other metallic component.

The pins 22 must be properly located in the substrate 14 so that the pins 22 align with the associated contacts 50, 52, 60 on the sensor die 12. The mounting process described below may be utilized to precisely mount the pins 22 into the substrate 14, and in a manner such that the pins 22 and associated attachment structures can withstand harsh environments.

Figure 36:
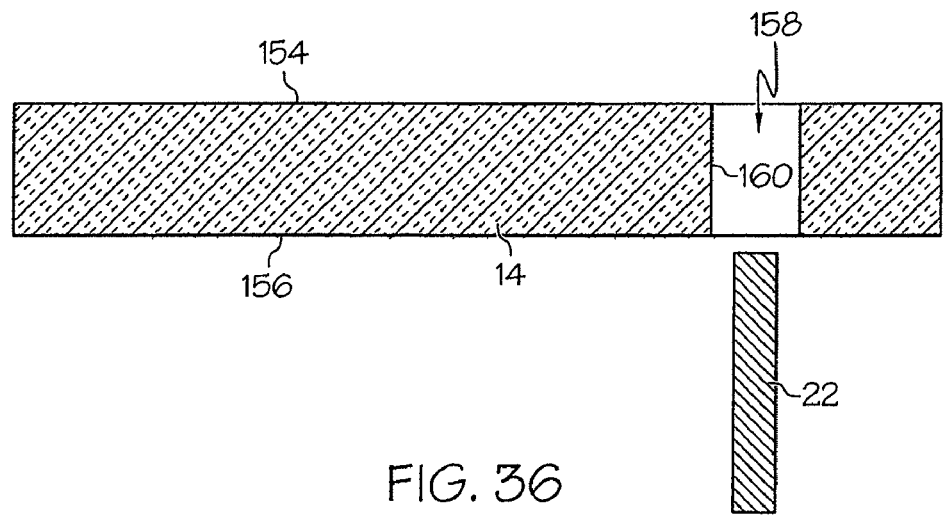
FIG. 36 illustrates a pin and substrate exploded away from each other.

FIGS. 36-38 below, which describe a process for mounting the pins 22, illustrate only a single pin 22, but it should be understood that any desired number of pins 22 can be mounted in this manner. FIG. 36 illustrates the substrate 14 having a pair of opposed surfaces 154, 156, with an opening 158 extending from the first 154 to the second 156 surface and defining an attachment surface 160. The substrate 14 can have a variety of thicknesses, such as between about 0.60 and about 0.006 inches, and has a thickness of about 0.060 inches in one embodiment.

Figure 37A:
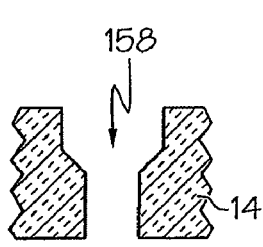
FIGS. 37(a)-37(g) illustrate a series of steps for attaching the pin and substrate of FIG. 36 together and coupling the resultant assembly to the sensor die.
Figure 37B:
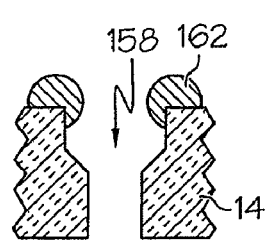

As shown in FIG. 37(a)-(e), in one embodiment, the opening 158 takes the form of a stepped bore opening (FIG. 37(a)). The stepped bore opening 158 can be formed by ultrasonic drilling or by other acceptable methods. In order to braze the pin 22 to the substrate 14, an active metal braze 162 is deposited on the substrate 14 adjacent to or into the opening 158 (FIG. 37(b)). The active braze 162 is then reflowed, in a vacuum, such that the active braze 162 flows downwardly in its liquid state, coats the side walls 160 of the opening 158 and fills the smaller diameter. As the active braze 162 flows downwardly, it chemically reacts with the substrate 14 to allow subsequent wetting of the substrate 14. Thus the active metal braze 162 coats the side walls 160, preparing the substrate for subsequent brazing with conventional braze alloys that are the same as or similar to the braze alloys 150 described above.

Figure 37C:
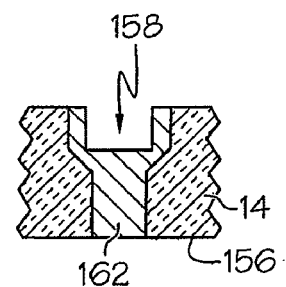
Figure 37D:
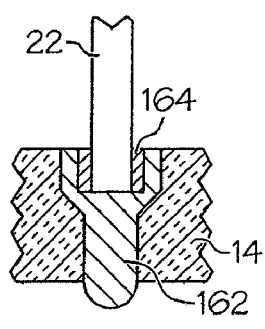
Figure 37E:
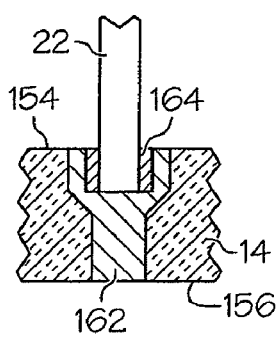
Figure 37F:
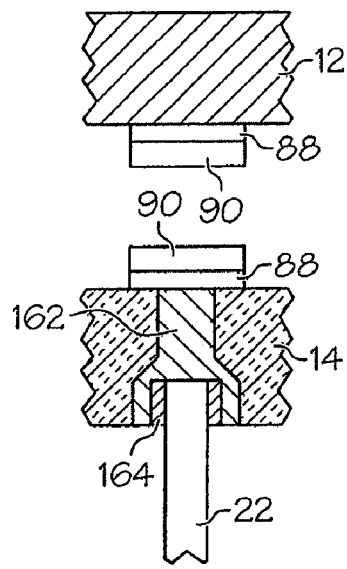
Figure 37G:
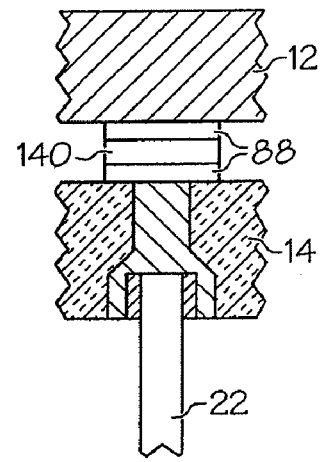
Figure 38A:
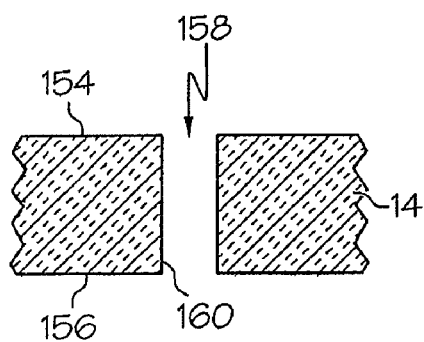
FIGS. 38(a)-38(g) illustrate a series of steps for coupling the pin and substrate of FIG. 36 together.
Figure 38B:
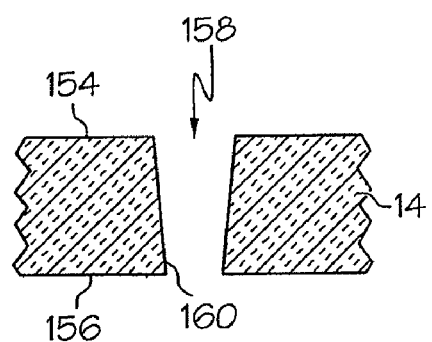
Figure 38C:
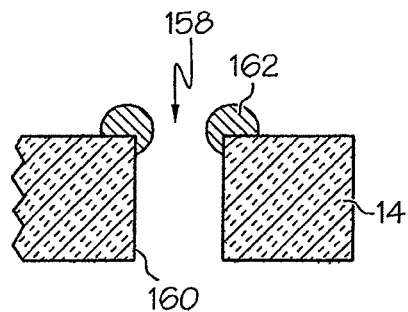
Figure 38D:
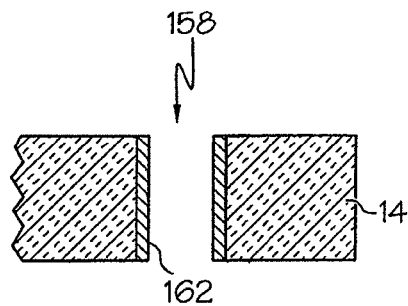
Figure 38E:
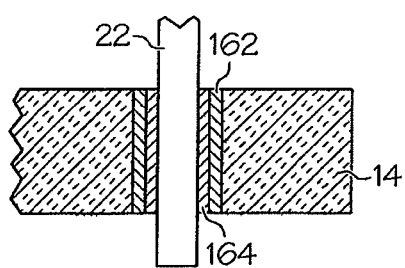
Figure 38F:
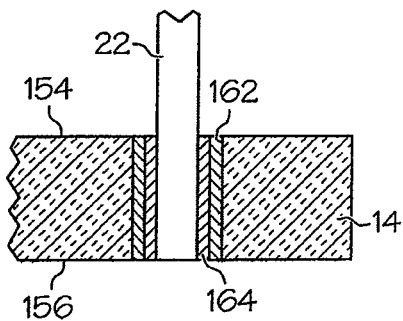
Figure 38G:
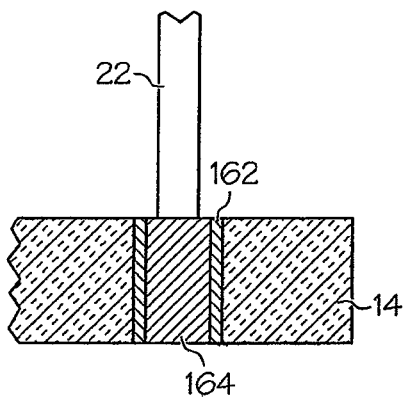

As shown in FIG. 37(c) the active metal braze 162 fills and plugs the smaller diameter portion of the opening 158. The plug formed by the active metal braze material 162 provides a continuous metal on side 156 of the substrate 14 such that after grinding, lapping or other finishing methods a flat and uninterrupted metal contact, that is coplanar with the substrate 14, is provided. Accordingly, the smaller diameter of the stepped opening 158 and the materials and quantity of active metal braze 162 should be selected such that the active metal braze 162 can plug the smaller diameter portion of the opening 158.

Next, as shown in FIG. 37(*d*), the pin 22 is inserted into the larger diameter portion of the opening 158 until the pin 22 bottoms out on the active braze material 162. A second braze material 164 is then introduced into the remaining volume of the larger diameter portion of the opening 158 such that the second braze material 164 surrounds the pin 22 and secures/ brazes the pin 22 to the active metal braze 162/substrate 14. As shown in FIG. 37(*e*), the opposed surface of the substrate 14 is then planarized, such as by grinding and polishing, to sufficient flatness for the subsequent bonding step of the sensor die 12. In one embodiment, the substrate assembly 14 and associated metallizations are planarized to within 1 micron, or more particularly, 0.5 microns. The planarization ensures that the metallization film 88 and bonding film 90 can be located thereon, and the substrate 14 can be attached to the sensor die 12. Thus, the multiple braze, or "step-braze" process shown in FIGS. 37(*a*)-37(*e*) can be utilized to join the pin 22 and substrate 14 wherein the active braze 162 acts as a premetallization and the second braze material 164 creates the joint.

The brazing materials 162, 164 can be any of a variety of braze metals which can be utilized to braze the pin 22 to the substrate 14 of interest. In one embodiment, the active metal braze 162 may be a titanium activated braze, such as titanium/ copper, titanium/nickel, titanium/gold, titanium/nickel/gold, and the like. The second braze material 164 can be any standard braze, or high temperature braze material, such as gold/ nickel, or copper/nickel with a eutectic ratio of copper/nickel, which can withstand relatively high temperatures (i.e., up to 600-700° C.) and provide corrosion resistance.

As shown in FIG. 37(*f*), after the pin 22 is brazed in place and the surface is planarized the metallization film 88 and bonding material 90 are deposited on the substrate 14 such that the deposited metallization film 88/bonding materials 90 are generally aligned with, or electrically coupled to, the active braze material 162. Thus the deposited metallization film 88/bonding materials 90 are electrically coupled to the pin 22 through the braze materials 162, 164. The bonding material 90 of the substrate is then bonded to the sensor die 12 (FIG. 37(*g*)), as described above and shown in FIGS. 22-31, to complete electrical contact between the conductor pin(s) 22 and the contacts 50, 52, 60. Thus the metallization film 88/bonding materials 90 not only mechanically couple the sensor die 12 and substrate 14, but also electrically couple the sensor die 12 and pin 22.

FIGS. 38(*a*)-(*f*) illustrates an alternative method for brazing the pin 22 to the substrate 14. More particularly, in this embodiment the substrate includes a non-stepped bore opening, such as a straight-walled opening 158 (FIG. 38(*a*)) or a slightly tapered opening 158 (FIG. 38(*b*)). The opening 158 of FIG. 38(*a*) or (*b*) may be drilled ultrasonically, by a waterjet, laser, electronic discharge ablation, or otherwise, and may have a diameter accommodating (i.e. slightly larger than) the diameter of the pin 22. For example, the pin 22/opening 158 may have an opening of around 0.020 inches, or around 0.030 inches, or larger. The use of a waterjet may be less expensive, but may result in an opening having a slight taper as shown in FIG. 38(*b*). However, so long as the taper is slight (i.e. less than a few thousands of an inch throughout the thickness of the substrate 12 having a thickness of about 0.060 inches, or up to 0.125 inches, or greater) the taper has no adverse effects.

The opening 158 of FIGS. 38(*a*) and 38(*b*) can each be formed by a single step, in contrast with the stepped opening 158 of FIG. 37(*a*) which must be formed in two steps, and which requires greater precision. In addition, forming a stepped bore requires the use of ultrasonic drilling or the like, which is more expensive than waterjet drilling which can be used in the opening(s) of FIG. 38.

Once the opening 158 of either FIG. 38(*a*) or 38(*b*) is formed, the active metal braze 162 is applied and reflowed in largely the same manner as described above, as shown in FIGS. 38(*c*) and 38(*d*). If the opening 158 has a taper (FIG. 38(*b*)), the active metal braze 162 can be applied to the larger diameter end of the opening 158 (i.e., the upper end in FIG. 38(*b*)) such that as the active braze 162 flows downwardly, it thins out to ensure even coating on the side walls 160.

Once the active braze 162 is deposited (FIG. 38(*c*)) and reflowed (FIG. 38(*d*)), the pin 22 is then inserted into the opening 158 and the second braze 164 applied (FIG. 38(*e*)). As shown in FIG. 38(*e*), if desired the pin 22 may extend completely through the substrate 14 to ensure it is inserted to a sufficient depth. Next, one or the other side 154, 156 of the substrate can be planarized (i.e., by grinding and polishing (FIG. 38(*f*)). The metallization film 88 and bonding materials 90 may then be deposited and the bonding process can be carried out as described above.

As a third alternative, as shown in FIG. 38(*g*) a solid metal plug, formed of the braze materials 162/164 may be formed in the hole 158. In this case the pin 22 may be butt-welded to the plug or attached by various other means. This simple metal filling method may also be utilized where wirebonds or other electrical connections, instead of the pin 22, are desired.

As a fourth alternative, the hole 158 may be filled with a conductive cofired metallization in a manner well known in the industry, which results in an appearance similar to FIG. 38(*g*). The pin 22 may be attached to the cofired metallization with a braze or other well known methods.

Assembly

In order to assemble the structure shown in FIGS. 1 and 6, in one embodiment the substrate 14 is provided and the openings 158 are formed in the substrate. The pre-metallization layer 162 (described immediately above and shown in FIGS. 37 and 38) is then deposited on or adjacent to the openings 158, and the metallization 88 and bonding layers 90 are deposited on circumferential surfaces of the substrate 14 (described in the section entitled "Substrate Attachment" and shown in FIG. 33). The substrate 14 is then brazed to the ring 18 (described in the section entitled "Substrate Attachment" and shown in FIGS. 34 and 35). The pins 22 are brazed to the substrate 14 by braze material 158, as shown in FIGS. 37 and 38 either before, after or, at the same time that the substrate 14 is brazed to the ring 18.

The sensor die 12 (formed in the section entitled "Sensor Die Manufacturing" and shown in FIG. 17) is then attached to the substrate 14, as in the section entitled "Sensor Die Attachment" and shown in FIG. 35. After the sensor die 12 and substrate 14 are coupled, electrical connections are then completed to the pins 22 and the resultant assembly is then packaged in the base 20 and ring 18 (FIGS. 1 and 6).

In the embodiment of FIG. 1, the base 20 includes a backing portion 170 which is located below a substantial portion of the substrate 14 to provide support thereto, and ensures that the substrate 14 can withstand relatively high pressures. If desired, the space 171 between the backing portion 170 and the pin 22 may be filled with a high temperature potting compound. If further desired, the backing portion 170 may be entirely replaced with a high temperature potting compound that substantially fills the space in the metal ring 18 and abuts the lower surface 156 of the substrate 14. In contrast, in the embodiment of FIG. 6, the base 20 does not include the backing support portion since the substrate 14 is significantly smaller, and therefore presents less surface area. In addition, in the embodiment of FIG. 6 the metal ring 18 includes a relatively wide foot 172 to allow the ring 18 (and substrate 14) to be securely coupled to the base 20.

In either case, the portions of the ring 18 (radially) surrounding the substrate 14 may have a relatively small thickness, such that the ring 18 has some compliance and can flex during temperature fluctuations to accommodate any mismatch of the thermal coefficient of expansion between the substrate 14 and ring 18. The flexion of the ring 18 may also provide additional compliance to tolerate thermal expansion and contraction of the base 20. The thickness of the portion of the ring 18 receiving the substrate 14 is determined by the residual stress on the substrate 14 and the amount of stress isolation required between the substrate 14 and the base 20, but in one embodiment is about 0.010 inches thick.

The ring 18 should have a relatively low coefficient of thermal expansion to match, as closely as possible, the coefficient of thermal expansion of the substrate 14. For example, the ring 18, and other materials of the packaging, having a coefficient of thermal expansion in a given direction that is within about 50%, or about 100%, or about 150% of a coefficient of thermal expansion of the substrate 14 and/or sensor die 12 in the same direction. The materials and shape of the ring 18 are determined based upon the following factors, including but not limited to: relative thermal environment during operation, start-up and cool-down; thermal coefficients of expansion of the base 20 and substrate 14; vibration limits; and the expected maximum and operational pressures and pressure fluctuations. The ring 18 isolates the sensor die 12 and substrate 14 from the base 20 in a cantilever manner such that any stresses applied to or caused by the base 20 are generally not transmitted to the substrate 14.

In one embodiment, the base 20 and ring 18 may each be made of THERMO-SPAN® metal alloy, sold by CRS Holdings, Inc. of Wilmington, Del., which is a controlled expansion alloy which also shows good corrosion resistance. However, if desired the base 20 and/or ring 18 may be made of stainless steel, INVAR® alloy, a trademark of Imphy S.A. of Paris, France, KOVAR® alloy, NI-SPAN-C® alloy, a trademark of Huntington Alloys Corporation of Huntington, W. Va., or other material with relatively low coefficients of thermal expansion and corrosion resistance suitable to the environment in which this system will operate. The ring 18 is welded to the base 20 (i.e., at weldments 176 shown in FIGS. 1 and 6). Care should be taken during the welding to be sure not to compromise the corrosion resistance of the packaging. In addition, rather than welding the components of the base 20 may be coupled by threaded or bolted attachments, and the ring 18 can be coupled to base 20 by a threaded or bolted attachment.

External Connection

In order to communicate the electrical signals to an external controller, processor, amplifier or the like, a wire 24 (one of which is shown in FIGS. 1 and 6) is coupled to each of the pins 22 at a coupling location. Each wire 24 can be made of a variety of materials, such as NiCr or platinum with an electrically insulating sheathing. A tip of each wire 24 may be wrapped around the lower end of the associated pin 22, and coupled thereto by a braze attachment. The opposite end of the wire 24 passes through a thermoconductive and electrically insulated material 180, such as a chopped filler material (i.e., NEXTEL® thermal barrier made by 3M of St. Paul, Minn. or other refractory material) allowing flexibility in the wire assembly 190. In another embodiment, the thermoconductive and electrically insulating material 180 is a high temperature ceramic or glass potting compound.

A metal (such as nickel or stainless steel) conduit 182 in FIG. 1 is located around the electrically and/or thermally insulating material 180 to provide EMI shielding to the wire(s) 24 located therein. The metal conduit 182 is coupled to a lower port 184 of the base 20 by a braze material 186. Each wire 24 may pass through a single conduit 182, or alternately, each wire 24 may pass through its own dedicated conduit 182. Each wire 24 may be coated with an electrically insulating material and held in place by the insulating material 180. Each conduit 182 may take the form of a rigid conduit, or could take the form of a flexible material such as braided metal wires or the like. When the conduit 182 is a flexible material the braze material 186 may not be utilized, and some other acceptable attachment means would instead be used.

Figure 39:
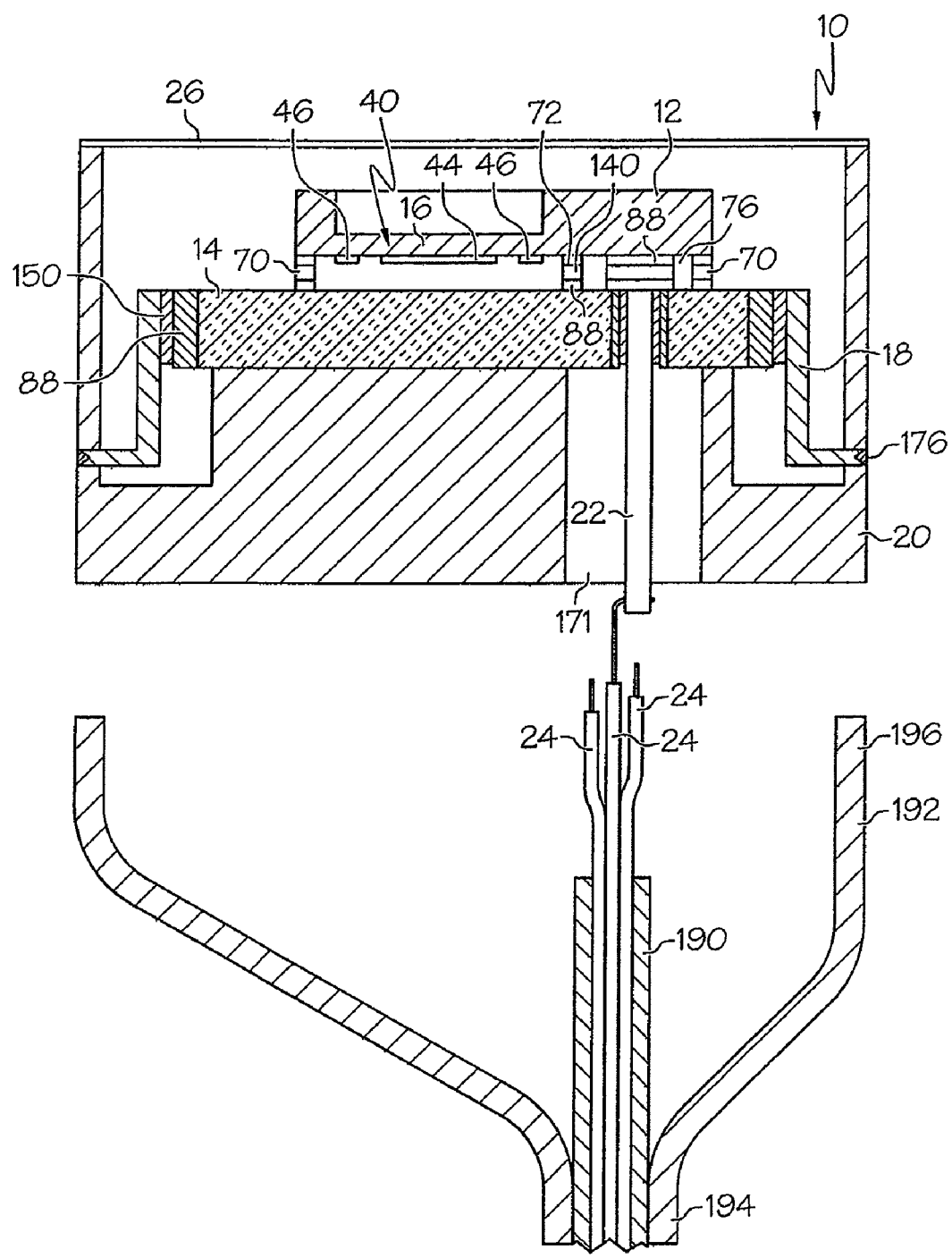
FIG. 39 illustrates the pressure sensor of FIG. 1, with an alternate external connector, and the sheath in its retracted position.
Figure 40:
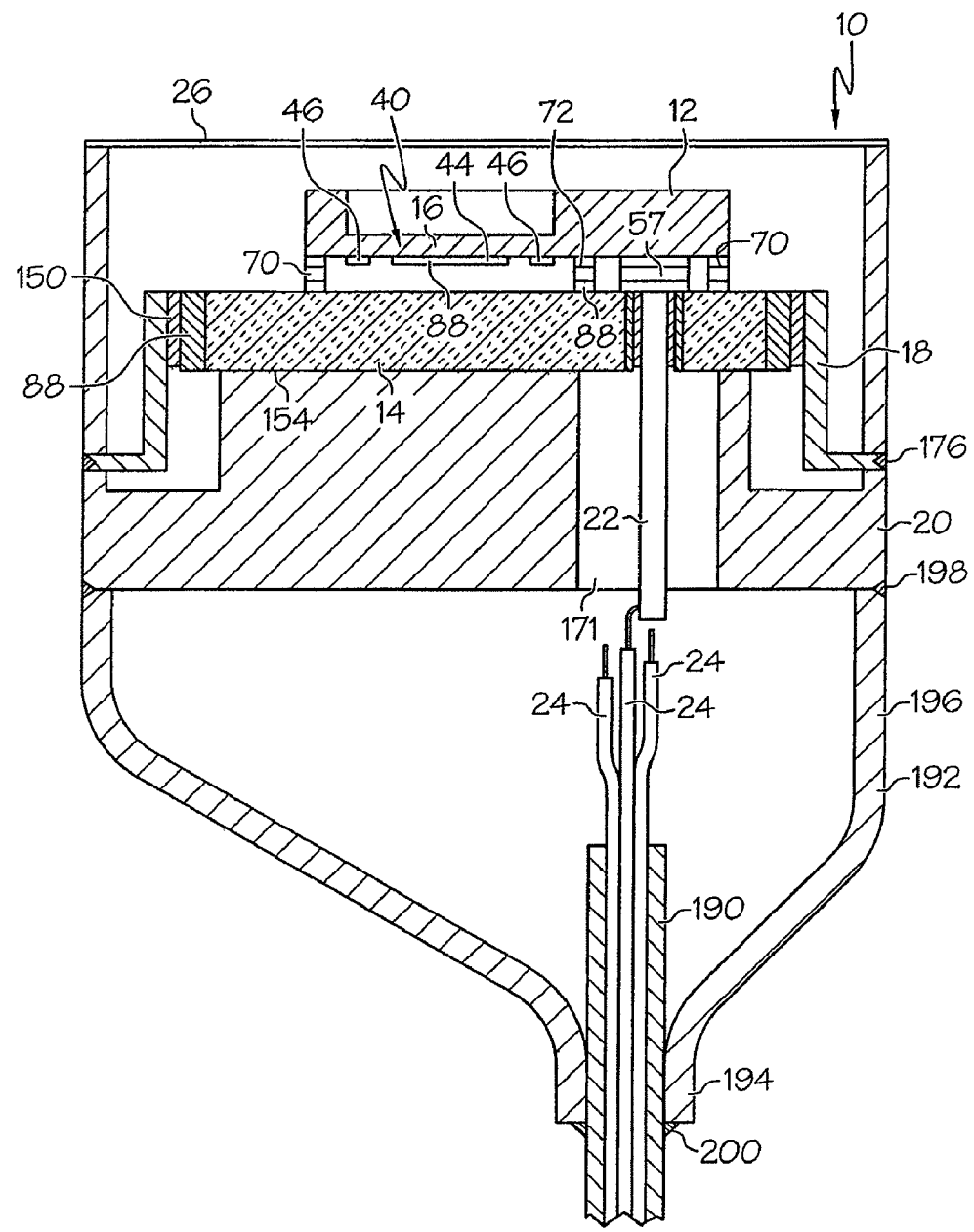
FIG. 40 illustrates the pressure sensor of FIG. 39, with the sheath in its closed position.

The assembly shown in FIGS. 39 and 40 illustrates an assembly for electrically connecting the pins 22 to the wires 24. As shown in FIG. 39, a number of wires 24 (i.e., three in the illustrated embodiment) are contained within a metal conduit 190. Each wire 24 is individually covered in a thermally and electrically insulating sheathing, with the end of each wire 24 being exposed for electrical connection to the associated pin 22. An outer sheath 192 is slidably located on the conduit 190 and flares outwardly from a lower end 194 which is swaged about the conduit 190, to a relative wide mouth 196 which is shaped to mate with the underside of the base 20.

In order to complete the electrical connections, the exposed portion of each wire 24 is brazed to the associated pin 22 (only one of which is shown in FIG. 39). The sheath 192 is then slid upwardly along the conduit 20 until it mates with the base 20, and is then secured to the base, such as by welding 198 (FIG. 40). The sheath 192 is secured, at its opposite end, to the conduit 190 by a braze 200 or the like. The space inside the sheath 192 may be purged with an inert gas, just before sealing, to minimize oxidation.

Thus, the assembly method of FIGS. 39 and 40 provides hermetically sealed electrical connection between the pins 22 and wires 24 with high temperature capability. The assembly also provides a relatively compact packing which allows considerable size reduction in the overall size of the sensor package. The opposite end of the wires 24/conduit 190 may have a second sheath 192 mounted thereon (not shown) to provide protection to the output electrical connections thereof (i.e. connections to a processor or the like).

Figure 41:
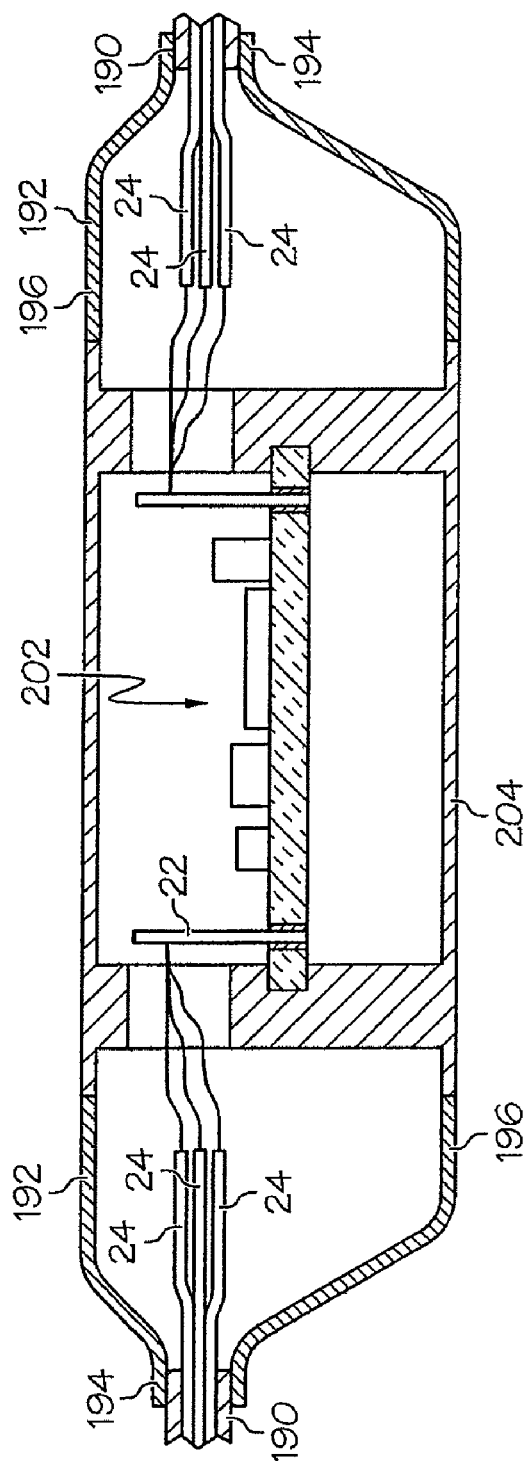
FIG. 41 illustrates the connector of FIGS. 39 and 40 utilized with an electronics module.

If desired, the attachment method shown in FIGS. 39 and 40 can be applied to an electronics module as well. For example, as shown in FIG. 41, an electronics assembly 202 can be encapsulated in a metal shell 204, with a sheath 196 located at either end thereof. This arrangement permits the electrical connection of two assemblies in a hermetically enclosed metal sheath assembly.

Field of Use

As described above, the sensor 10 and packaging may be used to form a microphone for detecting high frequency pressure fluctuations. However, it should be understood that the packaging structure disclosed herein can be used with or as part of any high temperature sensor (dynamic or otherwise) including, but not limited to, acceleration, temperature, radiation or chemical sensors. For example, the sensor 10 and packaging may be used to form a chemical detector to detect an analyte present in an environment using either or both electro-chemical sensing or vibration sensing. Such a vibration sensor can, in turn, be used as a component which measures a change in resonance in a variety of manners to detect the presence of ice, contaminants, chemicals, deposition of materials, microorganisms, density of fluids, etc.

The transducer and packaging may also be used with or as part of a variety of other types of sensors, such as sensors utilizing piezoresistive or capacitive sensing elements, temperature sensing elements, or the like. The structure shown herein may also be used as a passive structure which can be used, for example, to measure mechanical inputs (i.e., acceleration or vibration) or for use in energy harvesting (i.e., converting vibrations to electrical charge to charge a battery or the like). The thermal protection and isolations features of the actuator packaging described herein lends itself to use in a wide variety of applications and environments, and can be used with a variety of transducers.

Piezoresistive Transducer

First Embodiment

Figure 42:
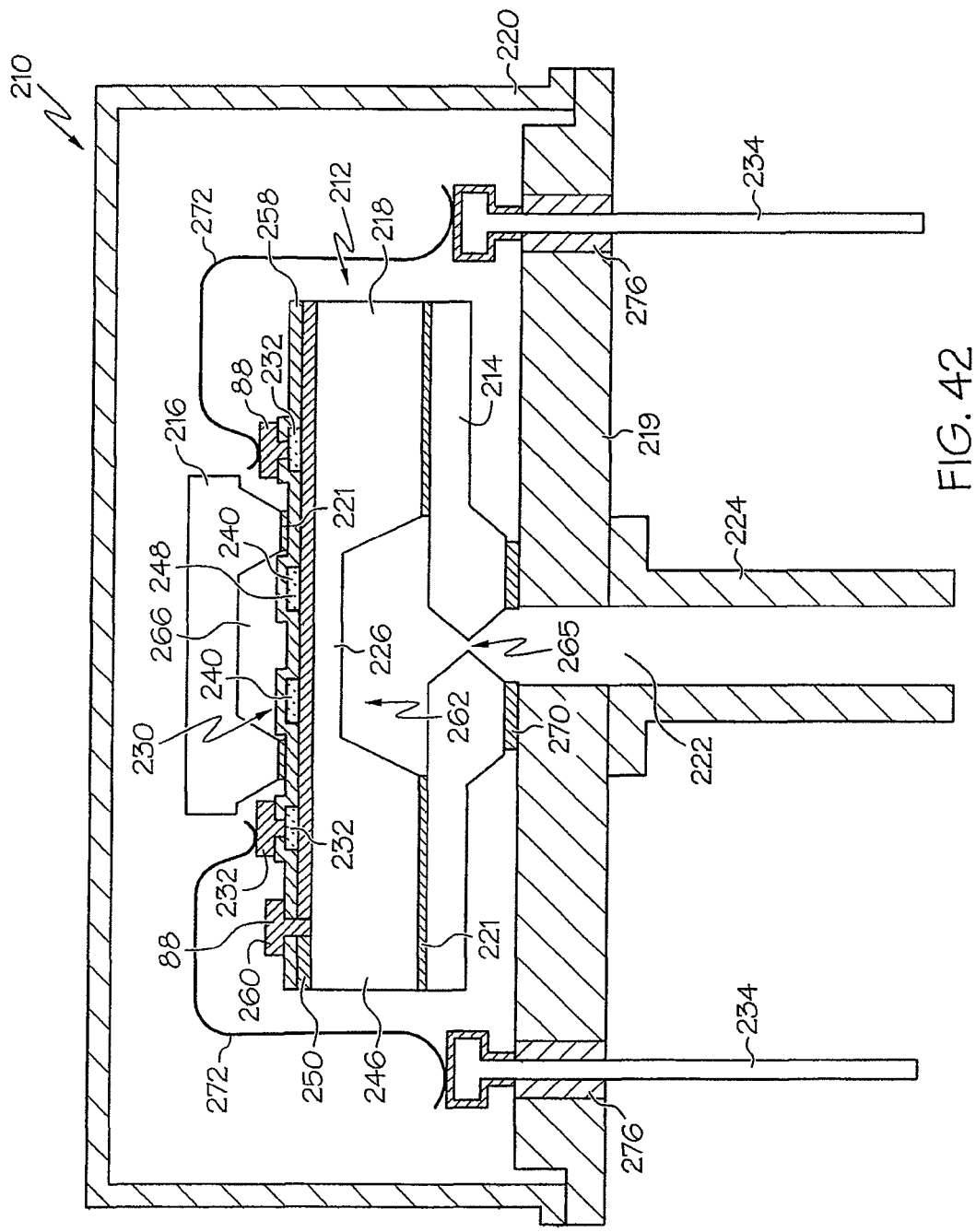
FIG. 42 is a side cross section of a first embodiment of a piezoresistive pressure sensor of the present invention.

The present invention may also take the form of various piezoresistive transducers, embodiments of which are described in greater detail below. As best shown in FIG. 42, in a first embodiment the piezoresistive transducer of the present invention is in the form of a pressure sensor, generally designated 210. The sensor 210 includes a wafer stack or sensor die 212 (also termed a substrate herein) which includes a base wafer 214, a cap or capping wafer 216 and a device wafer 218 positioned between the base wafer 214 and capping wafer 216. The wafer stack 212 is coupled to a pedestal, header plate, base or header 219, and a frame, cover, package base, pressure case, fitting, or 220 is coupled to the header plate 219 such that the frame 220 and header plate 219 generally encapsulate the wafer stack 212 therein. The lower portion of the frame 220 is often termed a pressure case, and the upper portion of the frame 220 is often termed a vacuum case.

The header plate 219 includes a pressure port 222 formed therein with a conduit 224 coupled to the pressure port 222. The pressure port 222 and conduit 224 allows the fluid of interest to exert pressure on a diaphragm 226 (on a first surface of the wafer stack 212) of the device wafer 218. The capping wafer 216 seals the opposite side of the diaphragm 226 (on a second, opposite surface of the wafer stack 212) to provide a reference pressure (or a vacuum) on the opposite surface of the diaphragm 226. A differential pressure across the diaphragm 226 causes the diaphragm 226 to deflect, which deflection is detected by a sensing component 230 located thereon. The output of the sensing component 230 is communicated to an external processor, controller, amplifier or the like via a set of output contacts 232 which are electrically coupled to a set of pins 234. The pins 234 extend through the header plate 219 to thereby communicate the output signals of the sensing component 230 to the processor, controller, amplifier, or the like.

As shown in FIG. 43, the sensing component 230 may include a set of resistors 240 connected together in a Wheatstone bridge configuration. The resistors 240 are coupled to each other, and to the set of output contacts 232, by a set of leads 242. The resistors 240 are positioned on the diaphragm 226 such that two resistors 240 primarily experience mechanical tension when the diaphragm 226 is deflected in a given direction, and the other two resistors 240 primarily experience mechanical compression when the diaphragm 226 is deflected in the given direction. Thus, the two pairs of resistors exhibit resistance changes opposite to each other in response to a deflection of the diaphragm 226. The resistance change is then amplified in the well-known manner of a Wheatstone bridge. The two pairs of resistors may exhibit opposite resistance changes due to their positioning on the diaphragm 226, or due to their orientation of directional dependent resistance characteristics thereof.

Figure 44:
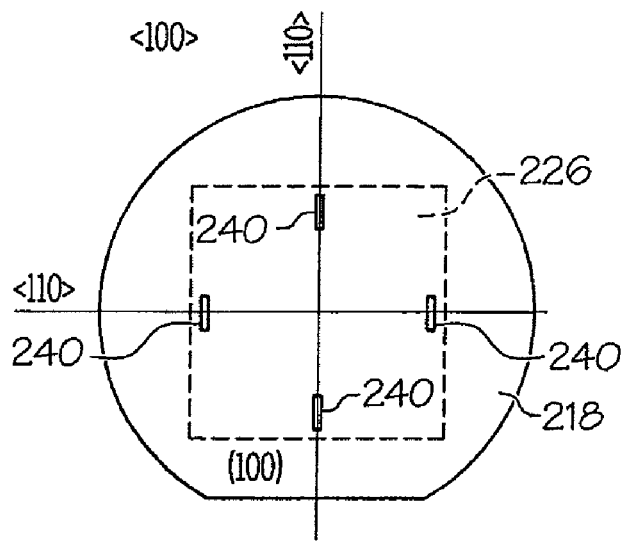
FIG. 44 is a schematic top view of a layout of the resistors of the sensor die of FIG. 43.
Figure 45:
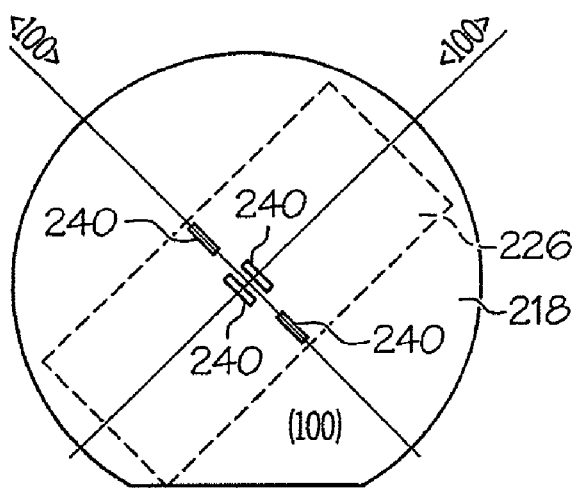
FIG. 45 is a schematic representation of another layout of the resistors of the sensor die of FIG. 43.

The resistors 240 may be made of doped silicon, such as p-doped or n-doped single crystal silicon. When the resistors 240 are made of p-doped silicon, the configuration shown in FIGS. 43 and 44 may be utilized. When the resistors 240 are formed of n-doped silicon, the configuration shown in FIG. 45 may be utilized, wherein the resistors 240 are rotated about 45 degrees from their positions in FIG. 44 due to differing directional sensitivity of n-doped silicon as compared to p-doped silicon. Because the resistors 240 of FIG. 45 are rotated 45 degrees, the resistors 240 of FIG. 45 may be more difficult to form when using photolithography. In addition, p-type resistors are typically less temperature dependent than n-type resistors and therefore p-type resistors may be desired to be utilized. If desired, the output contacts 232 and leads 242, or parts thereof, may be formed of the same material as the resistors 240 (i.e., doped silicon).

A temperature sensor 231, such as a temperature-sensitive resistor, may be located on the device wafer 218, with a pair of output contacts 232 coupled via leads to opposite sides of the temperature sensor 231. The temperature sensor 231 allows the controller, processor amplifier to use temperature-compensating techniques when analyzing the output of the sensing component 230.

One process for forming the wafer stack 212 of FIG. 42 is shown in FIGS. 46-56 and described below, although it should be understood that different steps may be used in the process, or an entirely different process may be used without departing from the scope of the invention. Thus, the manufacturing steps illustrated here are only one manner in which the wafer stack 212 may be manufactured, and the order and details of each step described herein may vary, or other steps may be used or substituted with other steps that are well known in the art. A batch manufacturing process may be utilized, but for clarity of illustration, FIGS. 46-56 illustrate only a single wafer stack 212 being formed.

It should also be noted that although, in general, the shading of the various layers of the drawings is maintained in a generally consistent manner throughout the drawings of FIGS. 46-56 and elsewhere, due to the large number of components and materials the shading for a material or layer may differ between the various figures. In addition, FIGS. 46-56 represent a schematic cross-section of a wafer during manufacturing, and the location of certain components may not necessarily correspond to a true cross section.

Figure 46:
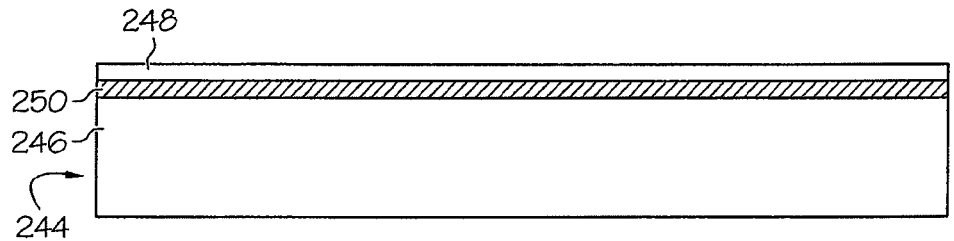
FIGS. 46-56 are a series of side cross sections illustrating a process for forming the sensor die of FIG. 42.
Figure 47:
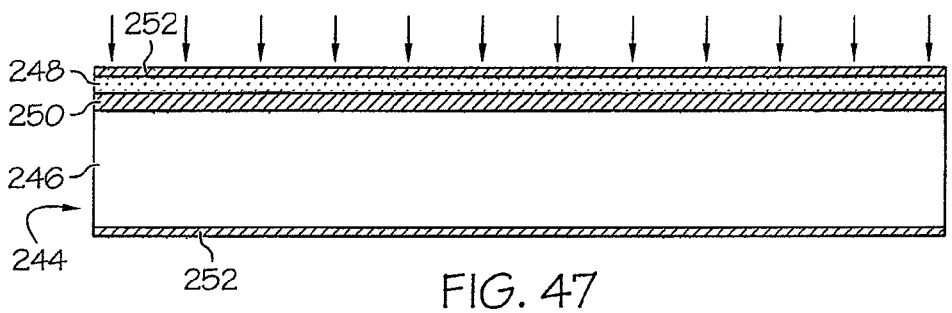

As shown in FIG. 46, the process begins with a semiconductor-on-insulator wafer 244 such as a double sided polished three inch or four inch diameter (or larger) semiconductor-on-insulator or silicon-on-insulator wafer. The SOI wafer 244 includes a base or bulk layer 246 and a device layer 248, with an electrically insulating layer 250 positioned therebetween. In one embodiment, the device layer 248 is single crystal silicon having a thickness of about 0.34 microns, although the device layer 248 may have a variety of thicknesses, such as between about 0.05 microns and about 1 microns, or less than about 1 micron, or less than about 1.5 microns, or, or less than about 0.5 microns, or greater than about 0.05 microns. Because the thickness of the device layer 248 will ultimately determine the thickness of the resistors 240, the thickness of the device layer 248 should be carefully selected (although the thickness of the device layer 248 could be reduced during later processing steps, if desired).

The device layer 248 may have a (100) crystal orientation. If desired, the device layer 248 can be made of other materials that are piezoresistive or can be made piezoresistive, such as polysilicon or silicon carbide. When the device layer 248 is made of single crystal semiconductor materials (i.e., silicon), as opposed to polysilicon, defects in the device layer 248 caused by grain growth and doping segregation in the grain boundaries are avoided.

When the device layer 248 is sufficiently thin (i.e., less than about 0.5 microns, or less than about 1.5 microns, or less than about 5 microns), specific techniques for forming the device layer may be utilized. For example, the thin device layer may be formed from a thicker, starting wafer (not shown) by bombarding the face of the thicker wafer with ions to define a sub-layer of gaseous microbubbles. The thicker wafer is then separated along the line of microbubbles to provide the thin device layer 248, which is then deposited on the insulating layer 250 to form the SOI wafer 244. Such a process is outlined in U.S. Pat. No. 5,374,564 to Bruel, the entire contents of which are hereby incorporated herein. Such a process is also provided under the trademark SMART CUT® provided by S.O.I. TEC Silicon On Insulator Technologies S.A. of Bernin, France. Thus the device layer 248 may be formed or provided by hydrogen ion delamination of the thicker wafer. This method of forming the wafer 244 provides a device layer 248 having a uniform thickness, which increases product yield. This method of forming the wafer also provides excellent doping uniformity and allows the use of silicon which has improved high temperature thermal stability as compared to, for example, polysilicon.

The base layer 246 can be made of a variety of materials, such as silicon or the other materials listed above for the device layer 248. The base layer 246 can have a variety of thicknesses such as between about 100 microns and about 1,000 microns, and more particularly, about 500 microns. The base layer 246 should be of sufficient thickness to provide structural support to the wafer 244. In one embodiment, the base layer 246 is single crystal silicon having a (100) crystal orientation to allow easy etching thereof.

The insulating layer 250 can be of any variety of materials, and is typically silicon dioxide. The insulating layer 250 primarily acts as an etch stop and also provides electrical isolation to the wafer 244. The insulating layer 250 also enables the sensor 210 to function at very high temperatures without leakage effects associated with the p-n junction type devices (i.e. due to current passing through the base layer 246). The insulating layer 250 may have a variety of thicknesses, such as between about 0.5 microns and about 1.5 microns, and is typically about 1 micron thick.

After the wafer 244 is provided, a thermal oxide 252, such as a 200 Angstroms thick thermal oxide layer, is deposited or grown on top of the device layer 248 and on the bottom of the wafer 244 (FIG. 47) to aid in subsequent doping. The device layer 248 is then doped (schematically shown by arrows in FIG. 47) by either p-doping or n-doping, although p-doping may provide certain benefits as outlined above. The device layer 248 may be doped to its highest level of solubility, and the doping may be carried out by a variety of methods, such as by high-dose ion implantation or boron diffusion. In one embodiment the device layer 248 may have a post-doping resistance of between about 14 and about 30 ohm-cm.

Figure 48:
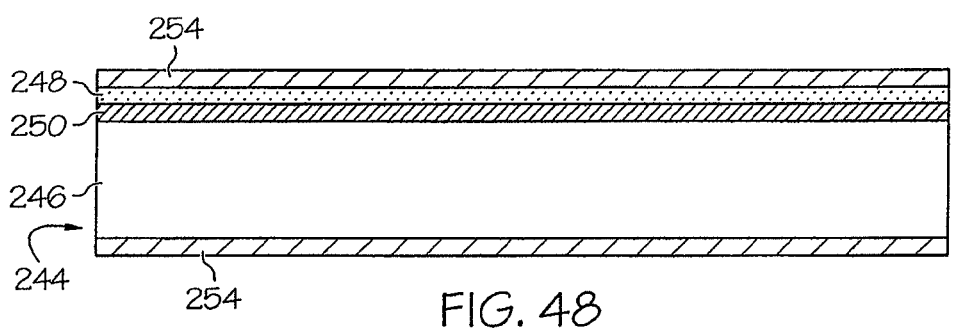
Figure 49:
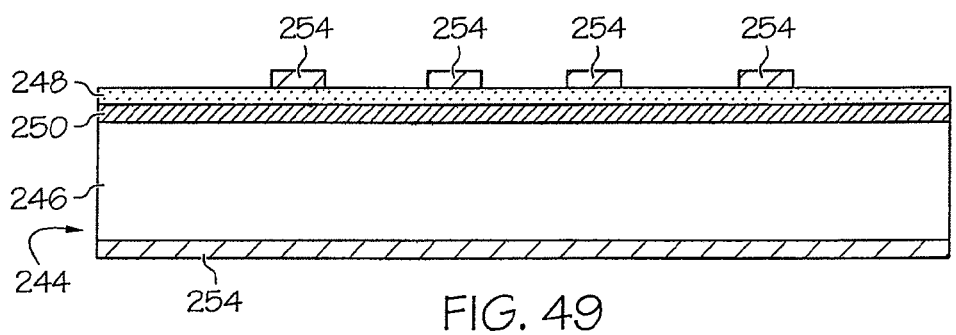
Figure 50:
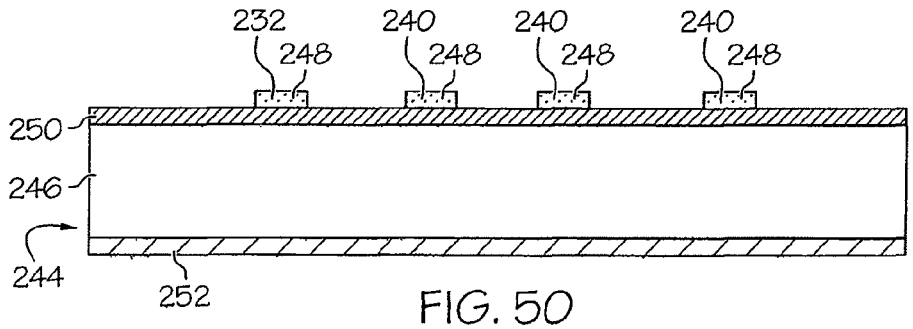

The wafer 244 is then annealed to complete the doping process. In one embodiment, the wafer 244 is annealed at a temperature of about 1050° C. in an atmosphere of $N_2$ for about 15 minutes. Next, as shown in FIG. 48, the thermal oxide layers 252 are removed and a mask material 254, such as silicon nitride, is deposited on both sides of the wafer 244 by low pressure chemical vapor deposition ("LPCVD") or other suitable deposition process. The silicon nitride 254 can have a variety of thicknesses, and in one embodiment is about 1500 Angstroms thick. The upper layer of silicon nitride 254 is then patterned (or deposited in a patterned shape) in the desired shape of the resistors 240, output contacts 232, and leads 242 as schematically shown in FIG. 49. The exposed portions of the device layer 248 are then removed. The upper layer of silicon nitride 254 is then removed to expose the remaining portions of the device layer 248 as shown in FIG. 50.

Figure 51:
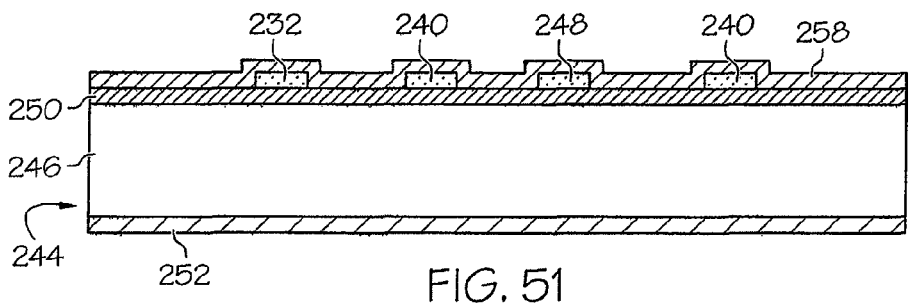
Figure 52:
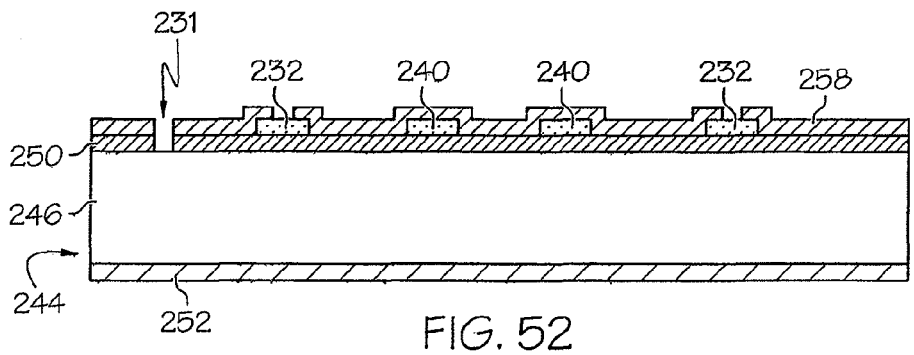
Figure 53:
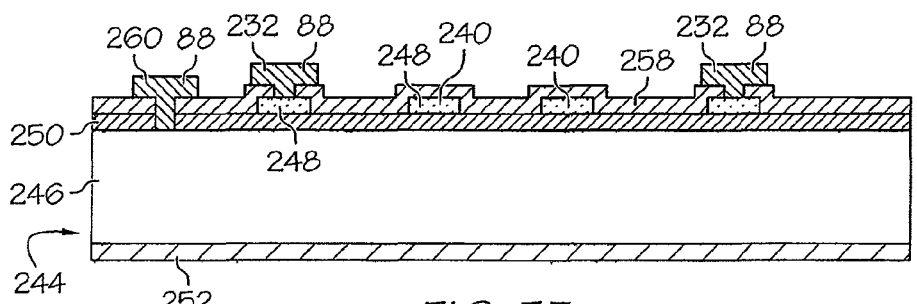

As shown in FIG. 51, a silicon dioxide 258 is then coated on top of the wafer 244, such as by PECVD. Portions of the silicon dioxide 258 are then removed (FIG. 52) to expose part of the output contacts 232 lying below such that output contacts 232 can be completed. Portions of the silicon dioxide 258 and the insulating layer 250 are also removed at the area indicated 231 to expose the base layer 246 to provide a location for a substrate contact 260 (see FIGS. 42 and 53). The substrate contact 260 provides an electrical contact to the base layer 246 to avoid voltage build-ups on the wafer 244/sensor die 212, thereby reducing noise.

A metallization layer is then deposited in the openings of the silicon dioxide 258 to form/complete the substrate contact 260 and output contacts 232. The metallization layer may be the same metallization layer 88 described above in the section entitled "Metallization Layer." Thus in one embodiment the metallization layer 88, as deposited, includes a lower layer of tantalum, with a layer of tantalum nitride located on the tantalum layer, and a top layer of platinum located on the tantalum nitride layer. The metallization layer 88 may be patterned by a lift-off resist ("LOR") or by a shadow masking sputter technique.

The metallization layer 88 provides a surface which can withstand elevated temperatures and can still be welded to after such exposure to elevated temperatures. For example, the metallization layer 88 may be exposed to elevated temperatures when the base wafer 214, device wafer 218 and capping wafer 216 are coupled together, and when the wafer stack 212 is coupled to the header plate 219. However, the make-up of the metallization layer 88 allows it to remain sufficiently conductive, retain its adhesive strength, and remain metallurgically stable after exposure to such temperatures, and when exposed to elevated temperatures during operation of the sensor 210.

Figure 54:
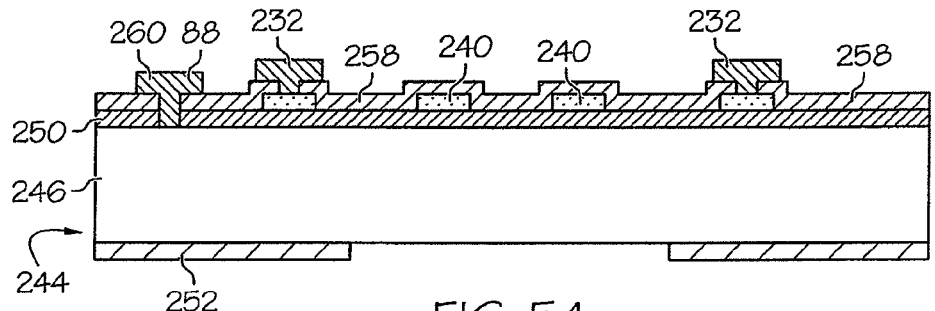
Figure 55:
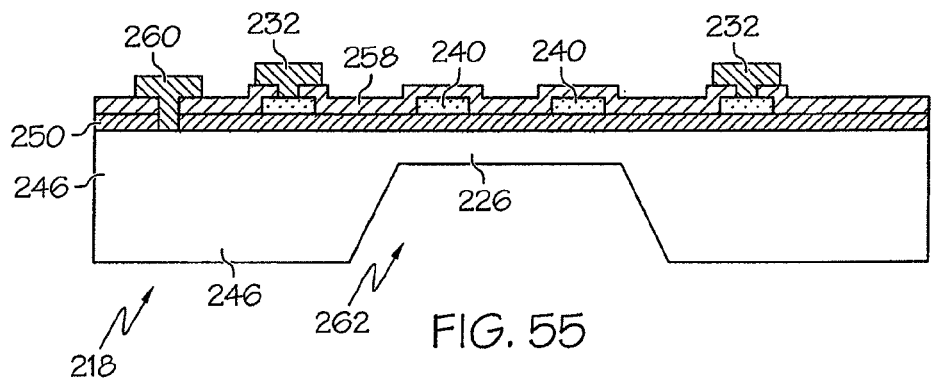

Next, as shown in FIG. 54, the thermal oxide 252 on the bottom of the wafer 244 is patterned to expose a portion of the base layer 246 located below the resistors 240. The exposed portion of the base layer 246 is then etched to define the diaphragm 226 and a cavity 262 located below the diaphragm (FIG. 55). This etching step can be carried out by DRIE, a KOH etch, or any of a variety of other etching methods. The bottom layer thermal oxide 252 is then removed.

The diaphragm 226 can have a variety of shapes, such as circular or square in top view, and in one embodiment has a surface area of between about 0.25 $mm^2$ and about 9 $mm^2$. The diaphragm 226 may be etched to a thickness of between about 1 micron and about 200 microns, or less than about 200 microns, or greater than about 1 micron, or greater than about 8 microns, or greater than about 30 microns, or less than about 150 microns.

Figure 55A:
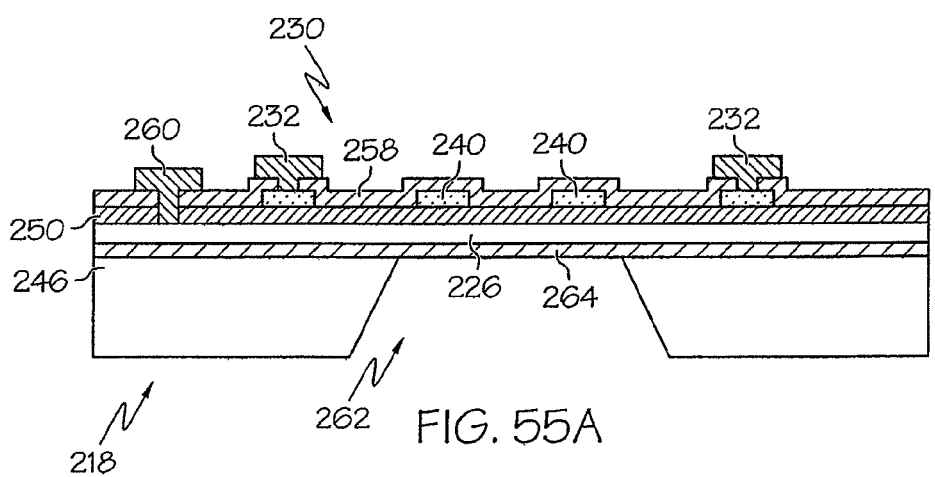

As shown in FIG. 55A, in an alternate embodiment the wafer 244 includes an additional buried oxide layer 264. The buried oxide layer 264 may be utilized as an etch stop during the etching of the base layer 246 to form the diaphragm 226. In this manner, the buried oxide layer 264 helps to ensure a consistent diaphragm 226 thickness. Although not shown in FIG. 55A, if desired the exposed portions of the oxide layer 264 may be removed to reduce thermal stresses imposed on the diaphragm 226 by the oxide layer 264.

Figure 56:
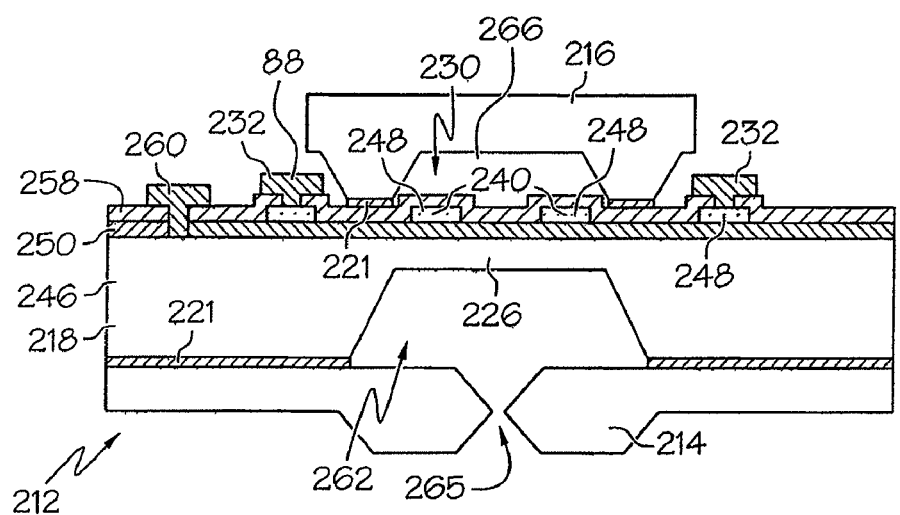

After the device wafer 218 is formed, the base wafer 214 is then provided (FIG. 56). The base wafer 214 may be a 800 micron-thick silicon wafer that is KOH etched to form a through-hole 265. The capping wafer 216 is also provided, and may be a silicon wafer that is KOH or DRIE etched to form a cavity 266. The wafer stack 212 is then formed by coupling the base wafer 214, device wafer 218 and capping wafer 216 together. The wafers 214, 216, 218 are aligned and are coupled together using a glass frit attachment layer 221 (FIG. 56) or other acceptable joining methods. Glass frit attachment provides a well tested and predictable attachment method. Plasma enhanced fusion bonding may also be utilized to bond the wafer stack 212. Plasma enhanced fusion bonding allows the wafer stack 212 to be formed at a temperature as low as 300° C., which can reduces damage to the electronics/piezoresistive materials.

Once the wafer stack 212 is formed, the stack 212 is coupled to the header plate 219, such as by an InCuAg brazing material 270 (see FIG. 42) formed at a bonding temperature of about 750° C. Rather than using the InCuAg brazing material, other high temperature braze materials may be utilized, such as other eutectic bonding materials (i.e. a gold/germanium eutectic), or a conductive glass transfer tape having a firing temperature of 440° C. or higher, nonconductive glass frit with a firing temperature of 600° C. or higher, or an InCuAg alloy based brazing preform with a eutectic liquid temperature of 705° C. or higher. A L10102 glass frit with a curing temperature of between 600° C. and 650° C. may also be used. The material attaching the stack 212 to the pedestal may be able to withstand more than 800 psig at 500° C.

The glass transfer tape used as attachment material 270 may be of a standard sandwich-type construction including a bottom polyethylene carrier strip, a glass layer located on tope of the carrier, an organic adhesive layer on top of the glass layer, and a top layer of release paper. Thus the bond 270 may be formed at a curing temperature between about 600° C. and about 650° C., and has stable mechanical properties at about 400° C., or about 500° C. or at about 550° C.

As noted above, the metallization layer 88 has good adhesion to silicon and stable electrical properties at temperatures up to 600° C. and is able to withstand temperatures at least up to 725° or 750° C. Thus the metallization layer 88 should be able to survive the attachment of the wafers 214, 216, 218 together, as well as the attachment of the wafer stack 212 to the header plate 219.

However, in some cases, the wafer stack 212 may be formed by joining the base wafer 214 and device wafer 218 and/or device wafer 218 and capping wafer 216, by relatively high temperature bonding processes. In this case, the bonding temperatures may be sufficiently high that the metallization layer 88 or other sensitive components on the wafer stack 212 cannot withstand the high temperature. In this case, the metallization layer 88 may be deposited after the wafer stack 212 is partially or completely formed (i.e., after the base wafer 214 and device wafer 218, and/or device wafer 218 and capping wafers 216 have been joined).

As noted above and shown in FIG. 42, the sensor 210 includes a plurality of pins 234, with each pin 234 being coupled to an output contact 232 by a wire 272 to communicate the output of the sensor 210. The wires 272 may be made of platinum and have a diameter of between about 25 and about 75 microns. Each wire 272 may be spot welded or wedge bonded (i.e. both considered "wire bonding" for the purposes of this application) to the platinum pins 234 at one end, or to an associated output contact 232 at the other end thereof. Wedge bonding is a well known process and comprises pressing the wire 272 onto the surface to be welded and applying ultrasonic energy to complete the bond.

The pins 234 can be made of a variety of materials, such as platinum coated KOVAR® alloy or solid platinum. When the pins 234 are solid platinum, instead of platinum plated, any diffusion of nickel, which can compromise the joint between the wire 272 and pin 234, is eliminated. In addition, when the wires 272 are platinum, instead of the traditional gold material, platinum-to-platinum wire bonds can be utilized (since the top surface of the metallization 88 may be primarily platinum due to a gradient of platinum silicide in the top layer 110). If the wires 272 were to be made of gold, the gold may migrate and form a gold-silicon eutectic which causes the wires 272/output contacts 232 to become brittle and fail at high temperatures. Thus the platinum-to-platinum wire bonds allows the connections to take advantage of the natural ability of platinum to withstand high temperatures and corrosive environments.

A plurality of pins 234 are mounted in the header plate 219 and extend therethrough, and are held in place by ceramic, ceramic glass or glass frit material 276 or other acceptable material. The use of ceramic or glass frit feed through 276 provides materials which can withstand higher temperatures as contrasted with glass feed through material. In addition, glass frit or ceramic feed throughs 276 are more compatible with platinum than glass pin seals.

The header plate 219 and/or frame 220 can be made of a variety of materials, such as stainless steel, INVAR® alloy, KOVAR® alloy, NI-SPAN-C® alloy, aluminum nitride, or other corrosion resistant materials with relatively low coefficients of thermal expansion. The header plate 219 and frame 220 can be welded or threaded together.

Figure 57:
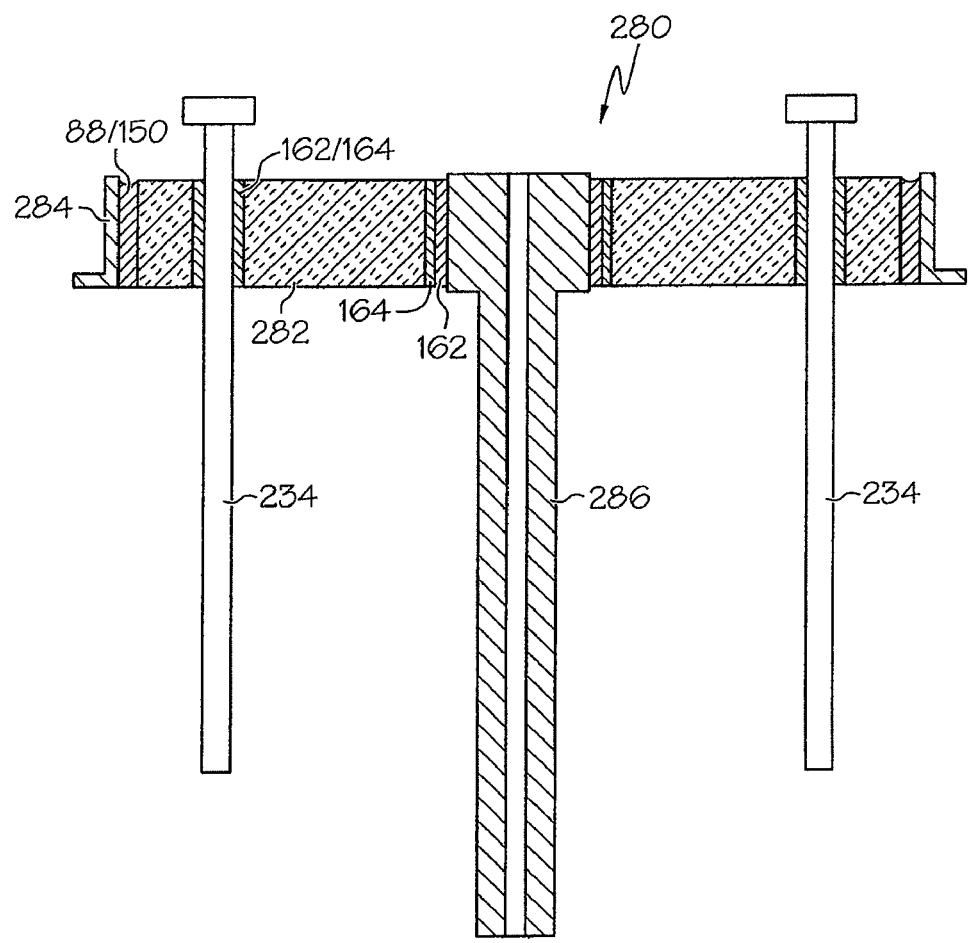
FIG. 57 is a side cross section of a pedestal assembly which may be used with the sensor of FIG. 42.

As shown in FIG. 57, in an alternate version of this first embodiment of the piezoresistive sensor 210, the header plate 219 shown in FIG. 42 can be replaced with the pedestal assembly 280 of FIG. 57. The pedestal assembly 280 may include a ceramic substrate 282, which can be made of the materials described above for the substrate 14. The substrate 282 may be compression mounted inside a ring 284, in the same manner described above in the section entitled "Substrate Attachment." A set of pins 234 may be mounted in and through the substrate 282. A variety of methods for mounting the pins 234 may be utilized, but in one embodiment the mounting process described above in the section entitled "Pin Mounting" may be utilized. A conduit 286 may be mounted in and through the substrate 282 to communicate the pressure-conveying fluid to the underside of the diaphragm 226. The conduit 282 can be mounted in and to the substrate 282 in the same manner as the pins 234, and its upper end is planarized and polished flat to allow the sensor die 212 to be attached thereto. The sensor die 212 can be attached to the pedestal assembly 280 by, for example, glass frit or a gold-germanium (or other material) transient liquid phase bond.

Once the pedestal assembly 280 shown in FIG. 57 is provided, the wires 272 of FIG. 42 can be attached to the pins 234, and the pedestal assembly 280 can be coupled to the frame 220 in the same or similar manners as the pedestal/header plate 219 of FIG. 42. The pedestal assembly 280 may be able to accommodate higher temperatures due to the use of a ceramic substrate 282, and may be easier to manufacture.

As noted above, in the illustrated embodiment the sensing component 230 is made of or includes piezoresistive material. However, rather than being made of piezoresistive material, the sensing component 230 may be made of or include piezoelectric material, in the same or similar manner to the sensors 10 described in detail above (i.e. in FIGS. 8-17 and the accompanying description) which results in a dynamic pressure sensor. In addition, the piezoresistive material in the embodiments described below ("Piezoresistive Transducer—Second Embodiment" and "Piezoresistive Transducer—Third Embodiment") may also be replaced with piezoelectric material to result in piezoelectric transducers. However, the sensors/transducers described in these sections may have increased utility as piezoresistive sensors/transducers, rather than piezoelectric sensors/transducers, and thus the headings refer to those transducers as "piezoresistive" rather than "piezoelectric."

Piezoresistive Transducer

Second Embodiment

Figure 58:
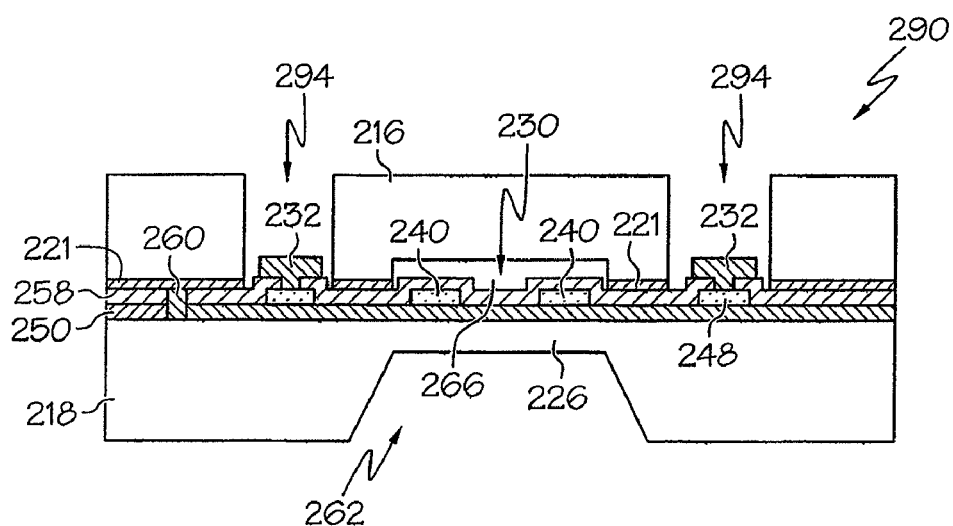
FIG. 58 is a side cross section of a sensor die of a second embodiment of the piezoresistive pressure sensor of the present invention.
Figure 59:
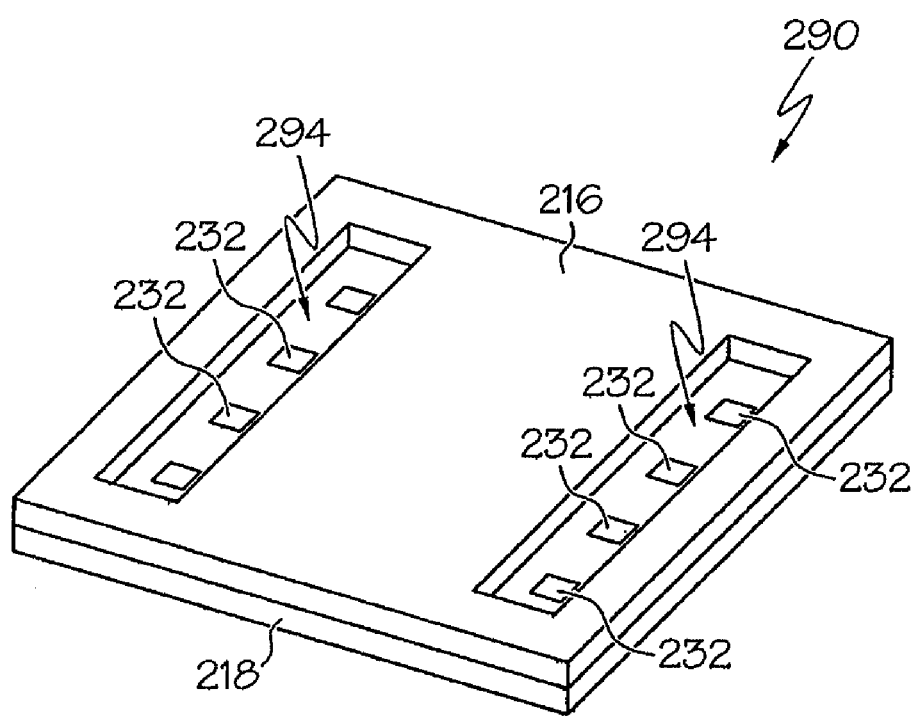
FIG. 59 is a top perspective view of the sensor die of FIG. 58.
Figure 60:
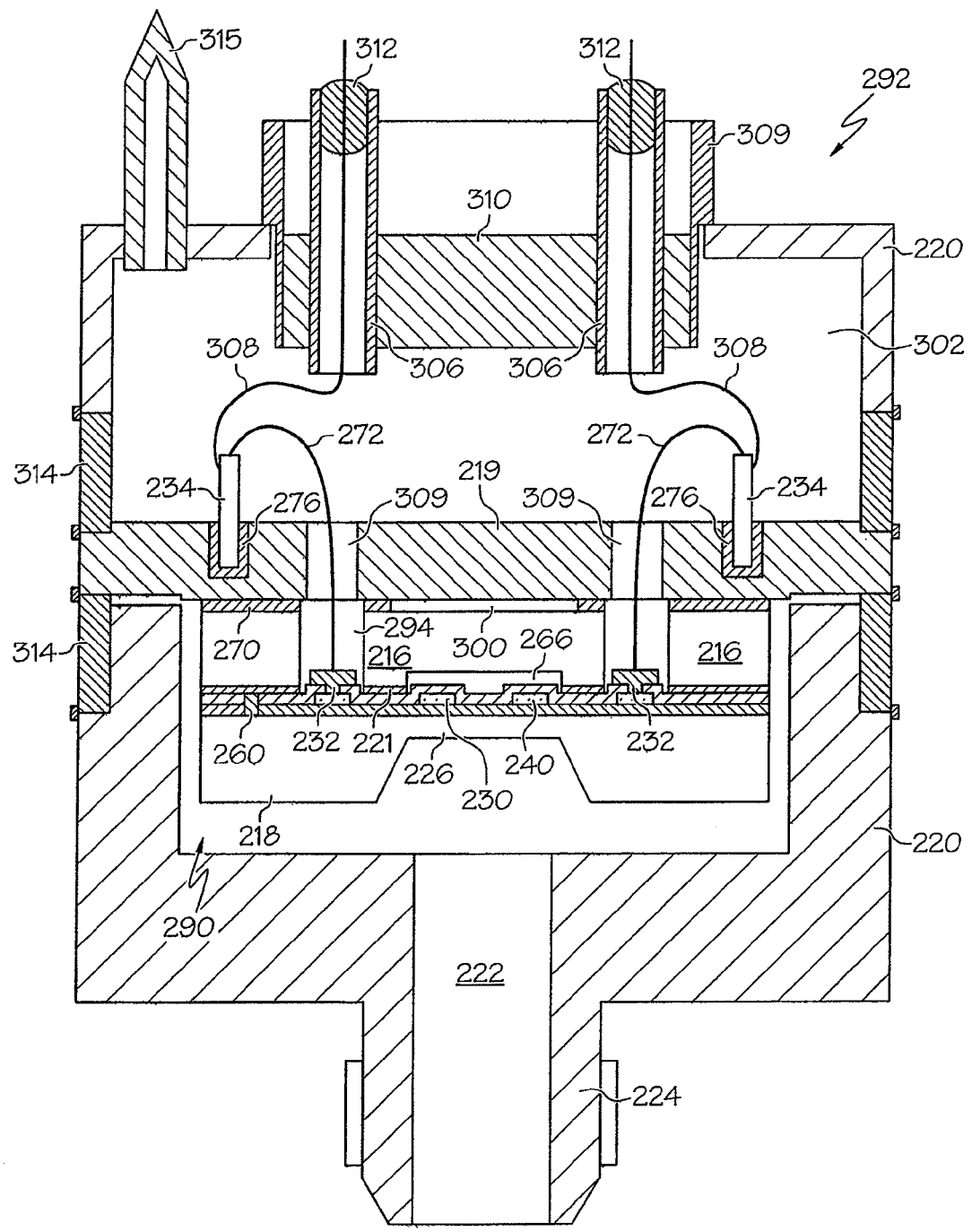
FIG. 60 is a side cross section of the second embodiment of the piezoresistive pressure sensor of the present invention.

A second embodiment of the piezoresistive transducer is 292 is shown in FIGS. 58-60. In this embodiment, as shown in FIG. 60, the sensor die 290 is mounted on an opposite side of the header plate 219 relative to the pins 234 and compared to the embodiment of FIG. 42. In the embodiment of FIG. 42, the pressure exerted on the diaphragm 226 tends to pull the sensor die 212 away from the header plate 219. In contrast, in the embodiment of FIG. 60, pressure applied to the sensor die 290 pushes the attachment joint 270 in compression and thereby greatly increases the burst pressure of the pressure sensor 292.

The sensor die 290 of the embodiment of FIGS. 58-60 may have generally the same structure as, and be formed in the same manner as, the sensor die 212 of the embodiment of FIGS. 42-56. However, the sensor die 290 of FIGS. 58-60 may not include the base wafer 214. In addition, as can be seen in FIGS. 58 and 59, the capping wafer 216 may generally cover the device wafer 218 and have a pair of slots 294 formed therethrough to provide access to the output contacts 232. Each wire 272 also passes through an opening 309 formed in the header plate 219 to access an output contact 232.

With reference to FIG. 60, a vacuum/inert gas or reference pressure may be sealed in the cavity 266 between the capping wafer 216 and die wafer 218. In addition, or alternately, a vacuum, inert gas or reference pressure may be sealed in the cavity 300 located between the capping wafer 216 and the header plate 219. In this case, the capping wafer 216 may include an opening formed therein (not shown) such that the two cavities 266, 300 communicate. In addition, or further alternately, a vacuum, inert gas or reference pressure may be present in the cavity 302 located between the frame 220 and the header plate 219, and this cavity 302 could communicate with the other two cavities 300, 266.

In the embodiment of FIG. 60 the pins 234 are mounted in holes in the header plate 219 that only extend partially therethrough. The blind mounting of the pins 234 ensures that the cavity 302 defined by the header plate 219 and frame 220 is not compromised. The pins 234 may be attached by a glass frit or ceramic feed through material 276 as in the embodiment of FIG. 42. In the embodiment of FIG. 60, the pressure port 224 is on the bottom side of the sensor die 290 and all electrical connections can be protected in the vacuum or nitrogen environment in the cavities 206, 300, 302 to prevent contamination and/or oxidation of the sensor elements and electrical connections.

Each pin 234 is electrically coupled to an associated tubular feedthrough 306 by a platinum wire 308 to communicate the output of the sensor 292. Each tubular feedthrough 306 is coupled to the upper end of the cover 220 and may be made of platinum. The tubes 306 may be positioned inside a larger tube or shell 309 that is coupled to an upper end of the frame 220 by brazing or the like. The shell 309 is filled with a ceramic material, or glass frit, or a potting compound 310, and each tube 306 is coupled to the material 310 by brazing or the like.

Each wire 308 may be brazed to an associated tube 306 at an upper end of that wire 308 and to an associated pin 234 at the other end. A plug material 312, such as ceramic, may be inserted into each tube 306 to seal off the tubes 306. A vacuum seal tube 315 may be positioned adjacent to the tubes 306 to allow the cavities 302 and/or 300 and/or 266 to be evacuated to provide absolute pressure measurements. The vacuum seal tube is sealed to seal out the ambient environment. It should be noted that tube arrangement 306 shown in FIG. 60 may be used with a variety of other sensors and packaging for providing an exit path of the wires 308, for example, the tube arrangement can be used with piezoelectric sensors and associated packaging shown in FIGS. 1 and 6.

The header plate 219 can be made of a variety of materials, such as KOVAR®, AlN or other high temperature resistant, corrosion resistant materials as described above, and the material may be selected such that its thermal expansion coefficient ("TEC") is relatively close to that of silicon. In addition, in the illustrated embodiment, a pair of stress isolator rings 314 are located on either side of the header plate 219. The stress isolator rings 314 can be made of a variety of materials, such as KOVAR®, stainless steel or other materials similar to the header plate 219. Each of the stress isolator rings 314 may be received in a groove on the top or bottom surface of the header plate 219 and welded to the pressure case 220. Each stress isolator ring 314 may have a relatively thin wall thickness (i.e., about 10 mils) to allow each stress insulator ring 314 to expand or flex to accommodate thermal mismatches in the sensor package/assembly. In extremely corrosive environments, the KOVAR® materials of the header plate 219 and/or rings 314 could be replaced with THERMO-SPAN® or other controlled expansion, high temperature resistant material.

Piezoresistive Transducer

Third Embodiment

Figure 61:
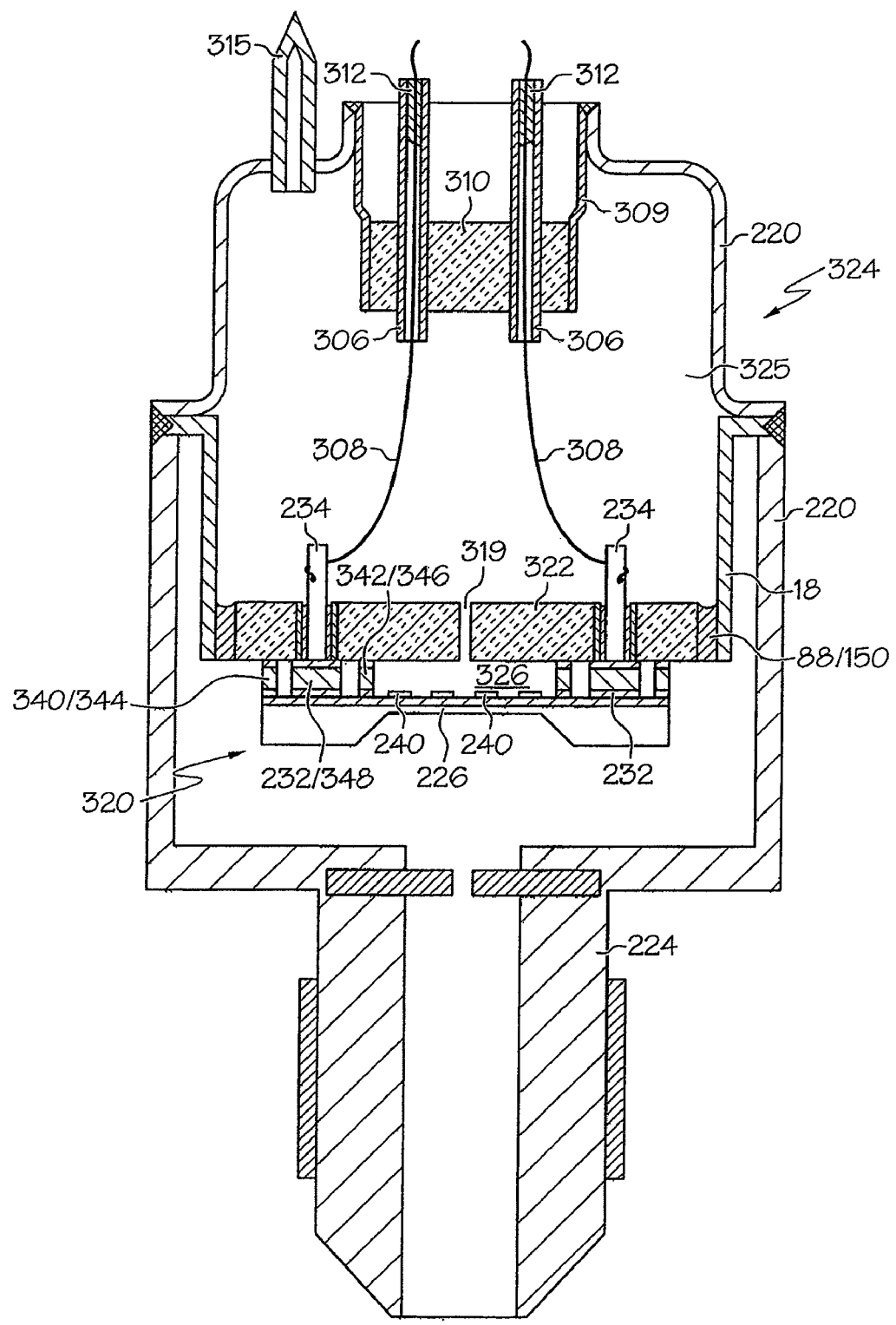
FIG. 61 is a side cross section of a third embodiment of the piezoresistive pressure sensor of the present invention.

A third embodiment of the sensor of the present invention is shown in FIGS. 61-65. In this embodiment, the device wafer 320, that is the same as or similar to the device wafer 218 described above, may be utilized. The device wafer 320 may also be formed by the process shown in FIGS. 46-55 and the accompanying description. As shown in FIG. 61, the device wafer 320 is mechanically and electrically coupled to an adjacent substrate 322. The device wafer 320 is attached in an inverted configuration, as in the second embodiment described above, to improve the ability of the sensor 324 to accommodate high pressures. A reference pressure or vacuum or inert gas may be located in the cavity 325 positioned between the substrate 322 and the frame 220, and/or the cavity 326 between the substrate 322 and the device wafer 320. Furthermore, if desired, an opening 319 may be formed in the substrate 322 to allow the cavities 325, 326 to communicate.

Figure 62:
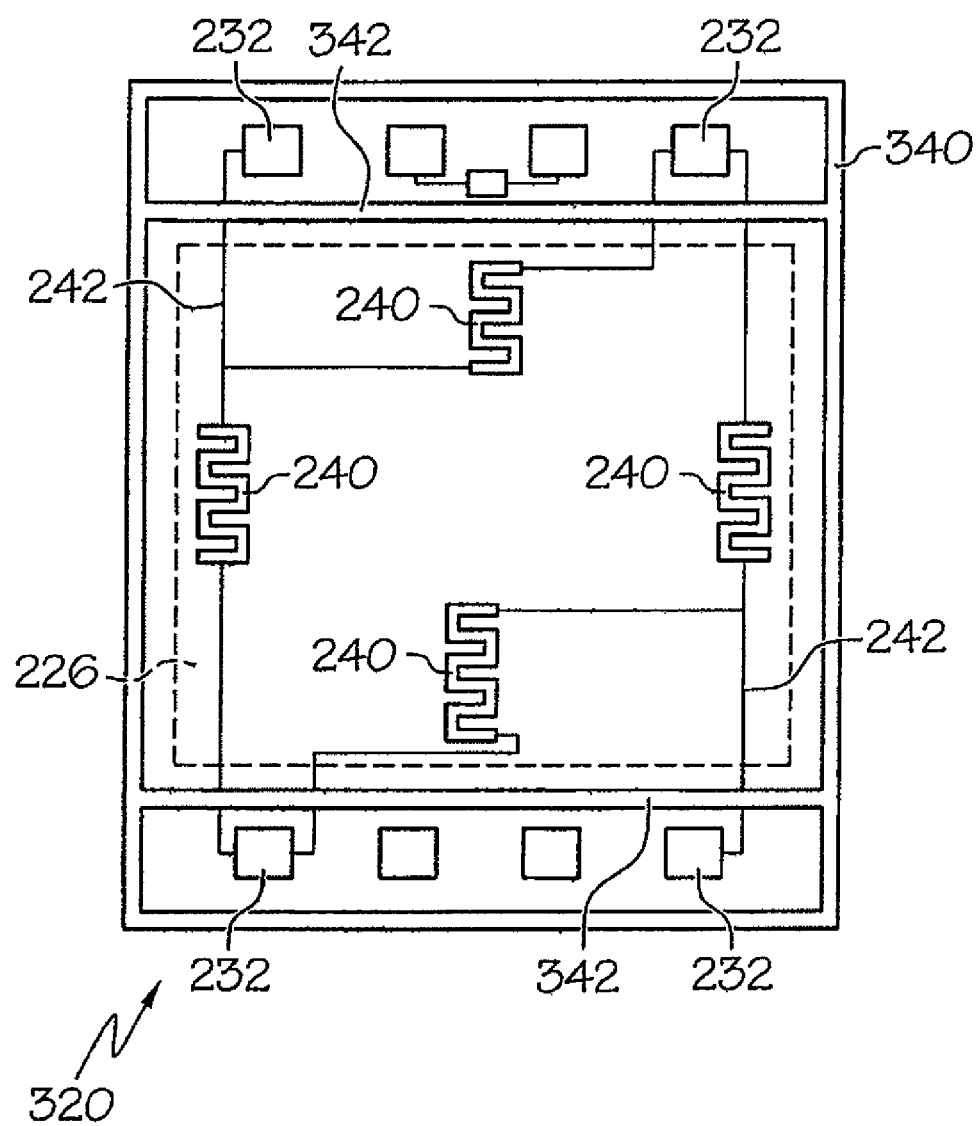
FIG. 62 is a top view of the sensor die of the pressure sensor of FIG. 61.

As shown in FIG. 62, the device wafer 320 includes a frame 340 that extends around the perimeter thereof, as well as a pair of bulkheads 342 extending laterally across the device wafer 320. The frame 340 and bulkheads 342 may be made of the metallization material 88 and the bonding layer 90 described above. In this sense the frame 340 and bulkheads 342 may be made of the same material as the frame 70 and bulkhead 72 of the device wafer shown in FIG. 3.

Figure 63:
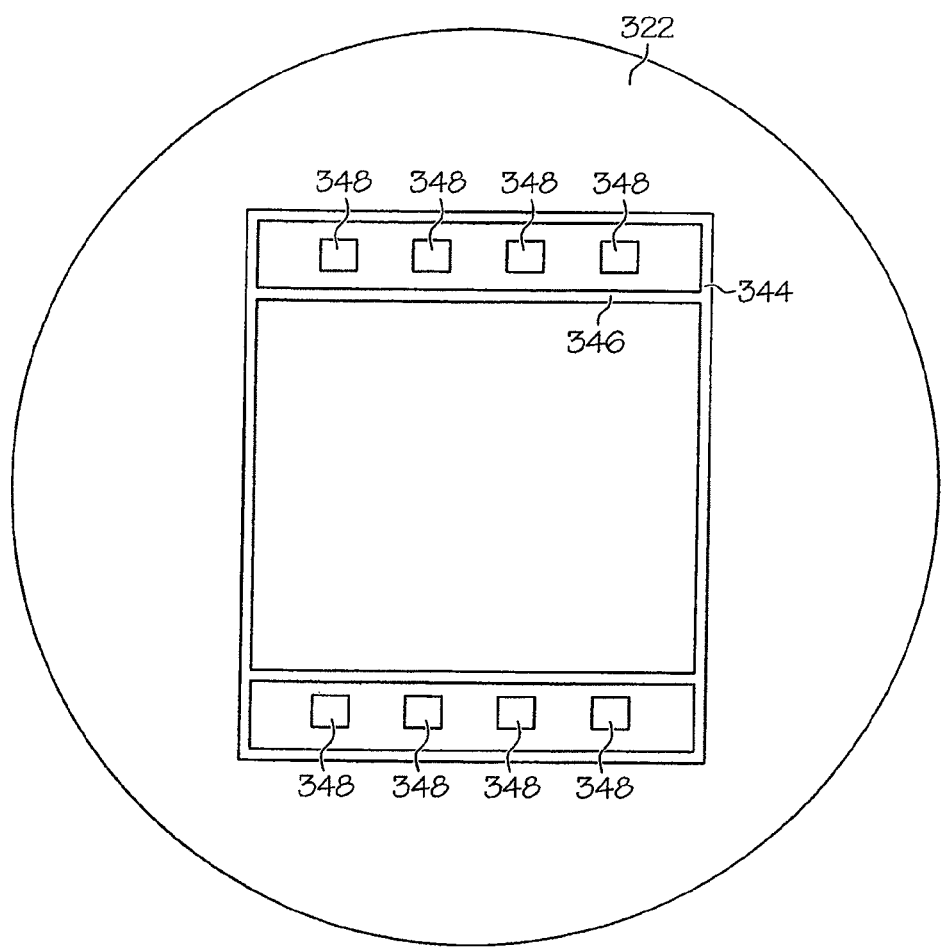
FIG. 63 is a bottom view of the substrate of the pressure sensor of FIG. 61.

As shown in FIG. 63, the substrate 322 includes a frame 344 and bulkhead 346 that generally match (in size and shape) the frame 340 and bulkheads 342 of the device wafer 320 of FIG. 62. The frame 344 and bulkheads 346 can also be made of the metallization layer 88 with the bonding layer 90 on top thereof. The substrate 322 also includes a set of contacts 348 that are configured to align with the output contacts 232 of the device wafer 320. In this sense the substrate 322 is analogous to the substrate 14 described and shown above.

Figure 64:
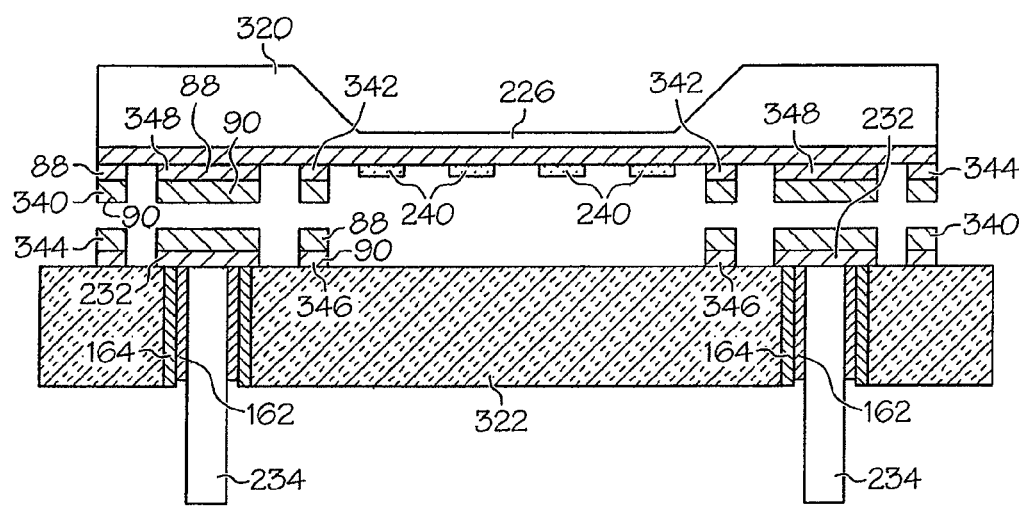
FIG. 64 illustrates the sensor die of FIG. 62 aligned with the substrate of FIG. 63 for bonding.
Figure 65:
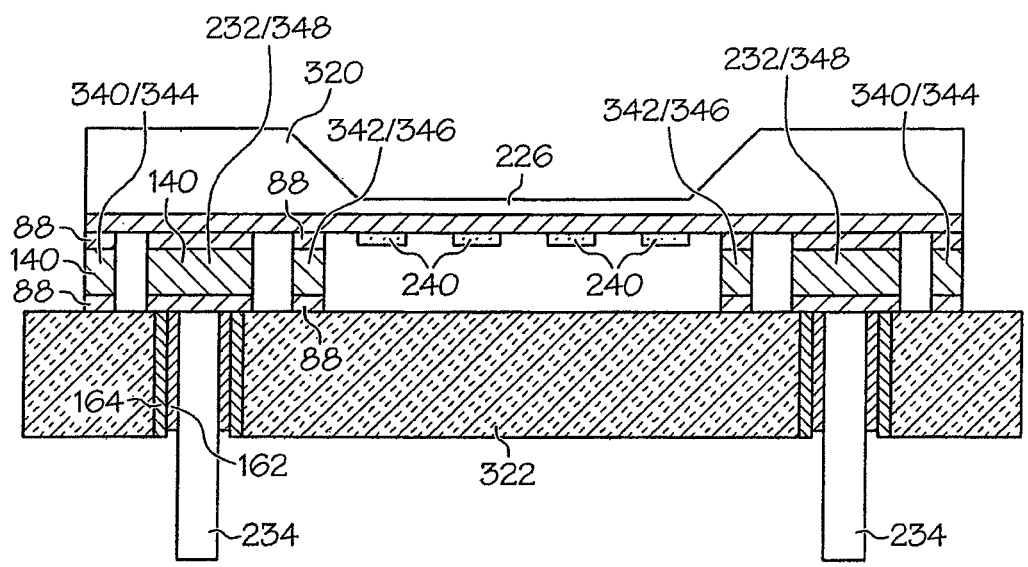
FIG. 65 illustrates the sensor die and substrate of FIG. 64 coupled together.

In order to join the device wafer 320 and substrate 322, they are aligned as shown in FIG. 64 such that their frames 340, 344, bulkheads 342, 346, and contacts 232, 348 are aligned. The device wafer 320 and substrate 322 are then pressed into contact such that the frames 340, 344, bulkheads 342, 346 and contacts 332, 348 contact each other. The device wafer 320 and substrate 322 are next joined or bonded in a transient liquid phase bonding process which is described above in the section entitled "Sensor Die Attachment." The resultant structure is shown in FIG. 65

After the device wafer 320 and substrate 322 are joined together, the frame 310, 344 and bulkheads 342, 346 provide sealed cavities around the contacts 232, 378. The sealed cavities isolate the electrical portion of the device (i.e., the contacts 232) from the pressure portion (i.e., the diaphragm 226) to ensure that the pressure medium does not invade and contaminate/corrode the electrical elements or components, and also protects the electrical elements and components from high pressures.

The substrate 322 may be a generally disk-shaped ceramic material that is made of the same materials as the substrate 14 described above. The substrate 322 may be compression mounted inside a thin walled metal ring 18 (i.e., in the same manner as described above in the section entitled "Substrate Attachment"). The ring 18 is, in turn, mounted to the frame 220 which provides support to the ring 18 and structure and protection to the sensor 324 as a whole.

A set of pins 234 are electrically coupled to the device wafer 320 at one end, and to an associated wire 308 at the other end thereof. Each pin 234 may be coupled to the substrate 322 as described above in the section entitled "Pin Mounting" above. Each wire 308 is coupled to, or extends through, a tube 306 at the other end similar to the embodiment shown in FIG. 60. In the third embodiment shown in FIGS. 61-65, wire bonding to the contact pads 232 is eliminated. In its place a flip-chip process, which is more automated, controlled and predictable, is used to complete electrical connections to the contact pads 232 and pins 234.

Figure 66:
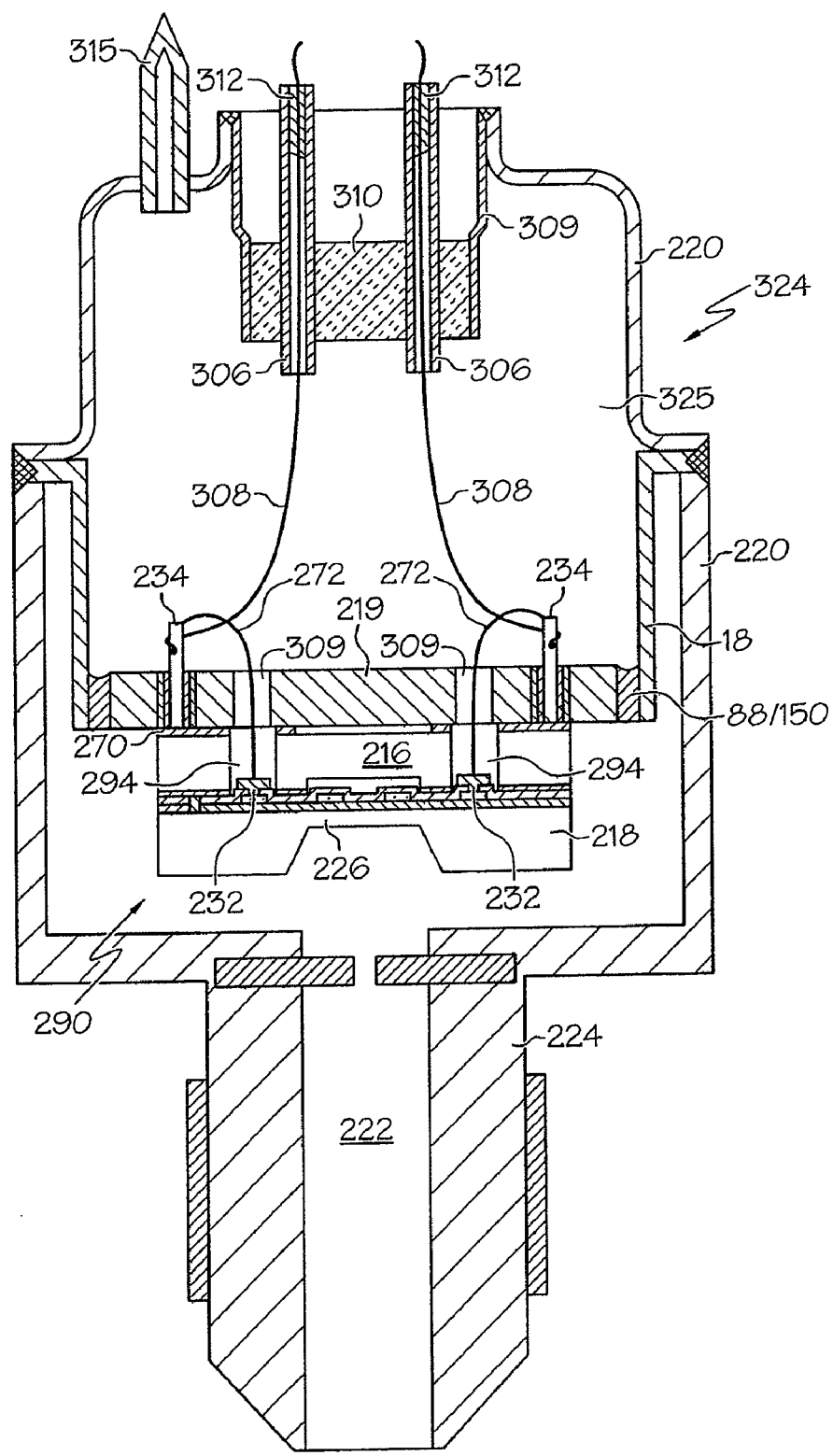
FIG. 66 is a side cross section of another embodiment of the piezoresistive pressure sensor of the present invention.

FIG. 66 illustrates another embodiment that is somewhat of a "hybrid" between the sensor of FIGS. 58-60 and the sensor of FIGS. 61-65. In this sensor the sensor die 290 may be similar to the sensor die 290 of the embodiment of FIGS. 58-60. The header plate 219 can be made of a variety of materials, such as AlN, KOVAR®, or other high temperature resistant, corrosion resistant materials as described above. The output contacts 232 are coupled to the pins 234 by (platinum) wires 272. The header plate 219 is compression mounted inside the ring 18, and the pins 234 are planarized and brazed in place similar to the pins 234 shown in FIG. 61. This embodiment combines the predictable technology of wire bonding with the advantages of a compression mounted, isolated header plate 219.

The first, second, third and hybrid embodiments of the piezoresistive sensor are quite robust and able to withstand high pressures, temperatures, and corrosive environments. More particularly, each embodiment may be designed to withstand a pressure up to 600 psig, or 800 psig. The first embodiment may be able to withstand a pressure of up to 600 psig and a temperature up to 500° C. The second, third and hybrid embodiments may be able to withstand a pressure of up to 4000 psig and a temperature up to 450° C. or up to 500° C. The sensor of the various embodiments may also be able to withstand corrosive environments—for example, direct exposure to combustion byproducts, for an extended period of time (i.e. up to 40 hours, or up to 400 hours, or up to 4,000 hours) and continue functioning such that the sensor can be used in or adjacent to a combustion zone.

The various piezoresistive and piezoelectric pressure sensors disclosed herein may also, if desired, take the form of various other pressure sensors that are not limited to piezoresistive and/or piezoelectric sensing elements. In this case, the packaging, metallization, joining, pin mounting and other features disclosed herein may be utilized with such pressure sensors. In addition, the various features disclosed herein are not necessarily restricted to use with pressure sensors, and can be used with any of a wide variety of sensors and transducers as disclosed in, for example, the section entitled "Field of Use" described above.

Having described the invention in detail and by reference to the various embodiments, it will be apparent that modifications and variations thereof are possible without departing from the scope of the invention.

What is claimed is:

1. A harsh environment transducer comprising:
   a substrate having a first surface and a second surface, wherein said second surface is in communication with the environment;
   a device layer sensor means located on said substrate for measuring a parameter associated with the environment, said sensor means including a single crystal semiconductor material having a thickness of less than about 0.5 microns;
   an output contact located on said substrate and in electrical communication with said sensor means;
   a package having an internal package space and a port for communication with the environment, said package receiving said substrate in said internal package space such that said first surface of said substrate is substantially isolated from the environment and said second surface of said substrate is substantially exposed to the environment through said port;
   a connecting component coupled to said package; and
   a wire electrically connecting said connecting component and said output contact such that an output of said sensor means can be communicated, wherein an external surface of said wire is substantially platinum, and wherein an external surface of at least one of said output contact and said connecting component is substantially platinum.

2. The transducer of claim 1 wherein said external surfaces of both said output contact and said connecting component are substantially platinum.

3. The transducer of claim 1 wherein said substrate includes a generally flexible diaphragm configured to flex when exposed to a differential pressure thereacross, wherein said sensor means includes a sensing element at least partially located on said diaphragm whereby flexure of said diaphragm induces a change in an electrical property of said sensing element.

4. The transducer of claim 3 wherein said sensing element has a thickness of less than about 0.5 microns.

5. The transducer of claim 4 wherein said sensing element includes p-doped single crystal silicon.

6. The transducer of claim 5 wherein said sensing element includes piezoresistive materials arranged in a Wheatstone bridge.

7. The transducer of claim 3 wherein said diaphragm has a thickness of between about 3 and about 200 microns.

8. The transducer of claim 1 wherein said connecting component is a pin that sealingly extends through said package.

9. The transducer of claim 1 wherein said connecting component is solid platinum, or platinum-coated nickel.

10. The transducer of claim 1 wherein said package includes an internal header, and wherein said connecting component is coupled to said header.

11. The transducer of claim 10 wherein said substrate is coupled to said header at an attachment joint, and wherein said transducer is configured such that when said environment includes a fluid whose pressure is to be measured, said fluid exerts a force that causes said attachment joint to be placed in compression.

12. The transducer of claim 1 further comprising a bond securing said substrate to said package, said bond being formed by a high temperature brazing preform metal that has a liquidus temperature of between about 650° C. and about 750° C., and has stable mechanical properties at about 500° C.

13. The transducer of claim 1 further comprising a bond securing said substrate to said package, wherein said bond is formed by a high temperature brazing preform material comprised of indium-copper-gold, or gold-germanium, or glass frit.

14. The transducer of claim 1 further including a thermal oxide layer covering said sensor means.

15. The transducer of claim 1 further including a cap coupled to said first surface of said substrate and generally sealingly covering at least part of said sensor means, and wherein said cap does not cover said output contact.

16. The transducer of claim 1 wherein said wire is wire bonded to said output contact and to said connecting component.

17. The transducer of claim 1 wherein said package is formed from a material having a coefficient of thermal expansion in a given direction that is within about 150% of a coefficient of thermal expansion of said substrate in said direction such that said package and said substrate are thermally compatible.

18. The transducer of claim 1 wherein said package further includes a header having a first and a second opposed face, and a hole formed therein or therethrough, and wherein said connecting component is held within said hole.

19. The transducer of claim 18 wherein said connecting component is held within said hole by a material selected from a group consisting of a high temperature brazing preform material, a hypoeutectic alloy or glass frit.

20. The transducer of claim 1 wherein said output contact includes a metallization layer, and wherein a first end of said wire is wire bonded to said metallization layer.

21. The transducer of claim 20 wherein said metallization layer includes an adhesion layer including a material selected from the group consisting of tantalum, chromium, zirconium, and hafnium, a first diffusion blocking layer of a compound selected from the group consisting of tantalum silicide, tantalum carbide, tantalum nitride and tungsten nitride, and a second diffusion blocking layer of platinum silicide.

22. The transducer of claim 20 wherein said metallization layer initially includes the following layers deposited on said substrate in succession: a tantalum layer, a tantalum-silicide layer or a tantalum-nitride layer, and a platinum layer.

23. The transducer of claim 22 wherein said platinum layer is initially deposited to a sufficient thickness such that after annealing said metallization layer an outer surface of said metallization layer is substantially platinum.

24. The transducer of claim 1 wherein said substrate is coupled to said package such that said substrate divides said internal package space into a first internal package space that is in communication with said environment and a second internal package space is substantially sealed from the environment.

25. The transducer of claim 1 wherein said transducer can withstand, and continue functioning when exposed to, a temperature of 500 degrees Celsius.

26. The transducer of claim 1 wherein said transducer can withstand, and continue functioning when exposed to, a pressure of 600 psig.

27. A pressure sensor for use in a harsh environment comprising:
    a substrate including a generally flexible diaphragm configured to flex when exposed to a differential pressure thereacross;
    a sensing element at least partially located on said diaphragm whereby flexure of said diaphragm induces a change in an electrical property of said sensing element;
    a package defining an internal space and receiving said substrate in said internal space such that pressure fluctuations in the environment manifest as said differential pressure; and,
    a bond between said package and said substrate formed by melting a high temperature braze material or a glass frit material, wherein said bond has a liquidus temperature of between about 650° C. and about 750° C., and has stable mechanical properties at about 400° C.

28. A pressure sensor for use in a harsh environment comprising:
    a substrate including a generally flexible diaphragm configured to flex when exposed to a differential pressure thereacross;
    a sensing element at least partially located on said diaphragm whereby flexure of said diaphragm induces a change in an electrical property of said sensing element;
    a package defining an internal space and receiving said substrate in said internal space such that pressure fluctuations in the environment manifest as said differential pressure; and,
    a bond between said package and said substrate formed by melting a high temperature braze material or a glass frit material, wherein said bond is formed by a high temperature brazing preform material comprised of indium-copper-gold containing about 15% indium by weight, or gold-germanium, or glass frit.

29. The pressure sensor of claim 28 wherein said bond has stable mechanical properties at about 550° C.

30. A pressure sensor for use in a harsh environment comprising:
    a generally flexible non-metallic diaphragm configured to flex when exposed to a sufficient differential pressure thereacross;
    a semiconductive single crystal piezoelectric or piezoresistive sensing element at least partially located on said diaphragm such that said sensing element provides an electrical signal upon flexure of said diaphragm; and
    an oxide layer positioned between said diaphragm and said sensing element, wherein said sensor can withstand, and continue functioning when exposed to, a pressure of 600 psig and a temperature of 450° C.

31. The sensor of claim 30 wherein said diaphragm includes a single crystal semiconductor material and wherein said single crystal semiconductor material has a thickness of less than about 0.5 microns.

32. The sensor of claim 30 wherein said sensor can withstand, and continue functioning when directly exposed to, combustion byproducts of an aircraft engine or turbine.

33. The sensor of claim 30 wherein said diaphragm and said sensing element are both located on, and form part of, a sensor die, and wherein said sensor die further includes an output contact in electrical communication with said sensing element.

34. The sensor of claim 33 wherein said sensor die is coupled to a header and said sensor further includes a pin directly coupled to said header, and wherein said sensor further includes a wire electrically coupled to said output contact and to said pin, and wherein at least an external surface of both of said output contact and said wire is substantially platinum.

35. The sensor of claim 34 wherein said pin is directly coupled to said header by a ceramic or a ceramic glass or glass frit material.

36. The sensor of claim 33 wherein said sensor die is coupled to a header at an attachment joint, and wherein said sensor is configured such that when said sensor is exposed to a fluid whose pressure is to be measured, said fluid exerts a force that causes said attachment joint to be placed in compression.

37. The sensor of claim 33 wherein said sensor die is coupled to a header at an attachment joint, and wherein said attachment joint is made of an InCuAg brazing material, or a eutectic bonding materials, or a glass transfer tape.

38. The sensor of claim 33 wherein said sensor can withstand, and continue function when exposed to, a pressure of 4000 psig.

39. A pressure sensor for use in a harsh environment comprising:
a substrate in communication with the environment, said substrate including a generally flexible diaphragm configured to flex when exposed to a sufficient differential pressure thereacross;
a sensing element at least partially located on said diaphragm such that said sensing element provides an electrical signal upon flexure of said diaphragm;
an electrically insulating layer positioned between said diaphragm and said sensing element;
a cap configured to generally sealingly mate with said substrate and substantially cover said sensing element; and
a bond formed between said cap and said substrate by aligning said cap with said substrate and heating said cap and said substrate to a first temperature, whereby said bond that is formed after heating said cap and said substrate to said first temperature is stable at a second temperature, where said second temperature is greater than said first temperature.

* * * * *